(12) United States Patent
Rössler et al.

(10) Patent No.: US 8,102,175 B2
(45) Date of Patent: *Jan. 24, 2012

(54) MAGNETIC FIELD SENSOR DEVICE

(75) Inventors: Werner Rössler, Neufahrn (DE);
Wolfgang Granig, Sachsenberg (AT);
Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 735 days.

This patent is subject to a terminal disclaimer.

(21) Appl. No.: 11/462,150

(22) Filed: Aug. 3, 2006

(65) Prior Publication Data

US 2008/0012558 A1    Jan. 17, 2008

(30) Foreign Application Priority Data

Jul. 12, 2006    (DE) .................. 10 2006 032 277

(51) Int. Cl.
*G01R 33/09*    (2006.01)

(52) U.S. Cl. .................. 324/252; 324/207.21

(58) Field of Classification Search .......... 324/207.2, 324/207.21, 249, 251–252; 360/313–316, 360/324–327
See application file for complete search history.

(56) References Cited

U.S. PATENT DOCUMENTS

| | | | |
|---|---|---|---|
| 4,466,284 A | 8/1984 | Dumery | |
| 5,686,837 A | 11/1997 | Coehoorn et al. | 324/252 |
| 5,859,592 A | 1/1999 | Carlin | |
| 5,949,051 A * | 9/1999 | Kiriyama | 235/449 |
| 6,027,397 A * | 2/2000 | Church et al. | 451/1 |
| 6,291,982 B1 | 9/2001 | Prabhu | |
| 6,433,545 B1 * | 8/2002 | Kunze et al. | 324/252 |
| 6,452,382 B1 | 9/2002 | Tokunaga et al. | 324/207.21 |
| 7,474,547 B2 * | 1/2009 | Lenssen | 365/53 |
| 2003/0094944 A1* | 5/2003 | Suzuki et al. | 324/252 |
| 2005/0219894 A1* | 10/2005 | Hidaka | 365/158 |
| 2006/0050444 A1* | 3/2006 | Fukuzawa et al. | 360/324 |
| 2007/0046102 A1 | 3/2007 | Reithofer | |
| 2007/0047294 A1* | 3/2007 | Panchula | 365/158 |

FOREIGN PATENT DOCUMENTS

| | | |
|---|---|---|
| DE | 41 35 381 | 4/1993 |
| DE | 19854713 | 11/1998 |
| DE | 19933243 | 7/1999 |
| DE | 198 10 838 A1 | 9/1999 |
| DE | 198 39 450 A1 | 3/2000 |
| DE | 101 13 131 B4 | 9/2002 |

OTHER PUBLICATIONS

Melexis, Microelectronic Integrated Systems, MLX90316 Rotary Position Sensor IC, 34 pages, Oct. 4, 2005.

(Continued)

*Primary Examiner* — Bot L LeDynh

(74) *Attorney, Agent, or Firm* — Eschweiler & Associates, LLC

(57) ABSTRACT

A magnetic field sensor device includes at least two magneto-resistive sensor elements and one switch which is connected to the at least two magneto-resistive sensor elements, and makes at least one magneto-resistive sensor element of the at least two magneto-resistive sensor elements electrically connectable into a magnetic field detection arrangement.

45 Claims, 20 Drawing Sheets

OTHER PUBLICATIONS

"Hall sensors get ahead", Helmuth Lemme, Elektronic, Sep. 2005, both in English and German, 16 pages total.

"2D Magnetic Microsensor with On-Chip signal Processing for Contactless Angle Measurement", Andreas Häberll, Michael Schneider, Piero Maloovati, Ruggero Castagnetti, Franco Maloberll and Henry Baltes, IEEE International Solid State Circuits Conference, ISSSCC96, Feb. 10, 1996, 3 pgs.

"Chip-Size Magnetic Sensor Arrays", Carl H. Smith and Robert W. Schneider, Prepared for Sensord EXPO, May 21, 2002, 11 pgs.

Application as filed. U.S. Appl. No. 11/462,125, filed Aug. 3, 2006.
Non-Final Office Action from U.S. Appl. No. 11/462,125 dated Apr. 30, 2009.
Office Action dated Dec. 2, 2009 issued to U.S. Appl. No. 11/462,125.
Office Action dated May 26, 2010 issued to U.S. Appl. No. 11/462,125.
Notice of Allowance Dated Dec. 13, 2010 for U.S. Appl. No. 11/462,125. 16 Pages.

* cited by examiner

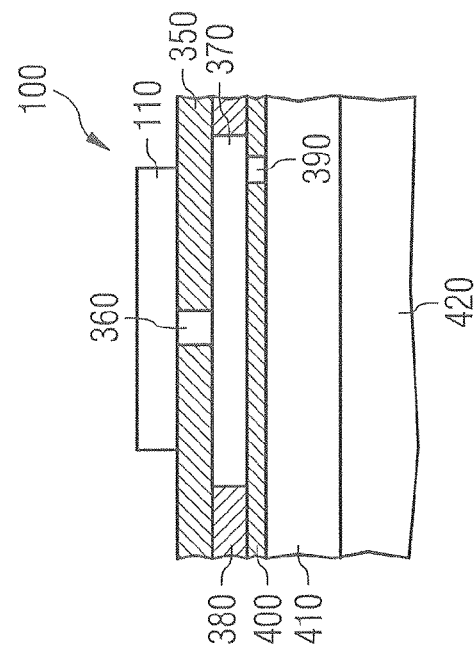
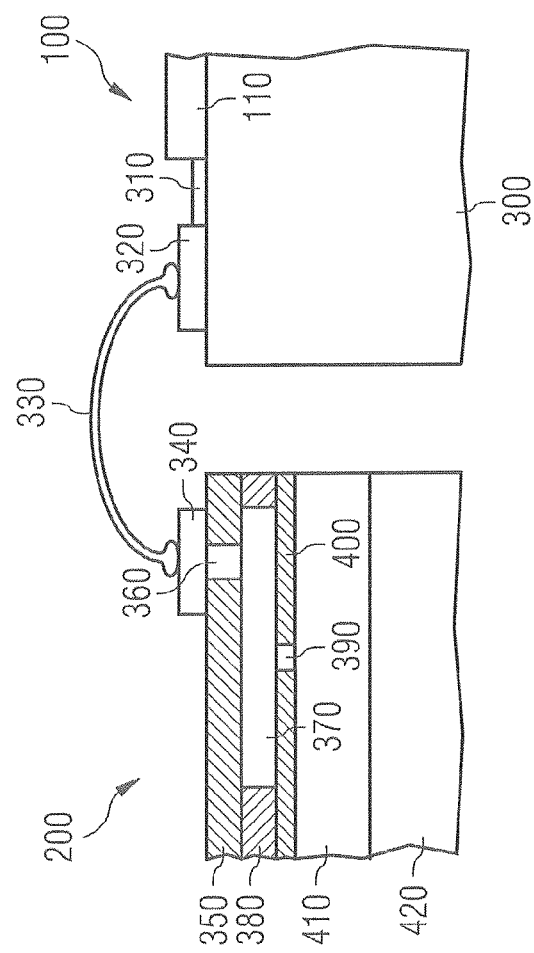

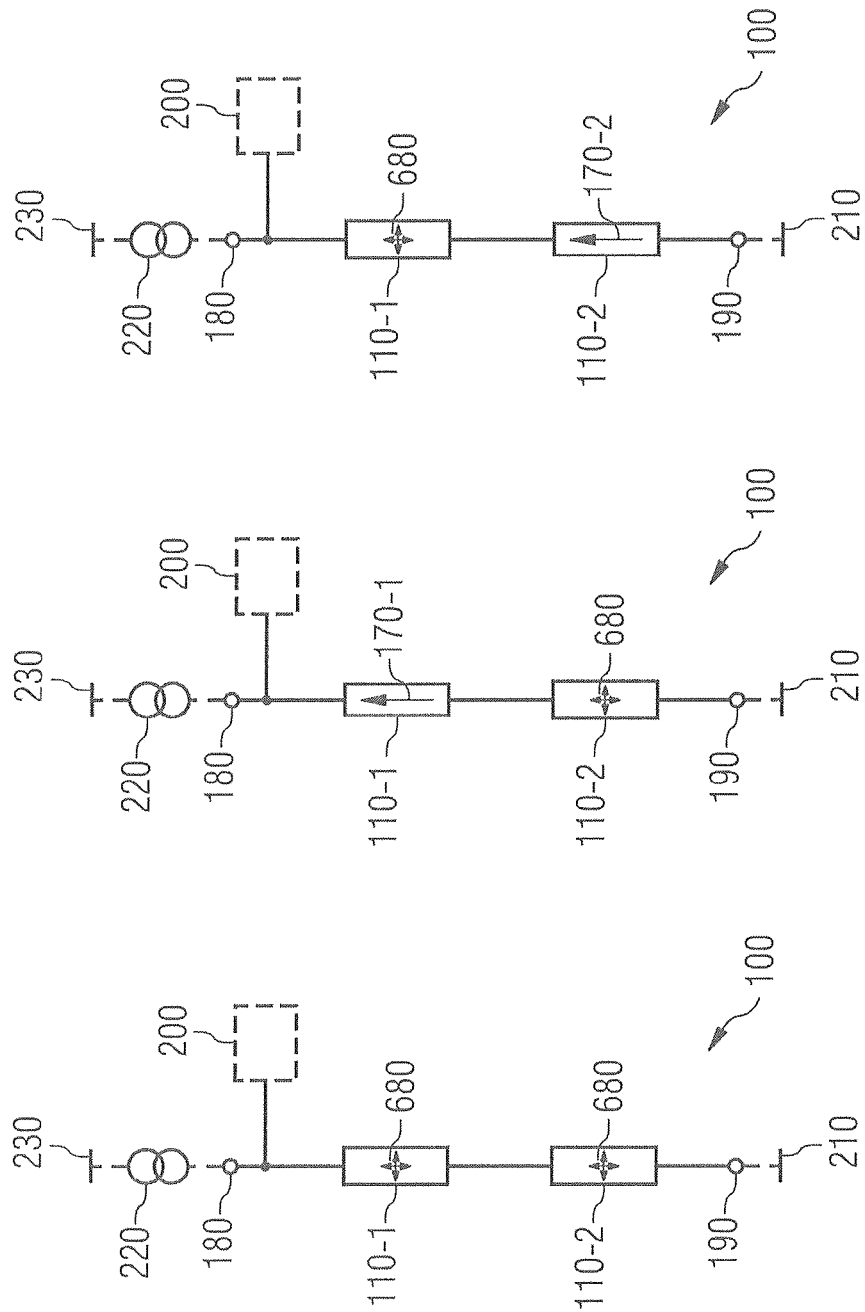

MAGNETIC FIELD SENSOR DEVICE

CROSS-REFERENCE TO RELATED APPLICATION

This application claims priority to German Patent Application No. 102006032277.0 filed on Jul. 12, 2006, the contents of which are hereby incorporated by reference its entirety.

TECHNICAL FIELD

The present invention relates to a magnetic field sensor device, in particular to a magnetic field sensor device having magneto-resistive sensor elements, like, for example, GMR sensor elements (GMR=giant magneto resistance), TMR sensor elements (TMR=tunnel magneto resistance), a spin valve sensor element, an AMR sensor element (AMR=anisotropic magneto resistance) or an EMR sensor element (EMR=extraordinary magneto resistance).

BACKGROUND

Magnetic field sensor devices are today used in a plurality of fields. They are thus, for example, used for determining a rotational speed, i.e. for example in the field of automobiles for measuring a wheel speed, like for an anti-lock breaking system (ABS) or a traction control system (TCS) or also for determining a rotational speed of a shaft, like for example a shaft at the output of a gear for determining a speed of the corresponding automobile. In addition to that, magnetic field sensor devices are also used for measuring rotation angles, like for measuring a steering wheel lock angle in the field of automobiles. But also in other fields of the art, in which angle information is to be converted into an electric signal for further processing, magnetic field sensor devices are, for example, used within the scope of angle sensors.

Here, corresponding magnetic field sensor devices are used for the detection of a magnetic field or a change of a magnetic field influenced or generated by an external, usually mechanical component. Frequently, thus for example with a rotating component whose angular position is to be determined a magnet is connected whose magnetic field is to be determined with regard to a predetermined spatial direction. A further alternative is that, for example, a mechanical structure is connected to the rotating component which influences a magnetic field so that a magnetic field detected by a magnetic field sensor device is accordingly influenced by the rotation of the rotating component.

Here, frequently the problem results that, due to installation tolerances, manufacturing tolerances and other influences relating to the production, a positioning of the magnetic field sensor device with regard to an external component may only be performed with very high effort and costs or not at all. In addition to that, frequently the problem occurs that, for example, for tightening a production line a magnetic field sensor device should, if possible, be used for more than one application in order to reduce the additional overhead and the additional costs for the manufacturing of different product lines.

SUMMARY

According to one embodiment, a magnetic field sensor device may include at least two magneto-resistive sensor elements and a switch which is connected to the at least two magneto-resistive sensor elements and makes at least one magneto-resistive sensor element of the at least two magneto-resistive sensor elements electrically connectable into a magnetic field detection arrangement.

BRIEF DESCRIPTION OF THE DRAWINGS

In the following, embodiments of the present invention are explained in more detail with reference to the accompanying drawings, in which:

FIG. 14a shows a schematical illustration of a magnetic field sensor device according to a further embodiment as a discrete device with an evaluation circuit as an integrated circuit in the form of a discrete device electrically coupled to the magnetic field sensor device via a conductive connection;

FIG. 14b shows a schematical sectional illustration of an integrated magneto-resistive sensor according to a further embodiment, wherein the magneto-resistive sensor elements, the switch and the evaluation circuit are integrated on a chip;

FIGS. 21a to 21c show magnetic field sensor devices according to further embodiments, wherein by a conditioning of magneto-resistive sensor elements a magnetic field sensor device with a certain magnetic field detection arrangement is obtained.

DETAILED DESCRIPTION

Figure 1:
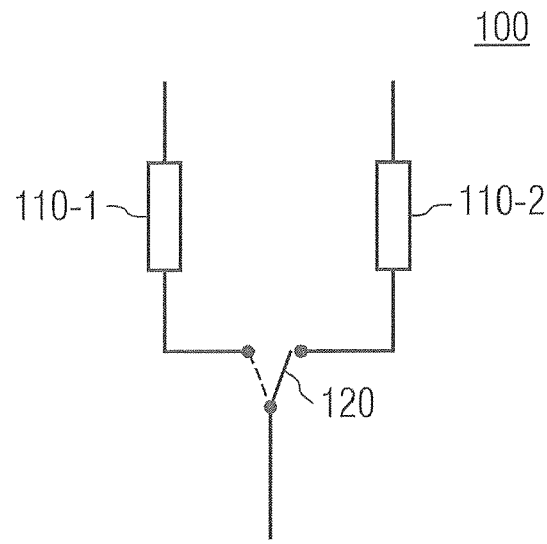
FIG. 1 shows a circuit diagram of a magnetic field sensor device according to a first embodiment.

One advantage of an embodiment can be that an magnetic field sensor device according to an embodiment enables a use of a flexible magnetic field detection arrangement due to the fact that one magneto-resistive sensor element of the at least two magneto-resistive sensor elements is electrically connectable into the magnetic field detection arrangement.

According to one embodiment, a magnetic field sensor device may include at least two magneto-resistive sensor elements and a switch which is connected to the at least two magneto-resistive sensor elements and makes at least one magneto-resistive sensor element of the at least two magneto-resistive sensor elements interchangeably couplable to a supply voltage.

According to one embodiment, a magnetic field sensor device may include a plurality of magneto-resistive sensor elements which are connectable into a magnetic field detection arrangement, an additional magneto-resistive sensor element and a switch which is coupled to the plurality of magneto-resistive sensor elements of the magnetic field detection arrangement and to the additional magneto-resistive sensor element to decouple one of the magneto-resistive sensor elements of the magnetic field detection arrangement and to couple the additional magneto-resistive sensor element into the magnetic field detection arrangement.

According to one embodiment, an apparatus for determining a magnetic field may include a magnetic field detection arrangement with a plurality of magneto-resistive sensor means, an additional magneto-resistive sensor means or a plurality of additional magneto-resistive sensor means and a switch means coupled to the magnetic field detection arrangement and the additional magneto-resistive sensor means or the plurality of additional magneto-resistive sensor means to decouple a magneto-resistive sensor means of the magnetic field detection means and to couple the additional magneto-resistive sensor means into the magnetic field detection means or to decouple a plurality of the plurality of magneto-resistive sensor means from the magnetic field detection means and to couple the plurality of additional magneto-resistive sensor means into the magnetic field detection means.

According to one embodiment, an integrated magneto-resistive sensor may include a first plurality of half bridge circuits, wherein each half bridge circuit of the first plurality of half bridge circuits includes a series connection of a first and a second magneto-resistive sensor element to a center tap, wherein the first magneto-resistive sensor element of a half bridge circuit of the first plurality of half bridge circuits is conditioned with regard to a predetermined preferred direction, and wherein the second magneto-resistive sensor element of a half bridge circuit of the first plurality of half bridge circuits is conditioned with regard to one of the predetermined preferred direction and the opposite preferred direction, a second plurality of half bridge circuits, wherein each half bridge circuit of the second plurality of half bridge circuits includes a series connection of a first and a second magneto-resistive sensor element to a center tap, wherein the first magneto-resistive sensor element of a half bridge circuit of the second plurality of half bridge circuits is conditioned with regard to the preferred direction opposite to the predetermined preferred direction, and wherein a second magneto-resistive sensor element of a half bridge circuit of the second plurality of half bridge circuits is conditioned with regard to the predetermined preferred direction, a first multiplexer connected to the half bridge circuits of the first plurality of half bridge circuits, a second multiplexer connected to the half bridge circuits of the second plurality of half bridge circuits, an evaluation circuit connected to the first multiplexer and the second multiplexer, to the center taps of the half bridge circuits of the first plurality of half bridge circuits and the center taps of the half bridge circuits of the second plurality of half bridge circuits, to the first multiplexer and the center taps of the half bridge circuits of the second plurality of half bridge circuits or the center taps of the half bridge circuits of the first plurality of half bridge circuits and to the second multiplexer, and an output for an evaluation signal connected to the evaluation circuit.

According to one embodiment a method for manufacturing a magnetic field sensor device may include the step of providing at least two magneto-resistive sensor elements on a carrier, and providing a switch on the carrier.

According to one embodiment, a method for manufacturing a magnetic field sensor device includes a step of providing a magneto-resistive sensor element on a carrier, a step of providing an additional magneto-resistive sensor element on the carrier, a step of providing at least a part of an electrical connection of the magneto-resistive sensor element and the additional magneto-resistive sensor element, and a step of conditioning at least one of the magneto-resistive sensor element and the additional magneto-resistive sensor element or disconnecting or providing at least one of an electrical connection between the magneto-resistive sensor element and the additional magneto-resistive sensor element, to obtain a magnetic field detection arrangement.

According to one embodiment, a method for measuring a magnetic field with a magnetic field sensor device including at least two magneto-resistive sensor elements may include a step of decoupling a first magneto-resistive sensor element of the at least two magneto-resistive sensor elements from a magnetic field detection arrangement, a step of coupling a second magneto-resistive sensor element of the at least two magneto-resistive sensor elements which is not the first magneto-resistive sensor element into the magnetic field detection arrangement, and a step of performing a measurement of the magnetic field with the magnetic field detection arrangement.

According to one embodiment, a method for determining an optimal magnetic field detection arrangement with a magnetic field sensor device including at least two magneto-resistive sensor elements may include a step of performing a first measurement with a magnetic field detection arrangement including a first magneto-resistive sensor element of the at least two magneto-resistive sensor elements, a step of decoupling the first magneto-resistive sensor element from the magnetic field detection arrangement, a step of coupling a second magneto-resistive sensor element of the at least two magneto-resistive sensor elements which is not the first magneto-resistive sensor element into the magnetic field detection arrangement to obtain a modified magnetic field detection arrangement, a step of performing a second measurement with the modified magnetic field detection arrangement, a step of comparing the first measurement and the second measurement to obtain a selection result based on a predetermined selection criterion with regard to the magneto-resistive sensor elements, and based on the selection result, either a step of maintaining the modified magnetic field detection arrangement as the optimum magnetic field detection arrangement, or the steps of decoupling the second magneto-resistive sensor element from and coupling the first magneto-resistive sensor element of the at least two magneto-resistive sensor elements to the magnetic field detection arrangement as the optimum magnetic field detection arrangement.

With reference to FIGS. 1-21 now a first embodiment in the form of a magnetic field sensor device is explained in more detail with reference to the circuit diagram shown in FIG. 1.

FIG. 1 thus shows a first embodiment in the form of a magnetic field sensor device 100 having a first magneto-resistive sensor element 110-1 and a second magneto-resistive sensor element 110-2. The first magneto-resistive sensor element 110-1 is connected to a first terminal of a switch 120, while a second terminal of the switch 120 is connected to a first terminal of the second magneto-resistive sensor element 110-2. The two magneto-resistive sensor elements 110-1 and 110-2 are respectively coupled, via a second terminal, to further circuit elements which are not shown in FIG. 1 which are, for example, corresponding current supply circuits, voltage supply circuits, contact or bond areas, respectively, for contacting external circuits or other circuit elements. Likewise, a third terminal of the switch 120 is connected to further circuit elements not indicated in FIG. 1. Thus, the third terminal of the switch 120 may, for example, also be connected to a bond or contact area, respectively, an evaluation circuit, an analog/digital converter (ADC), a supply circuit or another circuit.

The magnetic field sensor device 100 enables making at least one of the two magneto-resistive sensor elements 110-1, 110-2 capable of being electrically connected into a magnetic field detection arrangement by the switch 120, such that, depending on the selected magneto-resistive sensor element 110-1, 110-2, different magnetic field detection arrangements result. In particular, the magnetic field sensor device 100 indicated in FIG. 1 enables, depending on the switch position of the switch 120, the use of a magnetic field detection arrangement including at least one of the first magneto-resistive sensor element 110-1 and the second magneto-resistive sensor element 110-2.

Here, within the scope of the present application, a magneto-resistive sensor element is an electric circuit element or resistance element with an electric resistance comprising a dependence on a magnetic field acting on the magneto-resistive sensor element. In particular, thus, within the scope of the present application, a magneto-resistive sensor element is, for example, an AMR element (AMR=anisotropic magneto resistance), a GMR element (GMR=giant magneto resistance), a CMR element (CMR=colossal magneto resistance), a TMR element (TMR=tunnel magneto resistance), an EMR element (EMR=extraordinary magneto resistance) or a spin valve structure. In addition to that, within the scope of the present application, a magneto-resistive sensor element is further an electrical circuit including at least one of the above-mentioned elements and thus comprising an electrical resistance again comprising a dependence on a magnetic field acting on the corresponding magneto-resistive sensor element.

As switches 120, in the embodiment shown in FIG. 1, like in the further embodiments shown in the further course of the present application, switches may be used which may, for example, be implemented on the basis of transistors, like for example bipolar transistors or field-effect transistors. In addition to that, the switch 120 may, for example, also be implemented in the form of more complex transistor circuits, like, for example, CMOS circuits (CMOS=complementary metal oxide semiconductor), BiCMOS circuits (BiCMOS=bipolar CMOS) or also MOSFET circuits (MOSFET=metal oxide semiconductor field-effect transistor). In addition to that also multiplexers may be used as switches 120, which may connect more than two terminals to a further terminal, the third terminal in the case of the switch 120 shown in FIG. 1. In addition to that, of course operational amplifier circuits may be used as circuits 120. In addition to that, also connections to be disconnected once, like e.g. fuses, or connections to be connected once, may be used as circuits 120. Different designs for the switch 120 are discussed and explained in more detail within the scope of the description of FIGS. 13a-13d.

The above-described embodiment and also the further embodiments are based on the finding that a more flexible magnetic field detection by the use of a more flexible magnetic field detection arrangement with two or more magnetic field detection arrangements may be achieved by the fact that via the switch 120 at least one magneto-resistive sensor element 110-1, 110-2 of the at least two magneto-resistive sensor elements 110-1, 110-2 is electrically connectable into a magnetic field detection arrangement. From this, for example, the further advantage results that a more flexible and/or more accurate positioning of the magnetic field detection arrangement or the magnetic sensor, respectively, with regard to an external magnetic field may be used for a more precise measurement of a magnetic field or a magnetic flow, respectively, caused by the external magnetic field.

By this, thus, for example the advantage of an embodiment results, that a mounting position compensation, necessary in a manufacturing process for an assembly having a magnetic field sensor device, within the scope of the manufacturing of the assembly, may take place with the magnetic field sensor device by a customer of an magnetic field sensor device within the scope of, for example, a simple programming of the switch 120. On the customer side, thus an embodiment in the form of a magnetic field sensor device may further simplify the manufacturing of an assembly by the fact that in addition to or as an alternative to a mechanical adjustment of the magnetic field detection arrangement or the magnetic field sensor, respectively, with regard to the remaining components of the assembly, i.e. for example an axis of a rotating magnet in the case of an angle sensor, an adaptation of the magnetic field detection arrangement may accordingly take place by a programming, selection or preparation of the switch 120. One embodiment thus enables also, apart from a mechanical adjustment of the sensor or the axis in the case of an angle sensor, an additional influence on the positioning of the magnetic field detection arrangement by the selection of the corresponding magneto-resistive sensor elements in the field.

It is a further advantage of an embodiment, that a simplification of the production of magnetic field sensor devices may be achieved by the fact that a magnetic field sensor device may be used in different assemblies for different purposes of use due to the fact that by a selection of a magnetic field detection arrangement by the switch 120 one and the same magnetic field sensor device may be applied in different products and assemblies. Thus, for example, a development of a magnetic field sensor device on a chip may be simplified in so far that only one chip has to be designed regarding its pattern and its layout, and only one individual corresponding mask set has to be generated for the manufacturing within the scope of the patterning of the corresponding chip. In other words, one embodiment enables a use and a production of a uniform chip until the same is, for example, mounted or integrated, respectively, in a housing or into another assembly.

It is a further advantage of an embodiment, that a magnetic field sensor device enables a common use of components for different magnetic field detection arrangements. Thus, depending on the design of the switch 120, for example one common evaluation circuit may be electrically coupled to different magnetic field detection arrangements or connected to the same, respectively, to, for example, detect different measurement values with regard to an external magnetic field for redundancy purposes and/or for plausibility purposes. Likewise, it is possible, in case of a magnetic field sensor device 100, wherein the at least two magneto-resistive sensor elements 110-1, 110-2 comprise different characteristic magnetic field directions, to measure different magnetic field components with one single evaluation circuit by a simple switch-over of the switch 120. In a further embodiment, thus via the switch 120 the at least two magneto-resistive sensor elements 110-1, 110-2 are capable of being connected into one corresponding magnetic field detection arrangement.

In a further embodiment further the advantage results that the magnetic field sensor device 100 includes an integrated circuit which, for example, again includes an evaluation circuit, the switch, a further resistance element or a Hall sensor. From this the possibility results to generate a compact and highly flexible magnet field sensor device. In a further embodiment, the at least two magneto-resistive sensor elements 110-1, 110-2 are here arranged on a layer on the integrated circuit.

In the further course, the same reference numerals are used for objects and functional units comprising the same or similar functional characteristics. In addition to that, in the further course of the present application, for objects for example included several times in one embodiment, combining reference numerals are used if not one individual certain object is meant. Thus, in the further course, the reference numeral 110 basically designates one or several magneto-resistive sensor elements, wherein as it was, for example, shown in FIG. 1, the individual magneto-resistive sensor elements were designated by the reference numerals 110-1 and 110-2.

In this context it should be noted that one the one hand, as far as not explicitly stated otherwise, sections relating to objects having similar or alike functional characteristics and/or to objects with combining reference numerals, are interchangeable among the descriptions of the different embodiments. On the other hand it should be noted that a common use of a combining reference numeral or a reference numeral for an object occurring in more than one embodiment also, for example, the combining reference numeral 110 for one or several magneto-resistive sensor elements does not mean that the same comprise identical characteristics and features in the different embodiments or the respective embodiment. Common or similar reference numerals do thus not represent a statement regarding the concrete design and dimensioning. Thus, magneto-resistive sensor elements together designated by the reference numeral 110 may, in different embodiments or also within one embodiment, well comprise different elements and also be different regarding their dimensioning, i.e. for example their electrical resistance.

Also the switch 120 occurring in the further course of the present application in different embodiments may, as already outlined above, be realized in the form of different designs. As long as within the scope of the description of a certain embodiment no one or several designs of the circuit 120 are explicitly excluded, thus also the switch 120 may be implemented in all embodiments discussed within the scope of the present application by an above plotted design explained in more detail in connection with FIGS. 13a-13d.

Figure 2:
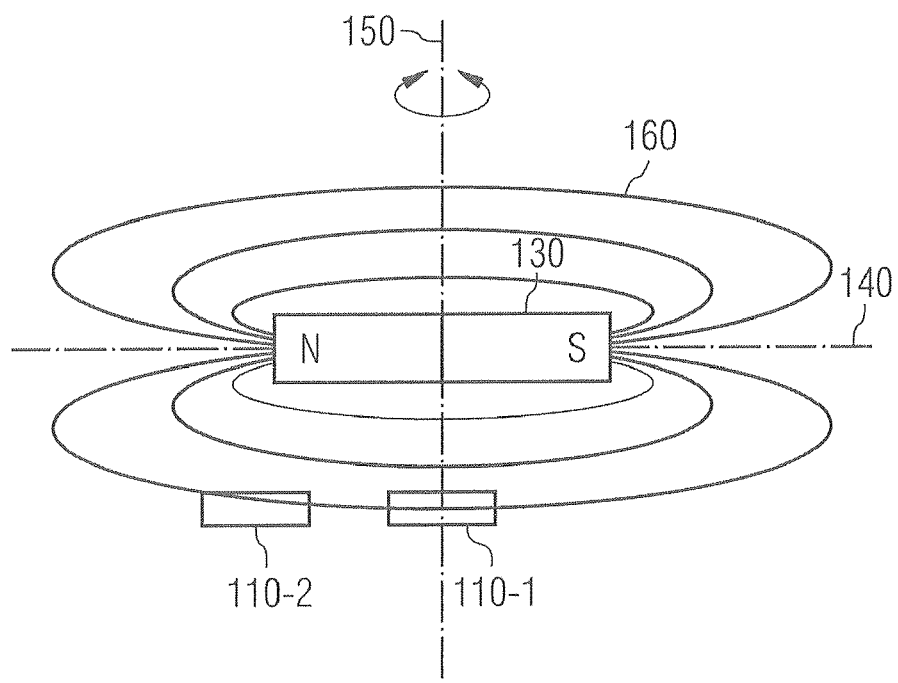
FIG. 2 shows a schematical illustration for indicating a positioning of a magnetic field sensor device with regard to an external magnetic field generated by a magnet.

Before in the further course of the present application further embodiments are explained, first, with reference to FIG. 2, the necessity, occurring in many concrete implementations within the scope of assemblies, of an exact positioning of the magnetic sensor or the magnetic field detection arrangement, respectively, with regard to an external magnetic field, frequently caused by a (permanent) magnet belonging to the assembly, for a precise measurement of the magnetic field or the magnetic flow density, respectively, is illustrated. In FIG. 2, thus, two magneto-resistive sensor elements 110-1, 110-2 are illustrated, which are included in a magnetic field sensor device not illustrated in FIG. 2 except for the two magneto-resistive sensor elements 110-1, 110-2. This magnetic field sensor device may, for example, also be an angle sensor. Thus, above the two magneto-resistive sensor elements 110 a (permanent) magnet 130 with a symmetry axis 140 is located, which is arranged rotatably around or regarding an axis 150, respectively, above the magneto-resistive sensor elements 110. In addition to that, in FIG. 2 field lines 160 of the (permanent) magnet 130 are plotted.

The magneto-resistive sensor element 110-1, in the further course designated as the first magneto-resistive sensor element, is here arranged directly below the axis 150, not only illustrating a rotational axis of the (permanent) magnet 130 but also indicating a position of the centroid of the (permanent) magnet 130. As the first magneto-resistive sensor element 110-1 is arranged directly below the axis 150, i.e. in an imaginary further course of the axis 150, the magnetic field lines 160 proceed in the area of the first magneto-resistive sensor element 110-1 in parallel to the same. The first magneto-resistive sensor element 110-1 thus represents a sensor element arranged in an "ideal position".

In contrast to this, the magneto-resistive sensor element 110-2 which is in the further course designated as the second magneto-resistive sensor element is not arranged within the area of the axis 150 of the (permanent) magnet 130, so that the magnetic field lines 160 of the (permanent) magnet 130 also intersperse this magneto-resistive sensor element with a component of the magnetic field different from zero in parallel to the axis 150. For this reason, a position of the second magneto-resistive sensor element 110-2 is also designated as the "offset position".

Due to the component of the magnetic field which is parallel to the axis 150 which intersperses the second magneto-resistive sensor element 110-2, the dependence of the magneto-resistive sensor element 110-2 on the exterior magnetic field of the (permanent) magnet 130 comprises a dependence, which is reduced compared to the position of the first magneto-resistive sensor element 110-1, of the resistance value and/or a shift or an offset, respectively, of the resistance value of the magneto-resistive sensor element 110-2, which in the case of a measurement leads to a reduced signal and thus to a reduced signal-to-noise ratio, in the case of a more complex connection of several magneto-resistive sensor elements leads to a magnetic field detection arrangement including the magneto-resistive sensor element 110-2, to an offset of the measurement signal of the magnetic field detection arrangement or to other measurement artefacts or measurement errors, respectively, which may adversely influence an evaluation and thus an evaluation signal, provided by an evaluation circuit.

In the case of many magneto-resistive sensor elements, i.e. for example in the case of GMR sensor elements applied on a carrier, a layer (e.g. an insulating layer), a layer stack, a substrate or a chip conventionally within the scope of a thin-film process as layers stacks, the same conventionally comprise a dependence of the electrical resistance value on an external magnetic field, in general only with regard to a component of the magnetic field lying in the plane of the layer stack. If the magneto-resistive sensor elements 110 in FIG. 2 are such magneto-resistive sensor elements (e.g. GMR elements), then the second magneto-resistive sensor element 110-2, as compared to the first magneto-resistive sensor element 110-1 comprises a smaller change of the electric resistance value in case of a rotation of the (permanent) magnet 130 than the magneto-resistive sensor element 110-1, due to the non-zero magnetic field component in parallel to the axis 150. The reason for this is, that due to the comparable distance of the two magneto-resistive sensor elements 110 from the (permanent) magnet 130, the absolute value of the field strength of the magnetic field hardly differs, while, however, the magnetic field of the second magneto-resistive sensor element 110-2, due to the position of this sensor element, comprises a magnetic field component in parallel to the axis 150 accordingly reducing a component perpendicular to the axis 150. In contrast to this, the magnetic field lines 160 of the (permanent) magnet 130 in the area of the first magneto-resistive sensor element 110-1 run (virtually) completely parallel to the layer stack of the GMR sensor element or perpendicular to the axis 150, respectively. For this reason, the change of resistance of the magneto-resistive sensor element 110-1 in contrast to that of the sensor element 110-2 in case of a rotation of the (permanent) magnet 130 is greater, so that also a corresponding electrical measurement signal comprises a greater modulation.

If now more than one magneto-resistive sensor element 110 is connected in a magnetic field detection arrangement, then, due to the different arrangement of the individual magneto-resistive sensor elements or other resistive elements on the carrier, the chip, the layer or the substrate, different dependencies of the electrical resistance value on the rotation of the (permanent) magnet 130 may result. As a consequence, in addition or alternatively also an offset of the measurement signal with regard to a reference signal anticipated by an evaluation circuit may result, which may finally lead to measurement errors and an increased uncertainty of the measurement result.

Also in the case of other xMR elements which are included in the magneto-resistive sensor elements 110 similar effects may result. Thus, for example, also AMR elements and TMR elements are affected by a corresponding problematic. In particular in the field of GMR magnetic field sensor devices, a mounting tolerance compensation presents a feature which is, on the one hand, generated by an embodiment in the form of a magnetic field sensor device, and, on the other hand, may be programmed or, expressed more generally, be used by a customer of the corresponding magnetic field sensor device, which represents a substantial advantage of a corresponding embodiment.

Figure 3A:
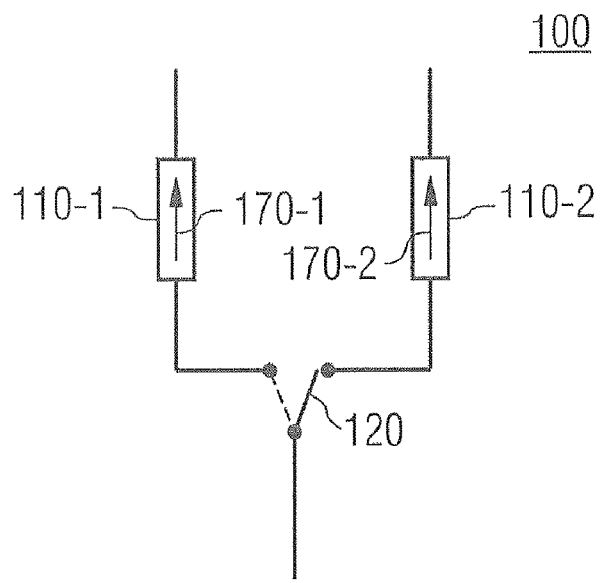
FIG. 3a shows a circuit diagram of a magnetic field sensor device according to a further embodiment.

FIG. 3a shows a further embodiment of a magnetic field sensor device 100 that is different from the magnetic field sensor device 100 shown in FIG. 1 by the fact that the two magneto-resistive sensor elements 110-1, 110-2 respectively comprise a common characteristic magnetic field direction, illustrated and indicated in FIG. 3a by two arrows 170-1 and 170-2. If the magneto-resistive sensor elements 110 shown in FIG. 3a are, for example, GMR elements, TMR elements or spin valve structures, then the same generally comprise, apart from the corresponding layers of the actual GMR elements, TMR elements or the spin valve structure, respectively, also a soft magnetic layer whose magnetization is influenced by an exterior magnetic field, as it is, for example, caused by the (permanent) magnet 130 in FIG. 2, and also a hard magnetic layer or a synthetic antiferromagnet, respectively, which comprises a "fixed" magnetization. Such a hard magnetic layer or a corresponding synthetic antiferromagnet, respectively, is frequently provided with a corresponding magnetization within the scope of a so-called conditioning step or within the scope of a conditioning, respectively. This may, for example, be performed by the fact that a corresponding pattern or structure, or the corresponding element, respectively, is heated above a temperature specific for a certain material or a certain material combination, respectively, the so-called blocking temperature, and subsequently again cooled in a magnetic field applied from the outside. By this, in the hard magnetic layer or the synthetic antiferromagnets, respectively, a magnetization is "firmly imprinted", whose direction essentially corresponds to that of the external magnetic field during cooling.

In the case of AMR sensor elements or AMR elements, respectively, the characteristic magnetic field direction of the same is in general given or fixed, respectively, due to constructive measures or a design of the corresponding AMR elements, respectively. Correspondingly, also CMR elements, EMR elements and other magneto-resistive sensor elements may be configured with regard to a characteristic magnetic field direction by a corresponding combination with soft and hard magnetic layers, for example in the form of synthetic antiferromagnets, or by constructive features, like for example the design of the corresponding sensor elements.

In this context it should be noted that magneto-resistive sensor elements frequently include meandering sensor structures. Especially in the field of GMR sensor structures, meandering structures of layer packets are advantageous, as thus an electric resistance value of the corresponding sensor structure, as compared to a simple linear sensor structure, with the same consumption of chip area, may cause a higher resistance, which again leads to a correspondingly stronger or more distinct signal course, respectively, and thus to a higher signal/noise ratio.

In the embodiment of a magnetic field sensor device shown in FIG. 3a, the two magneto-resistive sensor elements 110 are conditioned with regard to a common characteristic magnetic field direction or comprise the same, respectively. The magnetic field sensor device 100 shown in FIG. 3a thus enables, depending on the concrete implementation of the switch 120, if applicable, an interchangeable connection of the two magneto-resistive sensor elements 110-1, 110-2 into the magnetic field detection arrangement. If, however, the switch 120 only enables a one-time actuation, for example in the form of a one-time disconnection of an electrical connection or also in the form of a one-time creation of an electrical connection, as it is explained in more detail in connection with FIGS. 13a-13d, then the magnetic field sensor device 100 in FIG. 3a enables at least a one-time selection as to which of the magneto-resistive sensor elements 110 is to be electrically connected into the magnetic field detection arrangement.

Figure 3B:
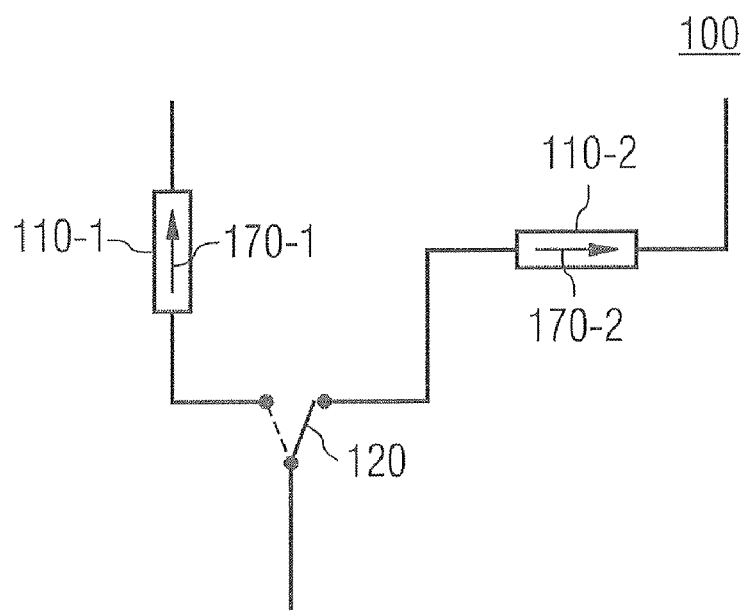
FIG. 3b shows a circuit diagram of a magnetic field sensor device comprising two magneto-resistive sensor elements comprising a different characteristic magnetic field direction, according to a further embodiment.

The embodiment shown in FIG. 3b of a magnetic field sensor device 100 is different from the one shown in FIG. 3a only in that the second magneto-resistive sensor element 110-2 comprises a characteristic magnetic field direction which deviates from that of the first magneto-resistive sensor element 110-1 and is indicated by the arrow 170-2. The embodiment illustrated in FIG. 3b of a magnetic field sensor device 100 thus enables, depending on the concrete implementation of the switch 120, if applicable, an interchangeable connection of the two magneto-resistive sensor elements 110-1, 110-2 into a magnetic field detection arrangement which is sensitive regarding different magnetic field orientations due to the different characteristic magnetic field directions of the two magneto-resistive sensor elements 110.

In other words, the embodiment of a magnetic field sensor device 100 illustrated in FIG. 3b enables connecting different magnetic field detection arrangements to different magneto-resistive sensor elements, which are sensitive for different magnetic fields, to a common evaluation circuit, which is capable of being connected to the third terminal of switch 120, is not shown in FIG. 3b, however. The magnetic field sensor device 100 of FIG. 3b accordingly shows an embodiment in which a common component, i.e. for example the evaluation circuit, may be used within the scope of two different magnetic field detection arrangements. Depending on the concrete design of the switch 120, it again depends on the fact here whether a corresponding selection may only be made once or whether the switch 120 enables an interchangeable connection of the two magneto-resistive sensor elements 110 into the different magnetic field detection arrangements.

Figure 4:
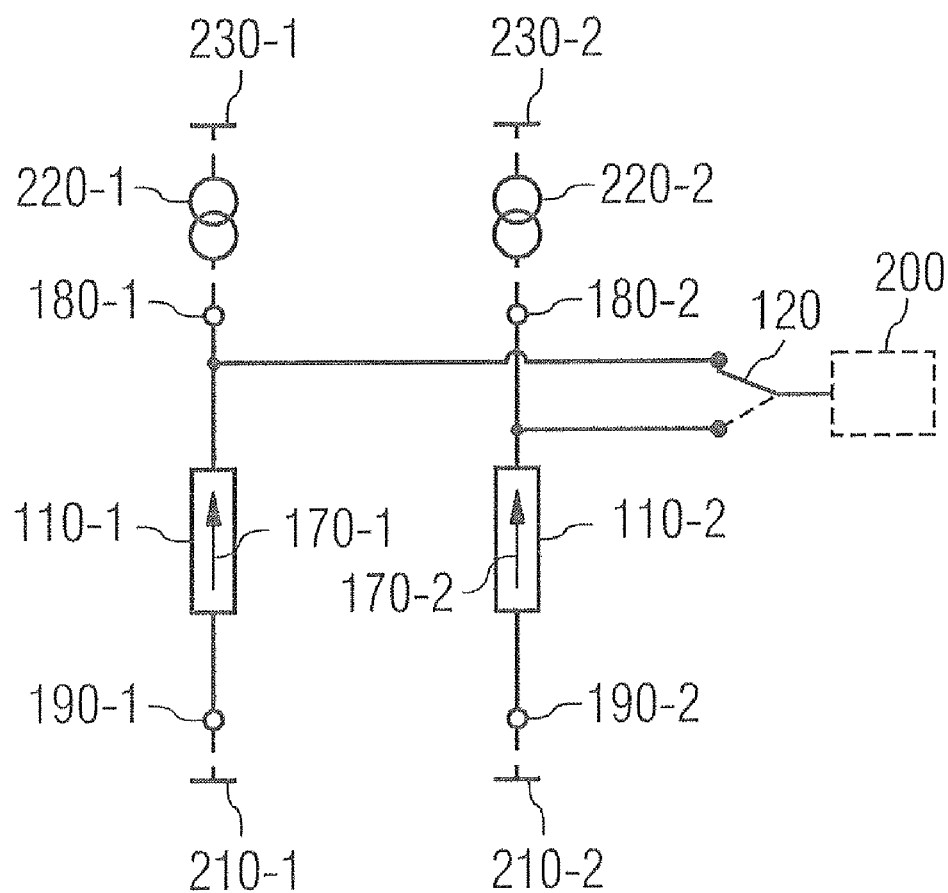
FIG. 4 shows a circuit diagram of a magnetic field sensor device according to a further embodiment having two current sources, supplying a current to two magneto-resistive sensor elements.

FIG. 4 shows a further embodiment of a magnetic field sensor device 100 again comprising a first magneto-resistive sensor element 110-1, a second magneto-resistive sensor element 110-2 and a switch 120. The two magneto-resistive sensor elements 110 comprise, like the already shown magnetic field sensor device 100 in FIG. 3a, a common characteristic magnetic field direction, indicated by the two arrows 170-1 and 170-2 in FIG. 4. Like in the embodiment of a magnetic field sensor device 100 shown in FIG. 3a, the first magneto-resistive sensor element 110-1 is connected to a first terminal of the switch 120. Correspondingly, the second magneto-resistive sensor element 110-2 is connected to a second terminal of the switch 120. In addition to that, the first terminal of the switch 120 and the first magneto-resistive sensor element are connected to a first supply terminal 180-1 for the first magneto-resistive sensor element 110-1. In addition to that, the first magneto-resistive sensor element 110-1 is connected, on the side facing away from the switch 120, to a second supply terminal 190-1. Also the second magneto-resistive sensor element 110-2 is connected, on the side facing away from the switch 120, to a second supply terminal 190-2 for the second magneto-resistive sensor element 110-2, while the second terminal of the switch 120 and the second magneto-resistive sensor element 110-2 are together coupled to a first supply terminal 180-2 for the magneto-resistive sensor element 110-2.

In addition to that, the switch 120 is coupled to an optional evaluation circuit 200 via a third terminal, indicated in dashed lines in FIG. 4 due to its optional character. The optional components of the embodiment illustrated in FIG. 4 of a magnetic field sensor device 100 further include the terminals, respectively connected to the second supply terminals 190-1, 190-2, with a reference potential (e.g. mass or ground (GND)) 210-1, 210-2 for the first magneto-resistive sensor element 110-1 and the second magneto-resistive sensor element 110-2. The first supply terminal 180-1 for the first magneto-resistive sensor element 110-1 and the second supply terminal 180-2 for the second magneto-resistive sensor element 110-2 are additionally respectively connected to an optional current source 220-1, 220-2, which are respectively able to supply a current to the two magneto-resistive sensor elements 110. The two current sources 220-1, 220-2, which are in the following combinedly designated as current sources 220, are further respectively connected to a further reference potential terminal 230-1, 230-2 for the two magneto-resistive sensor elements 110-1, 110-2.

As already in connection with the embodiments discussed in FIGS. 1, 3a and 3b of a magnetic field sensor device 100, also in the embodiment of a magnetic field sensor device 110 shown in FIG. 4 the switch 120 is a switch which, depending on the concrete implementation, may be opened or closed once, respectively, or enables an interchangeable connection of the two magneto-resistive sensor elements 110-1, 110-2 into the magnetic field detection arrangement.

In addition to that, the two optional current sources 220 may be implemented as controllable current sources, switchable current sources, constant current sources or also regulated current sources, as far as they are implemented at all due to their optional character. Depending on the implemented switch 120 it may thus be advisable, if applicable, not to implement or to permanently deactivate one of the two current sources 220 if the switch 120 may only be opened or closed once. If, for example, in the case of a switch 120 which may only be opened once or be closed once, respectively, by a corresponding programming or manipulation of the switch 120, the first magneto-resistive sensor element 110-1 is permanently connected into the magnetic field detection arrangement, an implementation of the current source 220-2 for the second magneto-resistive sensor element 110-2 may be omitted. Accordingly, an implementation of the current source 220-1 for the first magneto-resistive sensor element 110-1 may be omitted if the switch 120 only permanently connects the second magneto-resistive sensor element 110-2 into the magnetic field detection arrangement.

If now a current is supplied by one of the two current sources 220 into at least one of the two magneto-resistive sensor elements 110, then a voltage drops across the corresponding magneto-resistive sensor element 110, which is on the one hand proportional to the resistance value of the corresponding magneto-resistive sensor element 110 and on the other hand proportional to the current generated by the corresponding current source 220. Via the switch 120, a corresponding voltage is transferred to the evaluation circuit 200. By the fact that now the resistance value of the magneto-resistive sensor element 110 comprises a dependence on an exterior magnetic field, also the voltage drop across the corresponding magneto-resistive sensor elements comprises a corresponding dependence on the exterior magnetic field, which acts on the corresponding magneto-resistive sensor element 110, as far as the corresponding current source 220 gives off a constant current.

If, however, the current output by the corresponding current source 220 is not constant, the voltage dropping across the corresponding magneto-resistive sensor element 110 varies accordingly. A corresponding correction of the determined resistance value of the magneto-resistive sensor element 110 is advisable in this case in order to possibly prevent a corruption of a measurement result, i.e. for example an angle in the case of an angle sensor.

Instead of a direct use of the voltage value dropping across the corresponding magneto-resistive sensor element 110, alternatively or additionally the evaluation circuit 200 may be coupled to the corresponding current source 220 such that the evaluation circuit 200 adapts the current output by the corresponding current source 220 such that the voltage drop across the magneto-resistive sensor element is, for example, constant. In this case, a control signal provided by the evaluation circuit 200 of the corresponding voltage source 220 might be used for determining the corresponding resistance value of the magneto-resistive sensor element 110 and thus, for example, for determining an angle in the case of an angle sensor.

Figure 5A:
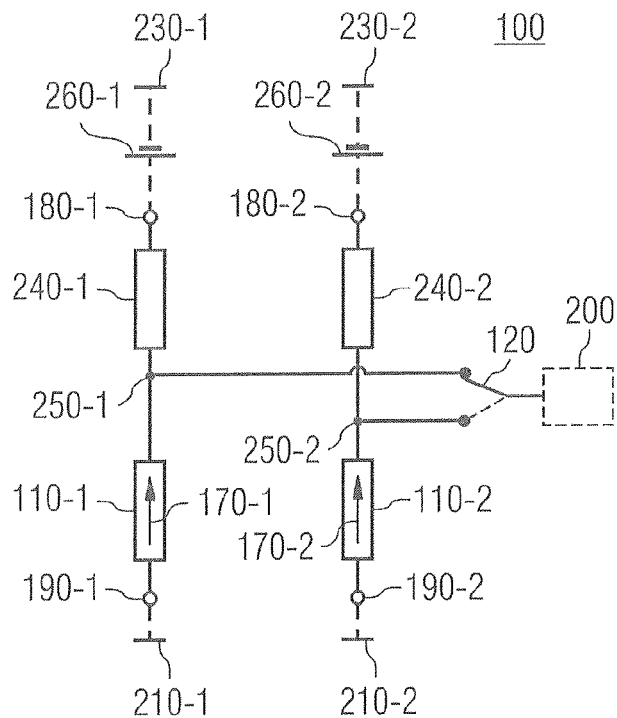
FIGS. 5a and 5b show two circuit diagrams of magnetic field sensor devices according to further embodiments having a series connection of respectively one magneto-resistive sensor element with one resistance element.

The embodiment of a magnetic field sensor device 100 illustrated in FIG. 5a is only slightly different from the embodiment illustrated in FIG. 4, which is why reference is made to the description there. In contrast to the embodiment shown in FIG. 4 of a magnetic field sensor device 100, the first magneto-resistive sensor element 110-1 and the first terminal of the switch 120 are not directly connected to the first supply terminal 180-1. In the embodiment shown in FIG. 5a, rather, between the first supply terminal 180-1 and the second supply terminal 190-1 for the first magneto-resistive sensor element 110-1 a series connection of a first resistance element 240-1 and the first magneto-resistive sensor element 110-1 is connected, wherein the first resistance element 240-1 is directly connected to the first supply terminal 180-1 and the first magneto-resistive sensor element 110-1 to the second supply terminal 190-1. The first terminal of the switch 120 is connected to a center tap of the series connection arranged between the first resistance element 240-1 and the first magneto-resistive sensor element 110-1 and connected to the same. Correspondingly, also between the first supply terminal 180-2 of the second magneto-resistive sensor element and the second supply termination 190-2 of the second magneto-resistive sensor element 110-2 a series connection with a second resistance element 240-2, a second center tap 250-2 and the second magneto-resistive sensor element 110-2 is arranged.

A further difference between the embodiment of a magnetic field sensor device 100 shown in FIG. 5a and the embodiment of a magnetic field sensor device 100 shown in FIG. 4 is that instead of the optional current sources 220 shown in FIG. 4 between the first supply terminals 180 and the further reference potential terminals 230, respectively, an optional voltage source 260-1 and 260-2 each is connected. In particular, here the optional voltage source 260-1 is connected between the further reference potential terminal 230-1 and the first supply terminal 180-1, and the second voltage source 260-2 is connected between the further reference potential terminal 230-2 and the first supply terminal 180-2. Just like the two current sources 220 in the embodiment shown in FIG. 4, the voltage sources 260-1, 260-2 shown in FIG. 5a, together designated as voltage sources 260 in the following, may be constant voltage sources, controllable voltage sources, regulated voltage sources or switchable voltage sources.

If the two resistance elements 240 comprise no or only a negligible dependence of their resistance value on an external magnetic field acting on the same, then also an overall resistance of the series connection of the corresponding resistance element 240 and the associated magneto-resistive sensor element 110 is determined by the dependence of the resistance value of the magneto-resistive sensor element 110 in the case of a change of the external magnetic field. If thus, for example, the voltage source 260 gives off a constant voltage, then a change of the external magnetic field, due to the changed overall resistance of the series connection, leads to a change of a current flowing through the series connection. Due to this, above the magneto-resistive sensor element 110 a voltage which depends on the external magnetic field also drops, which is supplied via the corresponding center tap 250 and the switch 120 to the evaluation circuit 200 for a further processing or evaluation, respectively, and provisioning of a corresponding evaluation signal.

Here, for example the evaluation circuit 200, analog to the options discussed in connection with FIG. 4, may on the one hand use the voltage drop achieved across the magneto-resistive sensor element 110 directly for provisioning the evaluation signal. On the other hand, the evaluation circuit 200 may also be connected to a controllable or adjustable voltage source 260 and provide a control signal to the same, for example controlling the voltage source 260 such that the voltage drop across the magneto-resistive sensor element 110 becomes independent of a change of the external magnetic field. In this case, the control signal provided to the voltage source comprises a corresponding dependence on the external magnetic field which may be used by the evaluation circuit 200 for a further processing and output of the evaluation signal.

Figure 5B:
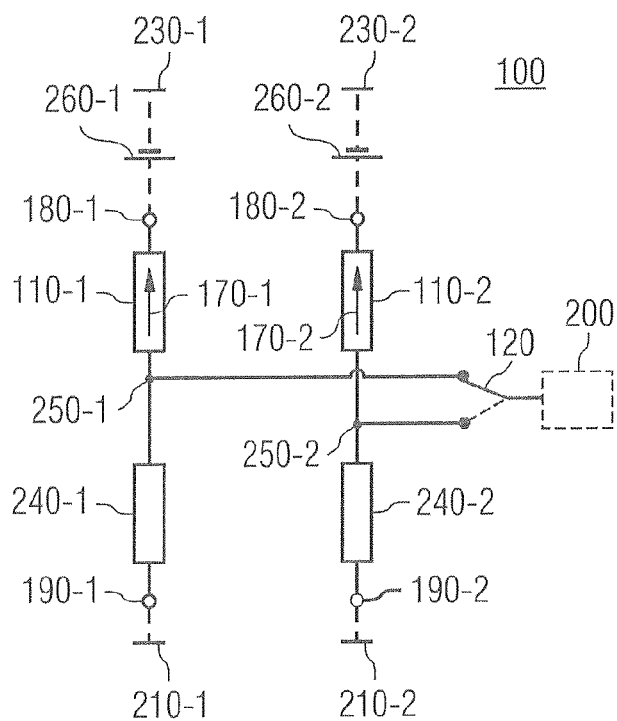

FIG. 5b shows a circuit diagram of a further embodiment of a magnetic field sensor device 100 which is different from the embodiment shown in FIG. 5a only regarding the fact that the two resistance elements 240 with their respectively associated magneto-resistive sensor elements 110 are exchanged regarding their order between the first supply terminal 180 and the second supply terminal 190. In particular, in the embodiment shown in FIG. 5b, the first magneto-resistive sensor element 110-1 is directly connected to the first supply terminal 180-1 and the first resistance element 240-1 is directly connected to the second supply terminal 190-1. Accordingly, also the second magneto-resistive sensor element 110-2, the second resistance element 240-2 and the two supply terminals 180-2, 190-2 are connected. The further elements and connections correspond to those of the embodiment shown in FIG. 5a, which is why at this point reference is made to the corresponding sections of the description.

Also the functioning of the embodiment of a magnetic field sensor device 100 illustrated in FIG. 5b is different from the embodiment illustrated in FIG. 5a only due to the fact that via the switch 120 and the center tap 250 of the evaluation circuit 200, which is again an optional component, the voltage drop is provided as a voltage signal across the resistance element 240, which comprises a corresponding dependence on the external magnetic field, due to a change of the overall resistance of the series connection caused by a change of the magnetic field, also in the case of a constant voltage output by the optional voltage source 260.

Figure 6:
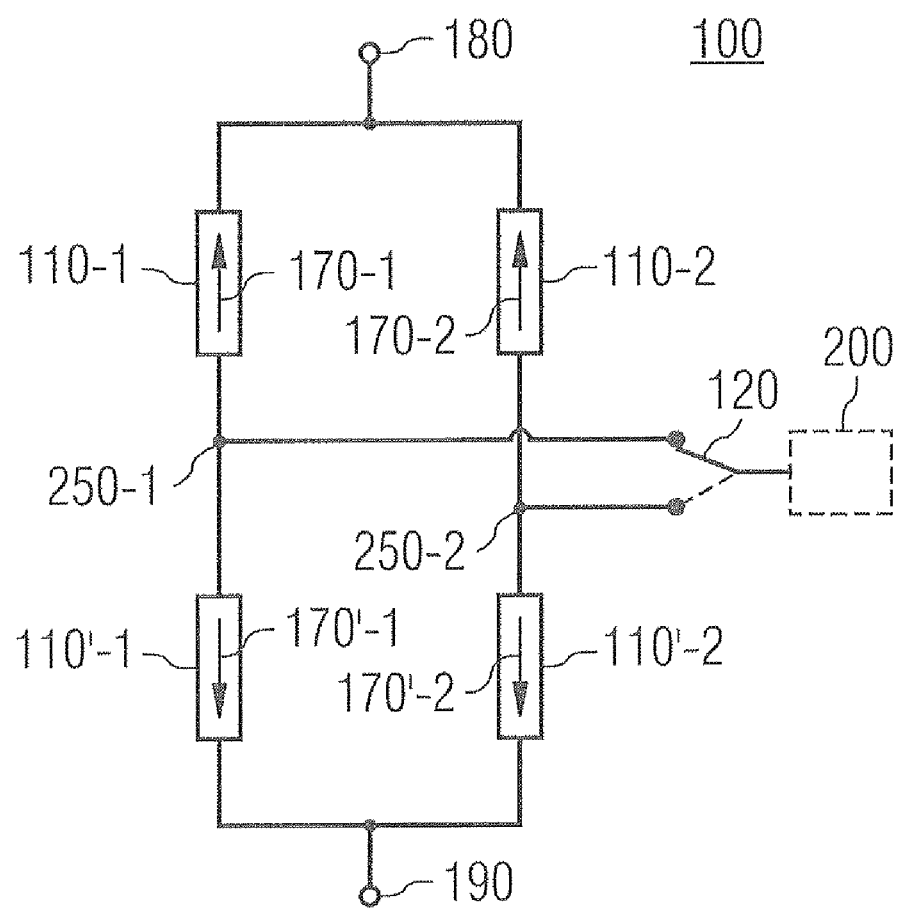
FIG. 6 shows a circuit diagram of a magnetic field sensor device according to a further embodiment having two series connections of respectively two magneto-resistive sensor elements having essentially opposite characteristic magnetic field directions.

FIG. 6 shows a circuit diagram of a further embodiment of a magnetic field sensor device 100 which is different from the embodiment shown in FIG. 5b essentially due to the fact that the resistance elements 240-1, 240-2 were exchanged against two further magneto-resistive sensor elements 110'-1, 110'-2. In addition to that, the two series connections on the one hand including the first magneto-resistive sensor element 110-1, the center tap 250-1 and the first further magneto-resistive sensor element 110'-1 and on the other hand including the second magneto-resistive sensor element 110-2, the second center tap 250-2 and the second further magneto-resistive sensor element 110'-2, are connected to a voltage source or current source as a supply circuit shown in FIG. 6 or may be connected to the same, respectively, not via separate first supply terminals 180-1, 180-2 and via separate second supply terminals 190-1, 190-2, but via a common first supply terminal 180 and a common second supply terminal 190 within the scope of a parallel connection.

In addition to that, the two embodiments of the magnetic field sensor device 100 illustrated in FIGS. 5b and 6 are different due to the fact that the magneto-resistive sensor elements 110, i.e. the magneto-resistive sensor elements 110-1, 110-2, 110'-1 and 110'-2 do not comprise a common characteristic magnetic field direction any more. In the embodiment shown in FIG. 6, the two magneto-resistive sensor elements 110-1 and 110-2 rather comprise a common characteristic magnetic field direction, as illustrated by the two arrows 170-1, 170-2. In addition to that, the two further magneto-resistive sensor elements 110'-1 and 110'-2 comprise a further common characteristic magnetic field direction which is on the one hand illustrated by the arrows 170'-1 and 170'-2 in FIG. 6 and is on the other hand essentially opposite to the characteristic magnetic field direction of the two magneto-resistive sensor elements 110-1, 110-2. Here, within the scope of the present application, two essentially opposite directions, magnetic field directions or characteristic magnetic field directions are ones which typically together form an angle in a range between 150° and 210°, preferably, however, an angle in a range between 170° and 190° to each other.

In addition to that, within the scope of the present application, two essentially identical or equal directions, magnetic field directions or characteristic magnetic field directions, respectively, are ones which typically enclose an angle of less than 30° and preferably of less than 10° between each other. Accordingly, within the scope essentially perpendicular directions, magnetic field directions or characteristic magnetic field directions are ones typically enclosing an angle in a range between 60° and 120° and preferably an angle in a range between 80° and 100° to each other.

The resistance values of the resistance elements 240-1 and 240-2 may here, like the resistance values of the magneto-resistive sensor elements 110-1 and 110-2, both deviate from each other and also correspond to each other. If the two voltage sources 260 generate identical or almost identical voltage values, respectively, it may be advisable to use resistance elements 240-1, 240-2 having (virtually) identical resistance values. Accordingly, it may in this case also be advisable to use magneto-resistive sensor elements 110-1, 110-2 having (virtually) identical resistance values, as in this case under identical operational conditions and in a homogenous magnetic field comprising no spatial dependence, at the center taps 250-1, 250-2 in this case (virtually) identical voltage values of the evaluation circuit 200 are provided, so that an additional implementation of a consideration, which of the two magneto-resistive sensor elements 110 is connected into the magnetic field detection arrangement, may, if applicable, be omitted.

Basically, also resistance values deviating from each other may be used for the resistance elements 240-1, 240-2 and the magneto-resistive sensor elements 110-1, 110-2. If applicable, it may be advisable in this case to accordingly adjust the voltage values of the voltage sources 260-1, 260-2 and/or to implement a corresponding evaluation or consideration, respectively, by the evaluation circuit 200. Accordingly, also in the further embodiments discussed within the scope of the present application, the resistance values of the different magneto-resistive sensor elements 110 or the resistance elements 240 may be (virtually) identical or different from each other in similar sections of the circuit. If applicable, it may be advisable in the latter case to correspondingly adapt the voltage values or the current sources and/or to implement a corresponding consideration within the scope of the evaluation circuit 200.

If the magneto-resistive sensor elements 110 are, for example, GMR elements or TMR elements, which, as explained above, typically comprise a soft magnetic and a hard magnetic layer or a soft magnetic layer and a synthetic antiferromagnet, respectively, and wherein the hard magnetic layer or the synthetic antiferromagnet is conditioned within the scope of a conditioning process with regard to the characteristic magnetic field direction, it is advisable in the embodiment shown in FIG. 6 of a magnetic field sensor device 100 to condition the magneto-resistive sensor elements 110-1 and 110-2 separately from the further magneto-resistive sensor elements 110'-1 and 110'-2. Here, first of all only the magneto-resistive sensor elements 110-1 and 110-2 may be heated to a temperature above the blocking temperature and subsequently be cooled in a magnetic field whose direction later corresponds to the characteristic magnetic field direction of the corresponding magneto-resistive sensor elements. In a further step, the further magneto-resistive sensor elements 110'-1 and 110'-2 may then be heated to a temperature above the blocking temperature and subsequently be cooled in a magnetic field whose direction is essentially opposite to the direction of the magnetic field within the scope of the conditioning of the magneto-resistive sensor elements 110-1 and 110-2. If, here, the magnetic fields within the scope of the conditioning are generated with the help of a magnetic field coil or several magnetic field coils, by simply reversing a current flowing through the magnetic coil or the magnetic coils, a corresponding essentially opposite conditioning of the corresponding magneto-resistive sensor elements may be realized.

If now, a positive supply voltage is applied to the first supply terminal 180 of the embodiment shown in FIG. 6 of a magnetic field sensor device 100 and a connection to a reference potential, for example ground, is provided to the second supply terminal 190, then the magneto-resistive sensor elements 110-1, 110'-1 or 110-2 and 110'-2, respectively, of the two series connections comprise resistance values which depend on a magnetic field to which they are subjected. By this, the supply voltage applied to the first supply terminal 180 is distributed to the series connection of the two magneto-resistive sensor elements 110-1 and 110'-1 or 110-2 and 110'-2, respectively, depending on the exterior magnetic field acting on the same. As a consequence, at the corresponding center tap 250-1 or 250-2, respectively, and via the switch 120, a corresponding voltage signal may be transferred to the evaluation circuit 200. Here, the first magneto-resistive sensor element 110-1 and the first further magneto-resistive sensor element 110'-1 or the second magneto-resistive sensor element 110-2 and the second further magneto-resistive sensor element 110'-2, respectively, comprise an oppositely directed change of their resistance values in the case of a change of the exterior magnetic field due to the essentially opposite characteristic magnetic field directions of the corresponding magneto-resistive sensor elements. If, thus, the resistance value of the magneto-resistive sensor elements 110-1 or 110-2, respectively, increases, for example due to a change of the exterior magnetic field, the corresponding resistance value of the further magneto-resistive sensor elements 110'-1 or 110'-2 decreases.

This means, in particular, that in the case of (virtually) identical maximum and minimum resistance values of the magneto-resistive sensor elements 110-1 and 110'-1 or 110-2 and 110'-2, respectively, an overall resistance of the series connection of a magneto-resistive sensor element 110 and the corresponding further magneto-resistive sensor element 110' is (virtually) independent of the external magnetic field. If now the (positive) supply voltage provided at the first supply terminal 180 is also constant, then a constant current flows through both series connections, (virtually) independent of the external magnetic field, so that the potential applied to the corresponding center tap 250 is dependent on the exterior magnetic field which may be detected and further processed by the (optional) evaluation circuit 200 via the switch 120.

If the embodiment of a magnetic field sensor device 100 shown in FIG. 6 is, for example, used within the scope of an angle sensor, in which a (permanent) magnet, like it is for example shown in FIG. 2, rotates above the magnetic field detection arrangement, then the potential at the center tap 250 comprises a periodical course with a periodical angle of 180°. The potential at the center tap 250 here comprises, due to the above-described virtually identical maximum and minimum resistance values of the magneto-resistive sensor elements 110 and the further magneto-resistive sensor element 110' of the series connection, a value of approximately half of the (positive) supply voltage applied to the first supply terminal 180, if the (permanent) magnet is aligned perpendicularly or with an angle of 90°, respectively, to the two essentially opposite characteristic magnetic field directions of the magneto-resistive sensor elements 110 and the further magneto-resistive sensor elements 110'.

If the maximum and the minimum resistance values of the magneto-resistive sensor elements 110 and the further magneto-resistive sensor elements 110' are not identical, it is advisable, if applicable, to implement a corresponding compensation or consideration, respectively, of the resulting effects within the scope of the evaluation circuit 200.

Figure 7:
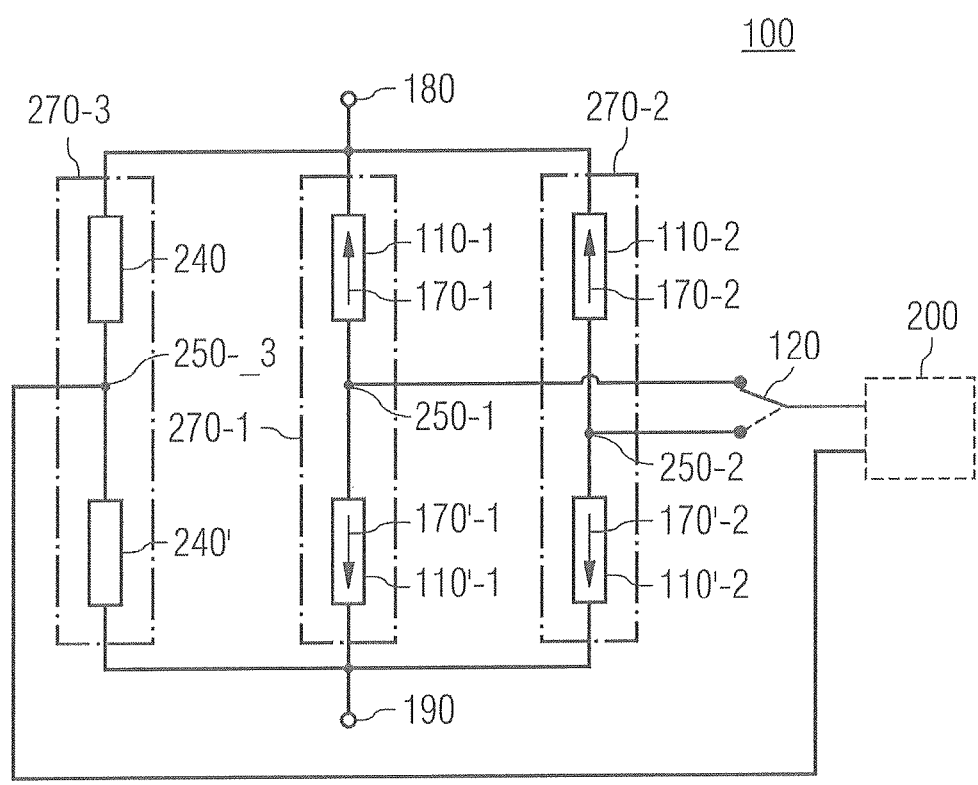
FIG. 7 shows a circuit diagram of a magnetic field sensor device according to a further embodiment in the form of a full bridge circuit, wherein a half bridge circuit having two magneto-resistive sensor elements having essentially opposite characteristic magnetic field directions is capable of being switched into the full bridge circuit.

FIG. 7 shows a first embodiment of a magnetic field sensor device 100 in the form of a full bridge circuit. The embodiment shown in FIG. 7 is here only slightly different from the embodiment of a magnetic field sensor device 100 shown in FIG. 6. In addition to the objects already shown in FIG. 6, the embodiment of a magnetic field sensor device 100 shown in FIG. 7 shows a resistance element 240 connected to the first supply terminal 180 and a further resistance element 240' directly connected to the second supply terminal 190. The resistance element 240 and the further resistance element 240' are further connected to each other via a center tap 250-3, so that the resistance element 240 and the further resistance element 240' form a series connection together with the center tap 250-3, which is connected between the first supply terminal 180 and the second supply terminal 190 in parallel to the magneto-resistive sensor elements 110-1, 110-2, 110'-1, 110'-2.

A difference to the embodiment described in FIG. 6 results in the embodiment of a magnetic field sensor device 100 shown in FIG. 7 regarding the evaluation circuit 200. In contrast to the embodiment shown in FIG. 6, in the embodiment shown in FIG. 7 the evaluation circuit 200 is not only connected to the series connection of the first magneto-resistive sensor element 110-1 and the further magneto-resistive sensor element 110'-1 on the one hand and the series connection of the second magneto-resistive sensor element 110-2 and the second further magneto-resistive sensor element 110'-2 on the other hand via the switch 120, but additionally also to the center tap 250-3 of the two resistance elements 240, 240' via a further terminal.

Due to the addition of the two resistance elements 240, 240' and the terminal of the center tap 250-3 of the two resistance elements 240, 240' to the evaluation circuit 200, the embodiment of a magnetic field sensor device 100 shown in FIG. 7 represents the first embodiment in the form of a full bridge circuit. Here, the magneto-resistive sensor elements 110-1, 110'-1, together with the center tap 250-1, form a first half bridge circuit 270-1, the magneto-resistive sensor elements 110-2, 110'-2, together with the center tap 250-2, form a second half bridge circuit 270-2 and the series connection of the resistance elements 240, 240', together with the center tap 250-3, form a third half bridge circuit 270-3. Apart from those changes or additional features and objects, respectively, the embodiment of a magnetic field sensor device 100 shown in FIG. 7 is not different from the embodiment shown in FIG. 6, which is why reference is explicitly made to the corresponding sections of the description regarding the embodiment shown in FIG. 6.

If a current is supplied via the first supply terminal 180 and the second supply terminal 190 of the magnetic field sensor device 100 of the full bridge circuit via a current course not shown in FIG. 7 or if a voltage is applied to the magnetic field sensor device 100 via the first supply terminal 180 and the second supply terminal 190 from a voltage source not shown in FIG. 7 either, then, via a corresponding programming, setting or preparation of the switch 120 one of the two half bridge circuits 270-1, 270-2 with the magneto-resistive sensor elements 110 together with the half bridge circuit 270-3 of the two resistance elements 2400 may be connected to the evaluation circuit 200 to form a full bridge circuit.

By doing so it is possible to implement the evaluation circuit 200 for example such that the same, for example, uses a differential signal for a further processing and evaluation of the (voltage) signals obtained from the full bridge circuit. The differential signal may here be obtained by a differential formation between a signal provided depending on the switch position of the switch 120 from the center tap 250-1 of the half bridge circuit 270-1 or from the center tap 250-2 of the half bridge circuit 270-2 of the evaluation circuit 200, and a signal which the evaluation circuit 200 obtains from the center tap 250-3 of the half bridge circuit 270-3.

Depending on the design of the individual resistance elements 240, 240' and magneto-resistive sensor elements 110, such an offset of the (voltage) signal obtained from the center taps 250-1 or 250-2, respectively, may be partially or completely compensated. If, for example, the magneto-resistive sensor elements 110-1, 110'-1, 110-2, 110'-2 respectively comprise (virtually) identical maximum and minimum resistance values regarding a variation of the exterior magnetic field in the case of a homogenous magnetic field, and if, in addition, the two resistance elements 240, 240' for example comprise no or only a negligible dependence of their resistance values on an exterior magnetic field, wherein the resistance values of the two resistance elements 240, 240' correspond to a mean value of the maximum and the minimum resistance value of the magneto-resistive sensor elements 110, the differential signal generated by the evaluation circuit 200 on the one hand, in case of a rotation of the exterior magnetic field, comprises a periodic change with a period of the rotational angle of the exterior magnetic field of 180°.

On the other hand, due to the described design of the resistance elements 240 and the magneto-resistive sensor elements 110 regarding their resistance values and due to the characteristic magnetic field direction of the magneto-resistive sensor elements already described in connection with FIG. 6, again schematically illustrated in FIG. 7 by the arrows 170, the differential signal shows a (virtually) negligible offset or a (virtually) negligible signal value in the case of an orientation of the external magnetic field in a right angle (90°) regarding the orientation of the characteristic magnetic field directions of the magneto-resistive sensor elements 110. In other words, the differential signal generated by the evaluation circuit 200 on the basis of the two signals of the half bridge circuits 270-1 or 270-2, respectively, and 270-3 comprises an offset compensation or zero-point correction, respectively, so that the ratio of the modulation of the differential signal caused by the change of the external magnetic field compared to a mean value of the differential signal obtained with regard to all possible orientations of the external magnetic field comprises a significant increase as compared to the signal course of the embodiment shown in FIG. 6.

The embodiment shown in FIG. 7 of a magnetic field sensor device 100 thus again represents an angle sensor with an angle range of 180°. If other ratios of the resistance values of the resistance elements and the magneto-resistive sensor elements than the ones plotted above are present, deviations from this may, for example, be compensated by an implementation of corresponding corrections within the scope of the evaluation circuit 200 within the scope of further processing.

The embodiment of a magnetic field sensor device 100 shown in FIG. 7 thus enables, by a corresponding actuation, programming, preparation and other settings of the switch 120, to spatially offset a magnetically effective measurement point by the selection of one of the two half bridge circuits 270-1, 270-2 on a carrier on which the magneto-resistive sensor elements 110 are arranged. By the selection of one of the half bridge circuits 270-1, 270-2 different magnetic field detection arrangements may be switched to be active to thus offset the magnetically effective measurement point of the magnetic field detection arrangement in space.

Here, within the scope of the present application, a magnetically effective measurement point is a (spatial) point characterizing a central point of the respectively active magnetic field detection arrangement. In case of an individual magneto-resistive sensor element 110, the same is generally directly in the range of the corresponding magneto-resistive sensor element 110. In other words, a respective magnetically effective measurement point in the case of the embodiments shown in FIGS. 1, 3a, 3b, 4, 5a and 5b is respectively located approximately in the area of the magneto-resistive sensor element 110 switched to be active by the switch 120. Depending on the concrete implementation and the design of the magneto-resistive sensor elements 110 it may here be the case that the magnetically effective measurement point itself is not directly located in the or at the magneto-resistive sensor element, since, as already described above, for example in the field of GMR elements meandering structures are frequently used so that the magnetically effective measurement point is in the area between the actual structures of the GMR element.

As, typically, TMR elements comprise higher electrical resistance values than GMR elements of the same size, TMR elements may generally be dimensioned smaller so that an implementation in the form of a meandering structure may typically be omitted. For this reason, in the case using a TMR element, thus the magnetically effective point when using an individual TMR element is frequently located within a magnetic field detection arrangement directly in the or at the corresponding TMR element, respectively.

In case of a series connection of two magneto-resistive sensor elements, as shown by the embodiments in FIGS. 6 and 7, the magnetically effective measurement point is generally in the range of an (imagined) connection line between the corresponding magneto-resistive sensor elements. The exact location of the magnetically effective measurement point may here depend on further parameters, for example the electric resistance values of the corresponding magneto-resistive sensor elements. In the case of identical or virtually identical electrical resistance values, for example in the case of an activation of the half bridge circuit 270-1 by the switch 120 in the embodiment shown in FIG. 7, it is about in the middle of the (imagined) connection line between the magneto-resistive sensor element 110-1 and the further magneto-resistive sensor element 110'-1. The same holds true for the embodiment shown in FIG. 7 also for the magnetically effective measurement point in the case of an activation of the half bridge circuit 270-2 by the switch 120. For reasons of clarity, in FIG. 7 the magnetically effective measurement points are not indicated.

Figure 8:
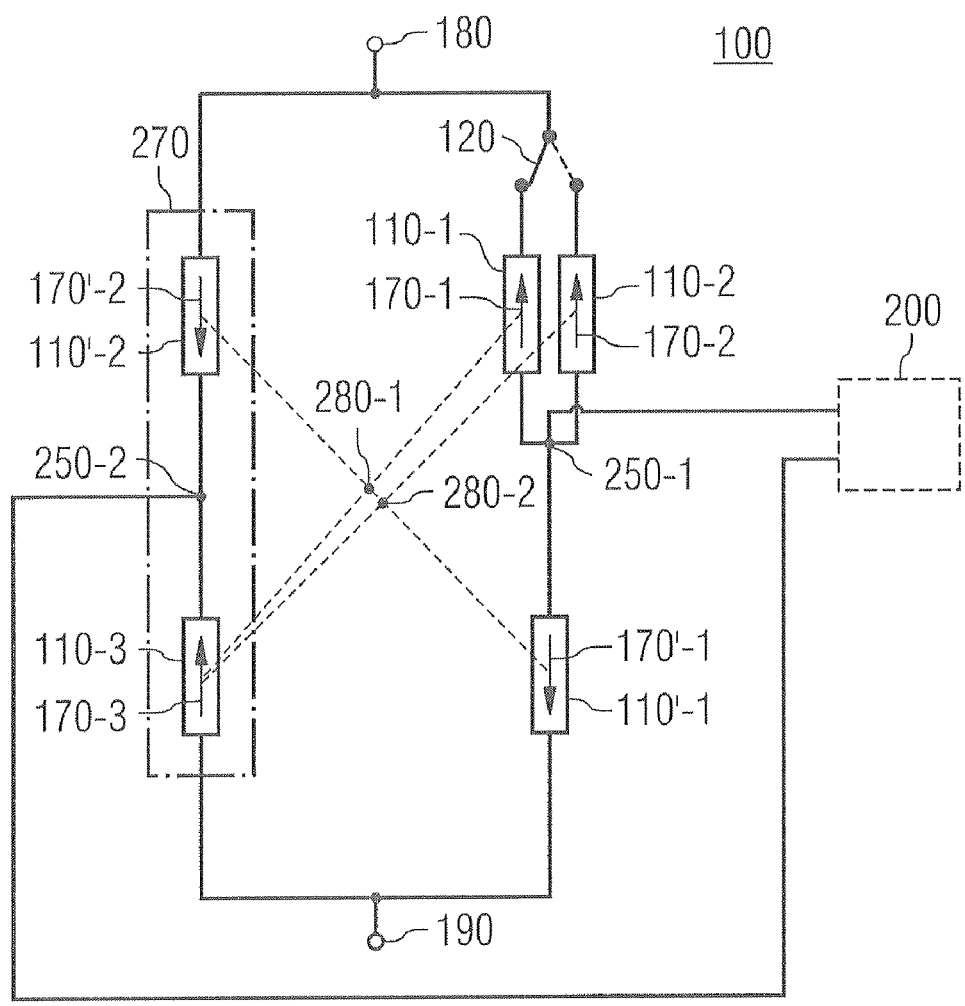
FIG. 8 shows a circuit diagram of a magnetic field sensor device according to a further embodiment with a full bridge circuit having four magneto-resistive sensor elements and a fifth magneto-resistive sensor element which is capable of being switched into the full bridge circuit instead of one of the four magneto-resistive sensor elements.

FIG. 8 shows a circuit diagram of a first embodiment of a magnetic field sensor device 100 with a full bridge circuit, wherein the respective half bridge circuits all include magneto-resistive sensor elements. The embodiment of a magnetic field sensor device 100 shown in FIG. 8 is similar to the embodiment shown in FIG. 7, is different from the embodiment shown in FIG. 7 in some respects, however. Thus, in the embodiment shown in FIG. 8, at a first supply terminal 180 a half bridge circuit 270 is connected, including a magneto-resistive sensor element 110'-2 and a magneto-resistive sensor element 110-3. These two magneto-resistive sensor elements 110'-2 and 110-3 are here connected in series via a center tap 250-2. The half bridge circuit 270 is further connected, to be precise via the magneto-resistive sensor element 110-3, to a second supply terminal 190. The center tap 250-2 of the half bridge circuit 270 is connected to an evaluation circuit 200. The half bridge circuit 270 of the embodiment shown in FIG. 8 thus replaces the half bridge circuit 270-3 of the embodiment shown in FIG. 7, as the resistance elements 240, 240' of the embodiment of FIG. 7 were replaced by the magneto-resistive sensor elements 110'-2 and 110-3, wherein the two magneto-resistive sensor elements 110'-2, 110-3 comprise essentially opposing characteristic magnetic field directions, as illustrated in FIG. 8 by the arrows 170'-2 and 170-3.

A second half bridge circuit, together with the half bridge circuit 270 generating the full bridge of the embodiment illustrated in FIG. 8, is also connected between the first supply terminal 180 and the second supply terminal 190. In particular, this half bridge circuit which is not marked in FIG. 8 for reasons of clarity includes a magneto-resistive sensor element 110'-1 whose characteristic magnetic field direction is indicated by the arrow 170'-1 in FIG. 8 and essentially corresponds to the magneto-resistive sensor element 170'-2, and a center tap 250-1 connected to the evaluation circuit 200. Here, the magneto-resistive sensor element 110'-1 is connected between the second supply terminal 190 and the center tap 250-1.

In contrast to the embodiment shown in FIG. 7, in the embodiment shown in FIG. 8 a switch 120 is directly connected to the first supply terminal 180. A first terminal of the switch 120 is further connected to a magneto-resistive sensor element 110-1 and the center tap 250-1. Accordingly, a second terminal of the switch 120 is connected to a magneto-resistive sensor element 110-2 and the center tap 250-1. Depending on the switch position of the switch 120, the same, if applicable, enables an interchangeable connection of the magneto-resistive sensor elements 110-1, 110-2 into the magnetic field detection arrangement. Alternatively, the switch 120, as already discussed above, may also be a switch which only enables a one-time "switching" by a one-time disconnection or connection. Concrete designs of such a switch 120 are explained in more detail in connection with FIGS. 13a-13d. Depending on the switch position of the switch 120, thus the magneto-resistive sensor element 110-1 or the magneto-resistive sensor element 110-2 is connected into the half bridge circuit which further includes the center tap 250-1 and the magneto-resistive sensor element 110'-1.

As a difference, for example, to the embodiment shown in FIG. 7, the switch 120 of the embodiment shown in FIG. 8 enables, also in the case of a use of a full bridge circuit, a targeted exchange of a magneto-resistive sensor element 110 with another one within a half bridge circuit. In other words, in the embodiment shown in FIG. 8, by the switch 120 one of the two magneto-resistive sensor elements 110-1 or 110-2 may be electrically connected into the magnetic field detection arrangement.

In case of a full bridge circuit, as is shown in FIG. 8, a magnetically effective measurement point essentially results as an intersection of two (imagined) connection lines between the participating magneto-resistive sensor elements of the corresponding full bridge circuit. In particular, in the embodiment illustrated in FIG. 8, a magnetically effective measurement point 280-1 results in the area of an intersection point of a connection line between the magneto-resistive sensor elements 110'-1 and 110'-2 and a connection line between the magneto-resistive sensor elements 110-3 and 110-1 in case of an electrical connection of the magneto-resistive sensor element 110-1 by the switch 120 into the magnetic field detection arrangement. Accordingly, in case of a connection of the magneto-resistive sensor element 110-2 by the switch 120 into the magnetic field detection arrangement a magnetically effective measurement point 280-2 results in the area of an intersection point of the connection line of the magneto-resistive sensor elements 110'-1 and 110'-2 and a connection line between the magneto-resistive sensor elements 110-3 and 110-2. In FIG. 8, the corresponding connection lines are indicated in dotted lines.

The embodiment shown in FIG. 8 thus illustrates that, on the one hand, with more complex bridge circuits individual magneto-resistive sensor elements within a half bridge circuit of a full bridge circuit are electrically connectable into the magnetic field detection arrangement. In addition to that, the embodiment shown in FIG. 8 illustrates, that by a correspondingly tight spatial arrangement of the magneto-resistive sensor elements 110 a slight, fine offset of a magnetically effective measurement point may be realized on the magnetic field sensor device 100, as it is illustrated by a comparison of the two magnetically effective measurement points 280-1 and 280-2 in FIG. 8. In particular, the embodiment of a magnetic field sensor device 100 shown in FIG. 8 enables a substantially finer offset of the resulting magnetically effective measurement point 280 by the fact that in contrast to the embodiment shown in FIG. 7 it is not half bridges that are electrically connectable into a magnetic field detection arrangement, but individual magneto-resistive sensor elements 110 that are electrically connectable into a half bridge circuit and thus into a magnetic field detection arrangement.

Figure 9A:
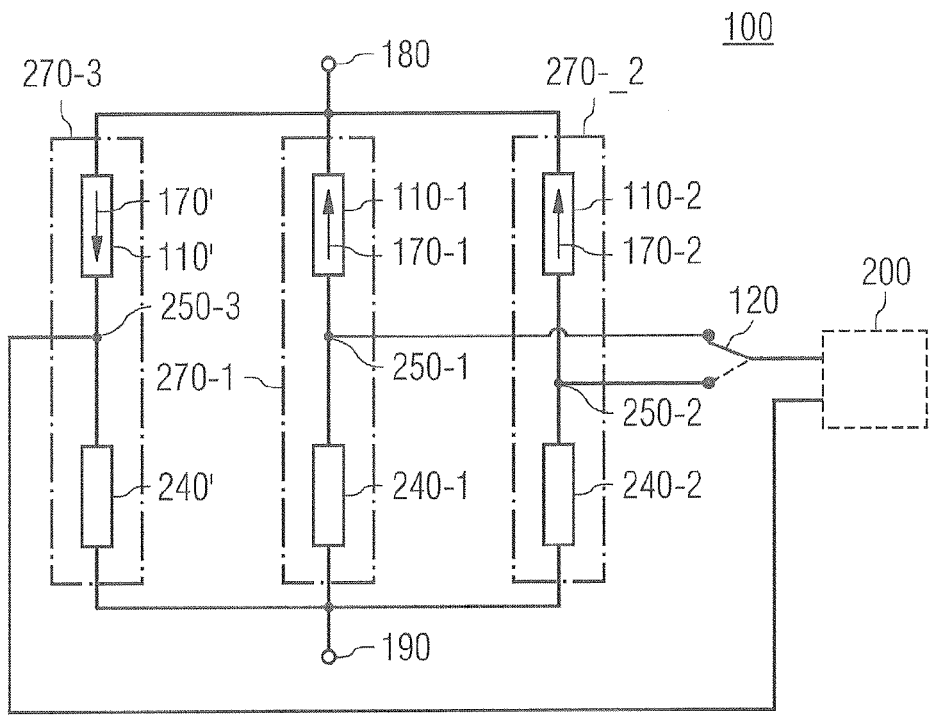
FIGS. 9a and 9b show two circuit diagrams of two magnetic field sensor devices according to further embodiments having a full bridge circuit, wherein each half bridge circuit of the full bridge includes a series connection of a magneto-resistive sensor element and a resistance element and wherein a half bridge circuit is interchangeable with another half bridge circuit.

FIG. 9a shows a circuit diagram of a further embodiment of a magnetic field sensor device 100 in the form of a full bridge circuit. The embodiment shown in FIG. 9a is in its basic structure similar to the embodiment of a magnetic field sensor device 100 already shown in FIG. 7. In contrast to the embodiment shown in FIG. 7, in which the half bridge circuits 270-1 and 270-2 respectively include a series connection of two magneto-resistive sensor elements 110 and wherein the half bridge circuit 270-3 includes a series connection of two resistance elements 240, in the embodiment shown in FIG. 9a one magneto-resistive sensor element each is connected in series with one resistance element and one corresponding center tap. Apart from that, the circuits of the embodiments in FIGS. 7 and 9a are not different, however, which is why reference is again made to the corresponding parts of the description of FIG. 7.

In particular, the magnetic field sensor device 100 shown in FIG. 9a is different due to the fact that the half bridge circuits 270 now each comprise one magneto-resistive sensor element 110 and one resistance element 240. Here, the magneto-resistive sensor elements 110-1, 110-2 and 110' are each directly coupled to the first supply terminal 180, while the resistance elements 240 are directly coupled to the second supply terminal 190. The magneto-resistive sensor elements 110 here comprise characteristic magnetic field directions, illustrated by the arrows 170 in FIG. 9a. Thus, in particular the magneto-resistive sensor elements 110-1 and 110-2 comprise an essentially parallel characteristic magnetic field direction, while the magneto-resistive sensor element 110' comprises a characteristic magnetic field direction essentially opposite to the characteristic magnetic field direction of the magneto-resistive sensor elements 110-1, 110-2, as it is also illustrated by the arrow 170' in FIG. 9a.

Figure 9B:
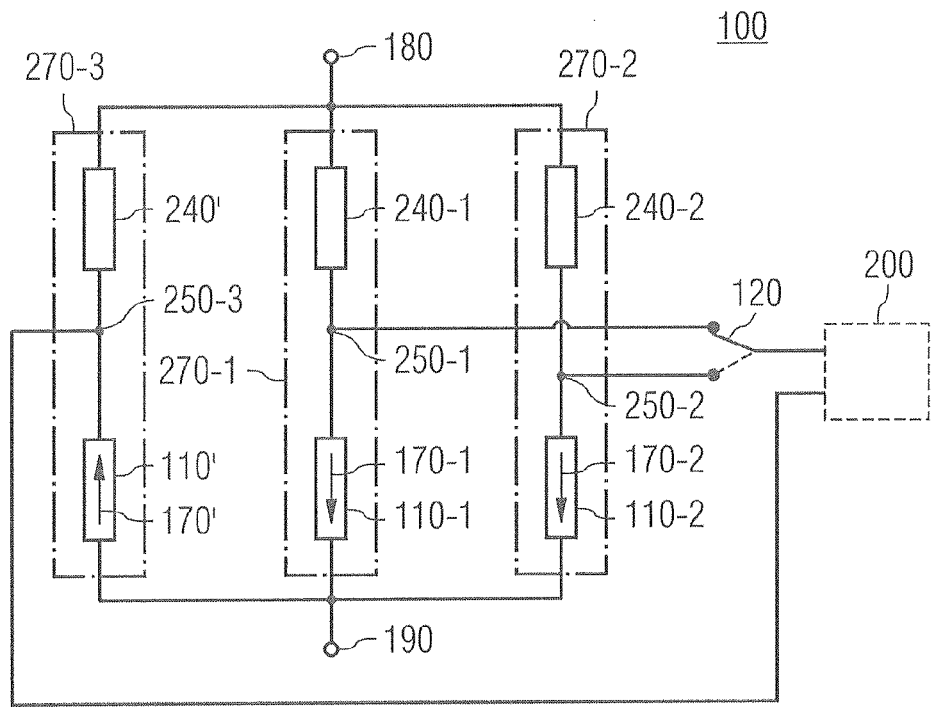

FIG. 9b shows a further embodiment of a magnetic field sensor device 100 which is different from the embodiment shown in FIG. 9a only by the fact that on the one hand the order of the magneto-resistive sensor elements 110 and the resistance elements 240 regarding their order of connection to the first supply terminal and the second supply terminal 190 are exchanged. Thus, the magneto-resistive sensor elements 110 are directly connected to the second supply terminal 190, while the resistance elements 240 are directly coupled to the first supply terminal 180. In addition to that, the two embodiments illustrated in FIGS. 9a and 9b also differ regarding the characteristic magnetic field directions illustrated in FIGS. 9a and 9b, as they are illustrated by the arrows 170-1, 170-2 and 170'. In particular, the two embodiments are different due to the fact that the magneto-resistive sensor elements are respectively opposite in the embodiment shown in FIG. 9b as compared to the embodiment shown in FIG. 9a.

The embodiments in FIGS. 9a and 9b thus illustrate that it is possible in particular also within more complex bridge circuits, for example a full bridge circuit, to combine magneto-resistive sensor elements 110 with resistance elements 240, like for example ohmic resistances, which have no or only a negligible dependence of their electric resistance value on an external magnetic field. In other words, it is not necessarily required to implement magneto-resistive bridge circuits within the scope of magnetic field sensor devices exclusively including magneto-resistive sensor elements. In addition to that it is neither necessary to implement magneto-resistive sensor elements at all in the form of bridge circuits within the scope of magnetic field sensor devices, as it was illustrated by the embodiments in FIGS. 4, 5a, 5b and 6. Thus, it is for example possible to connect magneto-resistive sensor elements 110 for a magnetic field detection in series with a current source and/or in series with an ohmic resistance or another resistance element 240, as it is in particular shown by the embodiments in FIGS. 4, 5a and 5b.

Figure 10:
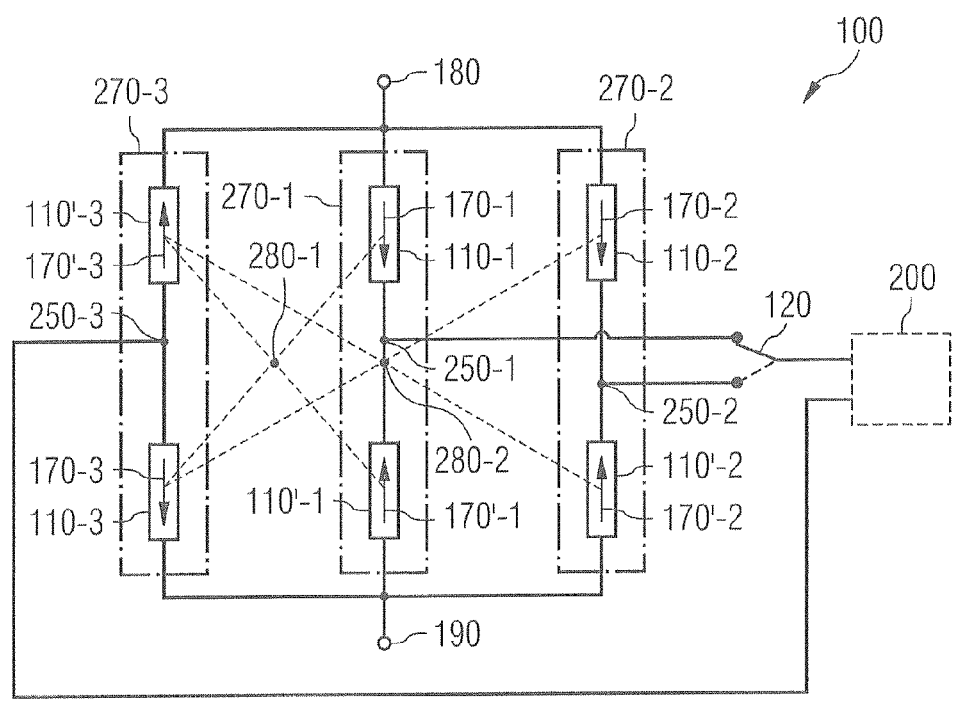
FIG. 10 shows a circuit diagram of a magnetic field sensor device according to a further embodiment having a full bridge circuit, wherein two half bridge circuits of two respective magneto-resistive sensor elements with an essentially opposite characteristic magnetic field direction are coupled to a switch.

FIG. 10 shows a further embodiment in the form of a magnetic field sensor device 100, which is only slightly different from the embodiment shown in FIG. 7. Both magnetic field sensor devices 100 are set up in the form of a full bridge circuit, wherein by the switch 120 the center taps 250-1, 250-2 of the two half bridge circuits 270-1, 270-2 may be electrically connected to the evaluation circuit 200. The half bridge circuit 230-3 provides a signal in both embodiments which may for example be used for the compensation of an average signal of the two half bridge circuits 270-1 or 270-2, respectively. For this reason, reference is explicitly made to the corresponding parts of the description regarding the embodiment shown in FIG. 7.

In contrast to the embodiment shown in FIG. 7, however, the embodiment of a magnetic field sensor device 100 shown in FIG. 10 includes no resistance elements 240, 240'. The half bridge circuit 270-3 rather includes a series connection of two magneto-resistive sensor elements 110'-3 and 110-3 comprising characteristic magnetic field directions illustrated by the arrows 170'-3 and 170-3 in FIG. 10. Here, the magneto-resistive sensor element 110'-3 is directly connected to the first supply terminal 180, the magneto-resistive sensor element 110-3 is directly connected to the second supply terminal 190 and the two magneto-resistive sensor elements 110'-3 and 110-3 are connected to the center tap 250-3 of the half bridge circuit 270-3. In addition to that, the magneto-resistive sensor elements 110'-3 or 110-3, respectively, essentially comprise opposite characteristic magnetic field directions as compared to the magneto-resistive sensor elements 110-1, 110-2 or 110'-1 and 110'-2, respectively, as it is also illustrated by the arrows 170 in FIG. 10.

The embodiment in FIG. 10 is functionally different from the embodiment in FIG. 7 by the fact that the (voltage) signal provided to the evaluation circuit 200 via the center tap 250-3 for the compensation of an offset or an average signal of the half bridge circuit 270-1 or 270-2, respectively, due to the use of magneto-resistive sensor elements 110'-3, 110-3, itself comprises a dependence on the external magnetic field. Due to the essentially opposite characteristic magnet field directions of the two magneto-resistive sensor elements 110'-3, 110-3 with regard to the magneto-resistive sensor elements 110-1, 110-2, 110'-1, 110'-2 of the half bridge circuits 270-1, 270-2, thus an amplitude of the differential signal increases, which is provided by the evaluation circuit 200 and, if applicable, used for a further processing. The differential signal is based on the signals provided by the half bridge circuits 270-3 and 270-1 or 270-2, respectively, connected into the magnetic field detection arrangement. If all magneto-resistive sensor elements 110 of the embodiment of a magnetic field sensor device 100 shown in FIG. 10 comprise, for example, (virtually) identical maximum and minimum electrical resistance values, this essentially leads to a doubling of the amplitude of the differential signal of the evaluation circuit 200.

As it was already explained in connection with FIG. 8, in the embodiment shown in FIG. 10 the magnetically effective measurement point 280-1, 280-2 of the two magnetic field detection arrangements result, which may be realized by electrically connecting the half bridge circuits 270-1 or 270-2, respectively, to the evaluation circuit 200 via the switch 120. Here, the magnetically effective measurement point 280-1 relates to adding the half bridge circuit 270-1 by the switch 120 via a connection. Accordingly, the magnetically effective measurement point 280-2 relates to an electrical connection the half-bridge circuit 270-2. In this context it is advisable to note again that the exact position of the magnetically effective measurement points 280-1, 280-2 not only depends on the geometric positioning or the spatial location, respectively, of the individual magneto-resistive sensor elements 110 on the chip, the carrier, the substrate or the insulating layer of the magnetic field sensor device 100, but also on the maximum and/or minimum electrical resistance values of the magneto-resistive sensor elements 110 and other parameters.

A distance of the two magnetically effective measurement points 280-1 and 280-2 of the two magnetic field detection arrangements that may be realized by the switch 120 is also determined by a plurality of device-specific parameters. A smallest distance of two magnetically effective measurement points is here frequently also designated as the accuracy of the adjustability of the magnetically effective measurement point 280, wherein again the combining reference numeral 280 was used for the magnetically effective measurement points occurring in FIG. 10 but also occurring in other figures. A corresponding accuracy of the adjustability of the magnetically effective measurement point, also simply designated as accuracy or mounting tolerance or tolerance, respectively, is here typically ±5000 μm. More accurate or improved and thus lower tolerances, respectively, may be advisable depending on the field of application of the magnetic field sensor device. Depending on the field of use of an embodiment of a magnetic field sensor device 100, it may be advisable to realize an accuracy or tolerance, respectively, of less than ±1000 μm, ±500 μm or ±50 μm or less. The above indicated values may be applied or transferred, respectively, to all embodiments regarding the accuracy or tolerance, respectively, of the magnetically effective measurement points. As already explained above, here, for example, in the case of series connections of magneto-resistive sensor elements, the magnetically effective measurement points are located on the connection line of the sensor elements, while in the case of individual sensor elements, the respective magnetically effective measurement point in general geometrically coincides with the respective sensor element.

The magnetically effective measurement points 280-1, 280-2 indicated in FIG. 10 ideally result in the case of identical magneto-resistive sensor elements 110 which are not different from each other regarding their electrical characteristics, parameters and other features, except for their respective characteristic magnetic field direction. As already explained above, it is not necessary that a magnetic field sensor device 100 depends on the use or implementation, respectively, of identical magneto-resistive sensor elements or also individual identical features, parameters or physical dimensions. If applicable, it is advisable in this context to implement corresponding compensations within the scope of the evaluation circuit or another circuit.

Figure 11:
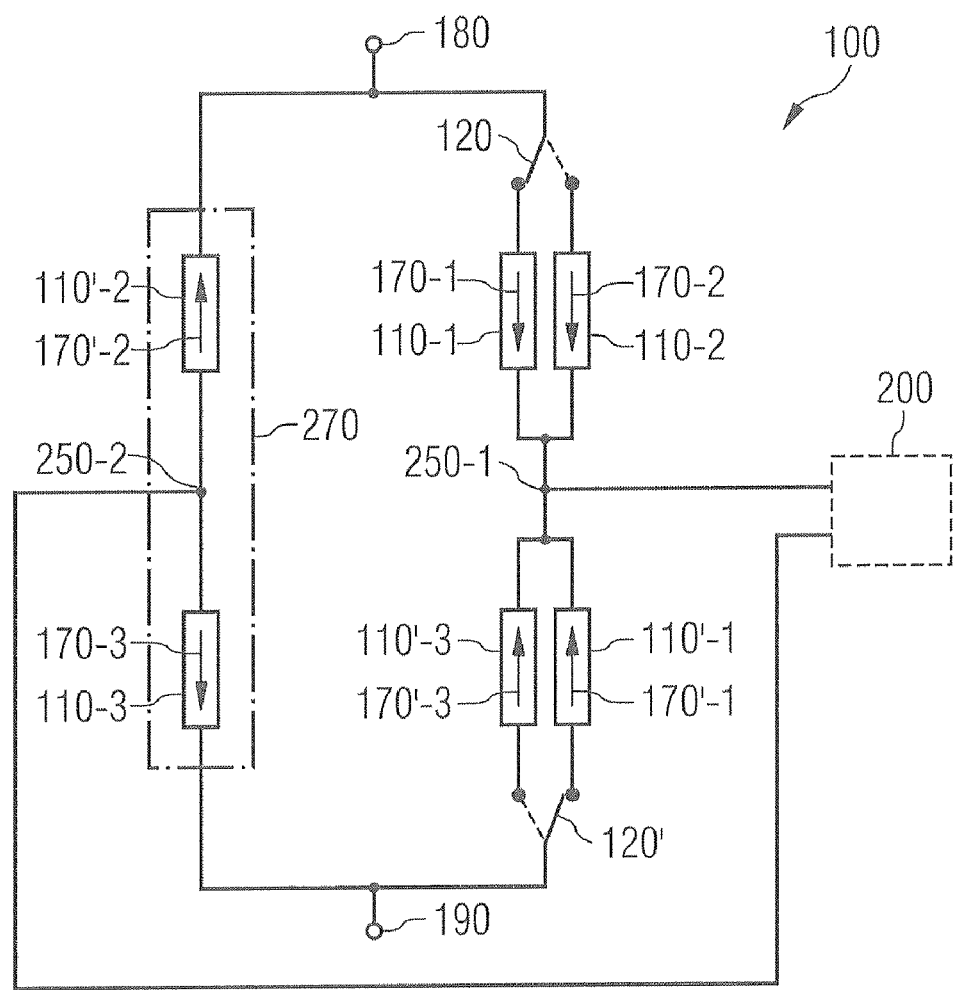
FIG. 11 shows a circuit diagram of a magnetic field sensor device according to a further embodiment having a full bridge circuit, wherein two switches are respectively connected to two magneto-resistive sensor elements to make four different magnetic field detection arrangements capable of being electrically connectable.

FIG. 11 shows a further embodiment of a magnetic field sensor device 100 which is structurally very similar to the embodiment described in FIG. 8. For this reason, here, reference is made to the corresponding sections of the description of FIG. 8. In contrast to the embodiment illustrated there, the embodiment illustrated in FIG. 11 is a magnetic field sensor device 100 which includes, apart from the switch 120, a further switch 120' which enables a further possibility for connecting a magneto-resistive sensor element 110 into a magnetic field detection arrangement.

In particular, in the case of the embodiment illustrated in FIG. 11, the magneto-resistive sensor element 110'-1 of the embodiment illustrated in FIG. 8 was exchanged by a parallel connection of two magneto-resistive sensor elements 110'1 and 110'-3, which are both connected to the center tap 250-1. Further, the two magneto-resistive sensor elements 110'-1 and 110'-3 are connected to a first terminal and a second terminal of the switch 120', which may also, like the switch 120, be a switch which enables an interchangeable connection of one of the two magneto-resistive sensor elements 110'-1, 110'-3 into the magnetic field detection arrangement. The switch 120' may also, however, as already indicated above and explained in more detail in connection with FIGS. 13a-13d, be implemented in the form of a switch to be opened once or to be closed once, respectively. The switch 120' is additionally directly connected to the second supply terminal 190 by a third terminal.

In addition to that, the embodiment illustrated in FIG. 11 is different from the embodiment illustrated in FIG. 8 in so far that the characteristic magnetic field directions of the magneto-resistive sensor elements 110 respective comprise an opposite characteristic magnetic field direction as compared to the magneto-resistive sensor elements shown in FIG. 8. In this context it is to be noted that the magneto-resistive sensor element 110'-3 newly added in the embodiment illustrated in FIG. 11 comprises a characteristic magnetic field direction essentially identical to the magneto-resistive sensor element 110'-1.

Compared, for example, to the embodiment shown in FIG. 8, the embodiment of a magnetic field sensor device 100 illustrated in FIG. 11 offers the possibility of connecting one of the two magneto-resistive sensor elements 110-1 or 110-2 to one of the two magneto-resistive sensor elements 110'-1 and 110'-2 to form a half bridge circuit which is connected to the evaluation circuit 200 by the center tap 250-1. In other words, by the switch 120, one of the two magneto-resistive sensor elements 110-1 or 110-2, and by the switch 120', one of the two magneto-resistive sensor elements 110'-1 or 110'-3, may be electrically connected into a magnetic field detection arrangement in the form of a half bridge circuit. In the embodiment shown in FIG. 11, the magnetic field detection arrangement further includes the half bridge circuit 270 with the two magneto-resistive sensor elements 110'-2 and 110-3.

The embodiment shown in FIG. 11 thus in particular provides the advantage that by the selection of two of the four magneto-resistive sensor elements 110-1, 110-2, 110'-1 and 110'-3 all in all four different magnetic field detection arrangements may be formed with several magnetically effective measurement points. By this, an offset of the magnetically effective measurement point of the magnetic field detection arrangement may take place with a high accuracy by a corresponding programming or switching of the two switches 120, 120'.

In addition to that, the embodiment of a magnetic field sensor device 100 illustrated in FIG. 11 shows the possibility that not only half bridge circuits 270 of a full bridge circuit may be connected into a magnetic field detection arrangement, but that also different magneto-resistive sensor elements 110 may be connected into a half bridge circuit.

Figure 12:
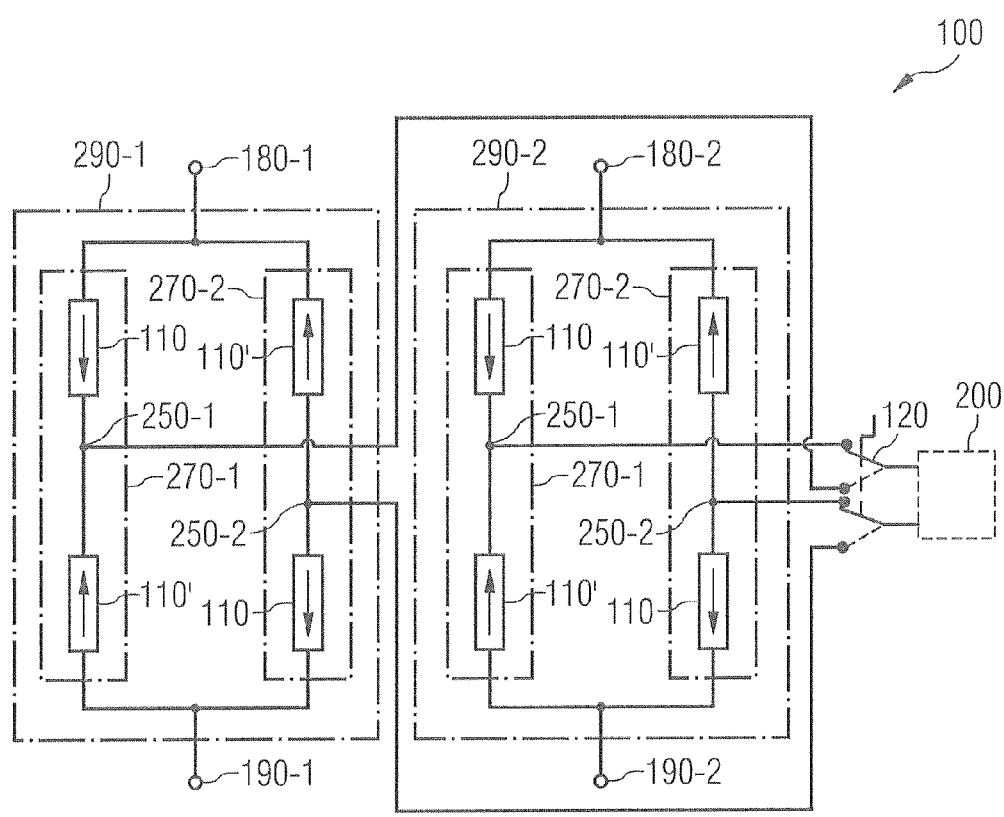
FIG. 12 shows a circuit diagram of a magnetic field sensor device according to a further embodiment having two full bridges with respectively four magneto-resistive sensor elements.

FIG. 12 shows a further embodiment of a magnetic field sensor device 100, wherein one of several full bridge circuits 290-1, 290-2 may be connected into a magnetic field detection arrangement via a switch 120. For this purpose, each full bridge circuit 290-1, 290-2 illustrated in FIG. 12 respectively comprises a parallel connection of two series-connected magneto-resistive sensor elements 110 which are each connected to a first supply terminal 180-1, 180-2 and to a second supply terminal 190-1, 190-2. Each of the two full bridge circuits 290-1, 290-2 here comprises a parallel connection of a half bridge circuit 270-1 with a magneto-resistive sensor element 110 having a first characteristic magnetic field direction and a second magneto-resistive sensor element 110' having a second characteristic magnetic field direction, wherein the first characteristic magnetic field direction and the second characteristic magnetic field direction are essentially opposite to each other. Here, the magneto-resistive sensor element 110 is respectively connected to the first supply terminal 180 and the magneto-resistive sensor element 110' to the second supply terminal 190 of the respective full bridge circuit 290.

In addition to that, each of the two full bridge circuits 290-1, 290-2 comprises a further half bridge circuit 270-2 which in turn again includes a series connection of a magneto-resistive sensor element 110' and a magneto-resistive sensor element 110. In the case of the half bridge circuit 270-2, here the magneto-resistive sensor element 110' is directly connected to the first supply terminal 180 and the magneto-resistive sensor element 110 to the second supply terminal 190 of the respective full bridge circuit 290. Each of the half bridge circuits 270-1, 270-2 additionally comprises a center tap 250-1 or 250-2, respectively, respectively connected between the magneto-resistive sensor element 110 and the magneto-resistive sensor element 110'.

The switch 120 of the embodiment illustrated in FIG. 12 comprises two first input terminals, two second input terminals and two output terminals. Here, the switch 120 is implemented such that in the embodiment illustrated in FIG. 12 the same makes one of the two first input terminals capable of being electrically connected to the first output terminal and one of the two second input terminals capable of being electrically connected to the second output terminal. Further, as illustrated in FIG. 12, the center taps 250-1 of the two half bridge circuits 270-1 are connected to the two first inputs of the switch 120. The center taps 250-2 of the two further half bridge circuits 270-2 are respectively connected to a second input terminal of the switch 120. The two output terminals of the switch 120 are additionally respectively connected to an evaluation circuit 200. By this, the switch 120 is able to electrically connect one of the two full bridge circuits 290-1 or 290-2 to the (optional) evaluation circuit 200.

The embodiment of a magnetic field sensor device 100 shown in FIG. 12 thus enables, due to the connection of the two full bridge circuits 290-1, 290-2 with the circuit 120, to make one of the two full bridge circuits 290 capable of being electrically connected into a magnetic field detection arrangement. Further embodiments in which different full bridge circuits 290 are connectable into a magnetic field detection arrangement are explained and described in more detail, for example in connection with FIGS. 17a and 17b.

Even if different magnetic field sensor devices 100 in the form of different bridge circuits are illustrated in FIGS. 7-12, the same may of course only cover a small part of the different embodiments. As the embodiments illustrated and explained in FIGS. 7-12 demonstrated, for example individual magneto-resistive sensor elements 110 may be capable of being electrically connected into the magnetic field detection arrangements by the switches 120. Further, it is possible that half bridge circuits 270 or full bridge circuits 290 are accordingly made capable of being electrically connected into a magnetic field detection arrangement via a switch 120. In addition to that, also more complicated bridge circuits with more than two half bridge circuits 270 with additional, individual magneto-resistive sensor elements 110 or several full bridge circuits 290 may be made capable of being connected into a magnetic field detection arrangement by a corresponding switch 120.

Further, as also the embodiments in FIGS. 7-12 show, magneto-resistive sensor elements 110 may also be electrically connected to other resistance elements 240, so that half bridge circuits 270 or full bridge circuits 290 of magnetic field sensor devices 100 may include magneto-resistive sensor elements 110 and/or resistance elements 240. In addition to that, within the scope of magnetic field sensor devices 100, varying characteristic magnetic field directions may be used within the scope of the magneto-resistive sensor elements. It is thus clear that the different possibilities of magneto-resistive bridge circuits, i.e. for example GMR bridges, may not all be completely shown within the scope of the present application. The embodiments shown in FIGS. 1 and 3 to 12 may thus illustrate only a few embodiments with different bridge circuits.

In addition to that, magnetic field sensor devices 100 may comprise several full bridge circuits 290, which for example comprise magneto-resistive sensor elements 110 with characteristic magnetic field directions, for example rotated by 90°. Corresponding embodiments among others suitable for measuring a rotational angle in a range of 360° are, for example, described and explained in connection with FIGS. 16, 17a, 17b, 18, 19 and 20a-20d.

Figure 13A:
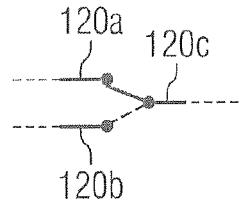
FIGS. 13a to 13d schematically show four different embodiments for one switch for a magnetic field sensor device.
Figure 13B:
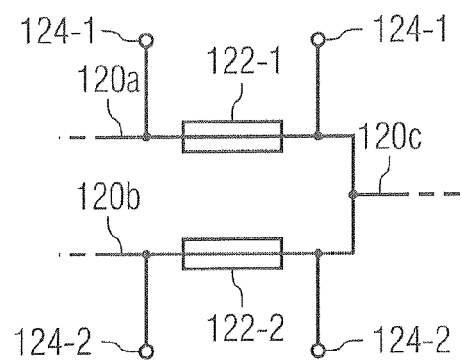

FIGS. 13a-13b show embodiments of a switch 120, like it may be used within the scope of the hitherto explained embodiments of a magnetic field sensor device 100. In particular, FIG. 13a here shows a switch or also a multiplexer 120, comprising a first terminal 120a, a second terminal 120b and a third terminal 120c, wherein the switch 120 is implemented such that the third terminal 120c is electrically connectable to one of the two terminals 120a or 120b. Such a switch 120 or multiplexer 120, respectively, may, for example, be realized with the help of bipolar transistors or field-effect transistors. Corresponding switches may also be realized in a more complex transistor technology, for example in CMOS technology (CMOS=complementary metal oxide semiconductor), simple MOS technology (MOS=metal oxide semiconductor) or in BiCMOS circuits (BiCMOS=bipolar CMOS). Further, a switch or multiplexer 120, respectively, like it is illustrated in FIG. 13a, may also be realized with the help of more complex circuits, for example including operational amplifiers.

FIG. 13b shows a further implementation of a switch 120 having a first terminal 120a, a second terminal 120b and a third terminal 120c, wherein just like with the switch 120 shown in FIG. 13a the third terminal 120c is connectable to one of or both terminals 120a or 120b. In contrast to the switch 120 shown in FIG. 13a, the switch 120 shown in FIG. 13b is a switch, however, which does not allow an interchangeable connection of the first terminal 120a or the second terminal 120b to the third terminal 120c. The switch 120 shown in FIG. 13b is rather a switch which includes a metallic connection to be disconnected once in the form of two resistance elements 122-1 and 122-2 indicated as fuses in FIG. 13b. The two resistance elements 122-1 and 122-2 or the two fuses 122-1 and 122-2, respectively, are each directly connected to one of the two terminals 120a or 120b, respectively. In addition to that, the two resistance elements 122-1 and 122-2 are connected to the third terminal 120c of the switch 120.

In order to now permanently disconnect one of the two metallic or conductive connections between the first terminal 120a and the third terminal 120c or the second terminal 120b and the third terminal 120c, respectively, of the switch 120, in the embodiment illustrated in FIG. 13b of a corresponding switch 120, to both terminals of the fuses 122-1 and 122-2 terminals 124-1 or 124-2, respectively, are connected, so that via the additional terminals 124 belonging to one of the two fuses 122 a current may be supplied to the fuse 122 which leads to a blowing or to a permanent disconnection of the metallic or conductive connection of the fuse 124.

Figure 13C:
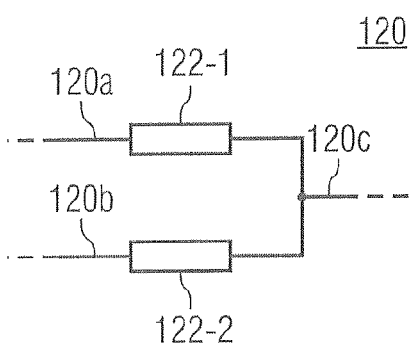

FIG. 13c shows a further embodiment of a switch 120, wherein between the first terminal 120a and the third terminal 120c a first additional resistance element 122-1 and between the second terminal 120b and the third terminal 120c a second additional resistance element 122-2 is connected. Depending on the concrete implementation of the additional resistance elements 122-1 or 122-2, respectively, which are in the further course designated as the additional resistance element 122, by a corresponding handling of the additional resistance elements 122 their electrical resistance value may be increased or decreased. If the change of resistance of the additional resistance elements 122 caused by the corresponding handling is sufficiently large, depending on the implementation of the additional resistance elements 122, an electrical connection between the first terminal 120a and the third terminal 120c or between the second terminal 120b and the third terminal 120c may be disconnected or established, respectively.

Additional resistance elements 122 which lead to an increase of the electrical resistance by a corresponding handling are, for example, represented by the fuses already shown in FIG. 13b which may be damaged deliberately by providing a correspondingly high current value or voltage value, respectively. By this, the electrical resistance value of the same abruptly rises significantly. Correspondingly, also for example by light incidence, by ion or electron bombardment a corresponding bond may be disconnected or interrupted, respectively.

Depending on the concrete implementation of the switch 120 it may here, for example, be a metallic connection or a semiconductor connection. In other words, a conductive connection between the first terminal 120a and the third terminal 120c or the second terminal 120b and the third terminal 120c, respectively, may be achieved by a local overheating, a physical destruction or a physical change of the characteristics of the corresponding resistance elements. Examples for this are an irradiation using laser light, a provision of current or a bombardment with ions or electrons.

A corresponding connection to be generated or to be established, respectively, may also be achieved by resistance elements 122 by the fact that, for example, in a semiconductor layer, included in the switch 120, for example by ion implantation or by a focussed ion beam, a doping is changed such that an electrical conductance of the additional resistance elements 122 increases or that their electrical resistance value decreases, respectively. A further possibility to achieve an increase of an electrical conductance in the additional resistance elements 122 is, for example, to generate defects in the corresponding additional resistance element 122 by means of electron bombardment or ion bombardment, which may lead to a release of charge carriers and thus to a decrease of their electrical resistance value. Such a technology is, for example, applicable in the field of additional resistance elements 122 including an epitactic or polymorphic semiconductor material, like for example silicon or polysilicon.

Figure 13D:
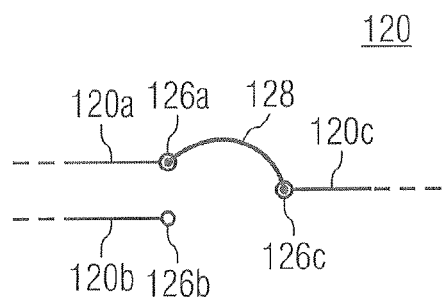

FIG. 13d shows a further embodiment of a switch 120 which facilitates a connection which may be connected or established once, respectively. In particular, FIG. 13d shows a switch 120 which again includes a first terminal 120a, a second terminal 120b and a third terminal 120c, wherein the terminals 120a, 120b, 120c are respectively connected to a contact area 126a, 126b, 126c. A connection to be established once may, for example, be generated within the scope of a bonding process between the contact areas 126 of the corresponding terminals of the switch 120. FIG. 13d thus shows an electrical connection by means of a bonding or a conductive bridge 128, respectively, connecting the terminal 120a via the contact area 126a and the contact area 126c to the third terminal 120c of the switch 120. Instead of a conductive bridge 128 generated within the scope of a bonding process, alternatively, for example, also within the scope of a thin-film process a metallic connection may be generated as a conductive bridge 128 between the corresponding contact areas 126 of the switch. One possibility for this is, for example, the use of a photosensitive polyimide onto which a metal film is applied with the help of a deposition process. Alternatively, for example also a resin patternable using patterning method or another insulating connection may be used.

Even if the switch 120, as it is shown in of FIGS. 13a-13d and in FIGS. 1, 3a-11, only comprises a first terminal, a second terminal and a third terminal each, wherein the third terminal is electrically connectable to at least one of the two other terminals, in embodiments of magnetic field sensor devices 100 also more than two magneto-resistive sensor elements 110, half bridge circuits 270 or full bridge circuits 290 may be connectable into a magnetic field detection arrangement, so that a corresponding switch 120 may comprise more than only two terminals which are electrically connectable to a further terminal. Examples for this are among others angle sensors, which are explained in more detail in the further course of the present application.

In FIGS. 14a and 14b two embodiments of a concrete implementation of a magnetic field sensor device 100 are illustrated with a corresponding evaluation circuit 200. FIG. 14a here shows an embodiment of a discrete solution in which one embodiment of a magnetic field sensor device 100 with a magneto-resistive sensor element 110 is electrically connected to an evaluation circuit which is in turn implemented as a discrete device in the form of an integrated circuit, for example a CMOS circuit.

On a carrier 300, which may, for example, include an insulating material, a semiconductor material, a ceramic material or another material, the embodiment of a magnetic field sensor device 100 shown in FIG. 14a comprises the magneto-resistive sensor element 110, which is, for example, connected to a contact area or a so-called bond pad 320, respectively, via a conductive metallic conductive trace 310. On the bond pad 320, an electrically conductive wire bridge, a so-called bond wire 330 is applied, enabling an electrically conductive connection to a further contact area or a further bond pad 340, respectively, of the evaluation circuit 200. For this purpose, the bond wire 330 is also connected to the further bond pad 340 of the evaluation circuit 200. The bond pad 340 is separated from the layers of the integrated circuit below by an insulating layer 350, wherein the further bond pad 340 is connected to the elements of the evaluation circuit 200 below via a vertical metallic connection, a so-called via. The via 360 here connects the bond pad 340 to a metallization layer 370 or a metal structure 370, respectively, via which the structures and objects lying farther below in the evaluation circuit may, for example, be electrically contacted. In their plane, the metal structures 370 abut on a filling material 380 for leveling the layer packet, wherein the filling material 380 may, for example, also include an insulating material.

Via a further via 390, which is embedded into a further insulating layer 400, the metal structure 370 is electrically connected to a functional semiconductor area, which for example includes the actually integrated circuits of the evaluation circuit 200 and may, for example, be implemented in CMOS technology. Thus, for example, the actual circuitries of the evaluation circuit 200, if applicable with an analog/digital converter (ADC), may be integrated in the functional semiconductor area 410 or the CMOS area 410, respectively. The functional semiconductor area 410 is in addition to that applied to a further carrier 420 of the evaluation circuit 200.

FIG. 14a thus shows an embodiment of a magnetic field sensor device 100 which is implemented in discrete design and to which, via the bond wire 330, the evaluation circuit 200 is electrically connected, which is in turn realized as a discrete device in the form of an integrated circuit.

In contrast to this, FIG. 14b shows an embodiment of a magnetic field sensor device 100 in the form of an integrated magneto-resistive sensor having a magneto-resistive sensor element 110. The magneto-resistive sensor element 110 is here directly applied to an insulating layer 350 and electrically connected through a via 360 included in the insulating layer 350. Below the insulating layer 350, for a further contacting and, if applicable, to fulfil further tasks, for example within the scope of manufacturing, a metal structure 370 is arranged together with a corresponding filling material 380. The metal structure 370 is further electrically connected to a functional semiconductor area 410 below the further insulating layer 400 via a further via 390 included in a further insulating layer 400. The functional semiconductor area 410 is further arranged on a carrier 420, for example a semiconductor substrate, a further integrated circuit or also on another substrate.

The embodiment of a magnetic field sensor device illustrated in FIG. 14b in the form of an integrated magneto-resistive sensor is thus different from the embodiment of a magnetic field sensor device illustrated in FIG. 14a in a discrete design, due to the fact that the magneto-resistive sensor elements 110 are integrated on a chip together with the evaluation circuit and are for example arranged above the evaluation circuit 200, which is for example included in the functional semiconductor area 410. Instead of a discrete solution, in which a magnetic field sensor device is, for example, connected to the evaluation circuit 200 with the help of one or several bond wires 330, it is also possible to exchange the bond pads shown in FIG. 14a at least partially with magneto-resistive sensor elements 110 and to connect the same to the further circuit elements with the help of vias 360.

In the embodiment of a magnetic field sensor device 100 shown in FIG. 14b, like in the embodiment shown in FIG. 14a, the actual circuit or the actual circuitries, respectively, of the evaluation circuit are included in the functional semiconductor area 410 or in the CMOS area 410, respectively, in the form of integrated circuits. In addition that, the functional semiconductor area 410 may, if applicable, include further components, like analog/digital converters, resistance elements, Hall sensors and/or other elements or sensor elements, respectively, from circuit technology. In the embodiment of a magnetic field sensor device 100 shown in FIG. 14b, for example the switch, which is connected to the at least two magneto-resistive sensor elements 110 and makes at least one magneto-resistive sensor element of the at least two magneto-resistive sensor elements in a magnetic field detection arrangement electrically connectable, may also be included in the functional semiconductor area 410.

In one embodiment of an integrated magneto-resistive sensor 100, as it is illustrated in FIG. 14b, a Hall sensor may also be integrated in the functional semiconductor area 410, which enables a detection of a magnetic field component perpendicular to a surface of the integrated magneto-resistive sensor 100. If the integrated magneto-resistive sensor 100 includes a magneto-resistive sensor arrangement for determining a direction of the external magnetic field in an angle range of 360°, such an integrated magneto-resistive sensor 100 can make it possible to determine a direction of the external magnetic field in all directions of space. This is in particular possible as many magneto-resistive sensor elements are sensitive with regard to a magnetic field direction which is parallel to the surface of the integrated magneto-resistive sensor 100.

In other words, in the embodiment illustrated in FIG. 14b, an integrated circuit is integrated in the CMOS area 410, which for example includes the evaluation circuit or its circuitries, respectively, one or several analog/digital converters, the switch and other elements from circuit and/or measurement technology. insulating layer or an insulation layer 350, respectively, is applied to this circuit, on which the magneto-resistive sensor elements 110, i.e. for example the GMR structures, are applied or arranged, respectively, for example in a planar way of manufacturing. The GMR structures or GMR sensors or magneto-resistive sensor elements 110, respectively, are connected via one or several vias 360 through the insulation layer 350 to the evaluation circuit in the functional semiconductor area 410. A direct comparison of the embodiments of a magnetic field sensor device 100 illustrated in FIGS. 14a and 14b shows a great advantage of an embodiment of a magnetic field sensor device 100 in integrated circuit technology. In the embodiment illustrated in FIG. 14a, due to the discrete nature of the magnetic field sensor device 100 and the evaluation circuit 200 in the embodiment illustrated there, space requirements or area requirements, respectively, of a later combination of a magnetic field sensor device 100 and the evaluation circuit 200 are significantly higher as compared to the integrated solution 100 illustrated in FIG. 14b. This problem is aggravated in particular due to the fact that the evaluation circuit frequently has a substantially higher space or area requirement, respectively, than one individual or several magneto-resistive sensor elements 100.

In other words, in the embodiment illustrated in FIG. 14b the great advantage results that, due to the vertical setup of the integrated circuit 410 and the magneto-resistive sensor elements 110 on the insulating layer 350 a lot of room is available for magneto-resistive sensor elements 110, for example in the form of magneto-resistive sensor element fields, without the final requirements for space or area, respectively, of the complete sensor getting higher.

In addition to that, in the embodiments illustrated in FIGS. 14a and 14b, additional layers may be integrated into or applied onto the corresponding layer stacks of the evaluation circuit 200 and/or the magnetic field sensor device 100 or the integrated magneto-resistive sensor element illustrated in FIG. 14b, respectively, or applied to the same. The same include additional insulation layers, cover layers, further metallization layers and mechanical protection layers, wherein in particular the latter ones may offer a protection of the magneto-resistive sensor elements 110, the conductive traces 310 and other structures from chemical or mechanical stress, for example oxidation.

The evaluation circuits integrated into the functional semiconductor areas 410, but also the evaluation circuit 200 explained in the above embodiments, may, for example, be implemented in the form of analog circuits, digital circuits or hybrid circuits, which include both analog and digital components. In the case of a purely analog circuit, the evaluation circuit may for example include amplifier elements in the form of transistors or operational amplifiers. Accordingly, in the case of magnetic field detection arrangements in the form of bridge circuits, analog differential amplifiers, for example on the basis of operational amplifier circuits, may be used. In the case of digital evaluation circuits the same may include one or several analog/digital converters to enable a conversion of analog signals of the magneto-resistive sensor elements or of the magnetic field detection arrangement, respectively, into signals to be processed digitally. In addition to that, corresponding digital circuits may further include processors, memories, memory circuits, communication circuits, control circuits and other digital signal processor circuits. Hybrid evaluation circuits including both analog and also digital circuit parts may include both the above-mentioned analog components and also the above-mentioned digital components. In addition to that, a compensation of the influence of environmental factors may be integrated into the evaluation circuit, for example to be able to compensate an influence of temperature, pressure or age of the sensor.

Before in the further course further embodiments of a magnetic field sensor device or integrated magneto-resistive sensors, respectively, are described, first of all a general setup and a general functioning of a GMR angle sensor or another magneto-resistive angle sensor is to be described briefly. Those specifications are explained in connection with the block diagram of a GMR angle sensor 500 shown in FIG. 15.

With the GMR angle sensor 500, on a silicon chip (Si chip) additionally magnetically sensitive layers are applied forming the magneto-resistive sensor element. In the case of a GMR element this is in the simple case a permanently magnetized layer (hard magnetic layer or a synthetic antiferromagnet), a separation layer serving as a changeable resistance and a soft magnetic layer following the direction of an external magnet or an external magnetic field, respectively. Illustrated in a slightly more simplified way, those layers form the one or several GMR elements in a (spatially limited) structure. The resistance of the separation layer here depends on a directional relationship of the magnetization of the permanently magnetized layer and the softly magnetized layer which frequently form the exterior layers of a corresponding GMR element. If, like it was already explained in the embodiments above, corresponding GMR elements or layer stacks, respectively, are arranged accordingly, the same may be connected within a bridge circuit, like, for example, a Wheatstone bridge circuit. A differential voltage at the center taps of the bridge circuits then depends on the direction of the external magnetic field. With a single bridge circuit or full bridge circuit, respectively, an angle range of 180° may thus be uniquely associated, like it was also explained in the case of the hitherto explained embodiments in FIGS. 7, 8, 9a, 9b, 10, 11 and 12. If now two bridge circuits or full bridge circuits, respectively, offset to each other by 90°, are combined with each other, then with the help of an arctan calculation the complete angle range of 360° may definitely be covered to obtain a direction of an external magnetic field (in a plane).

Figure 15:
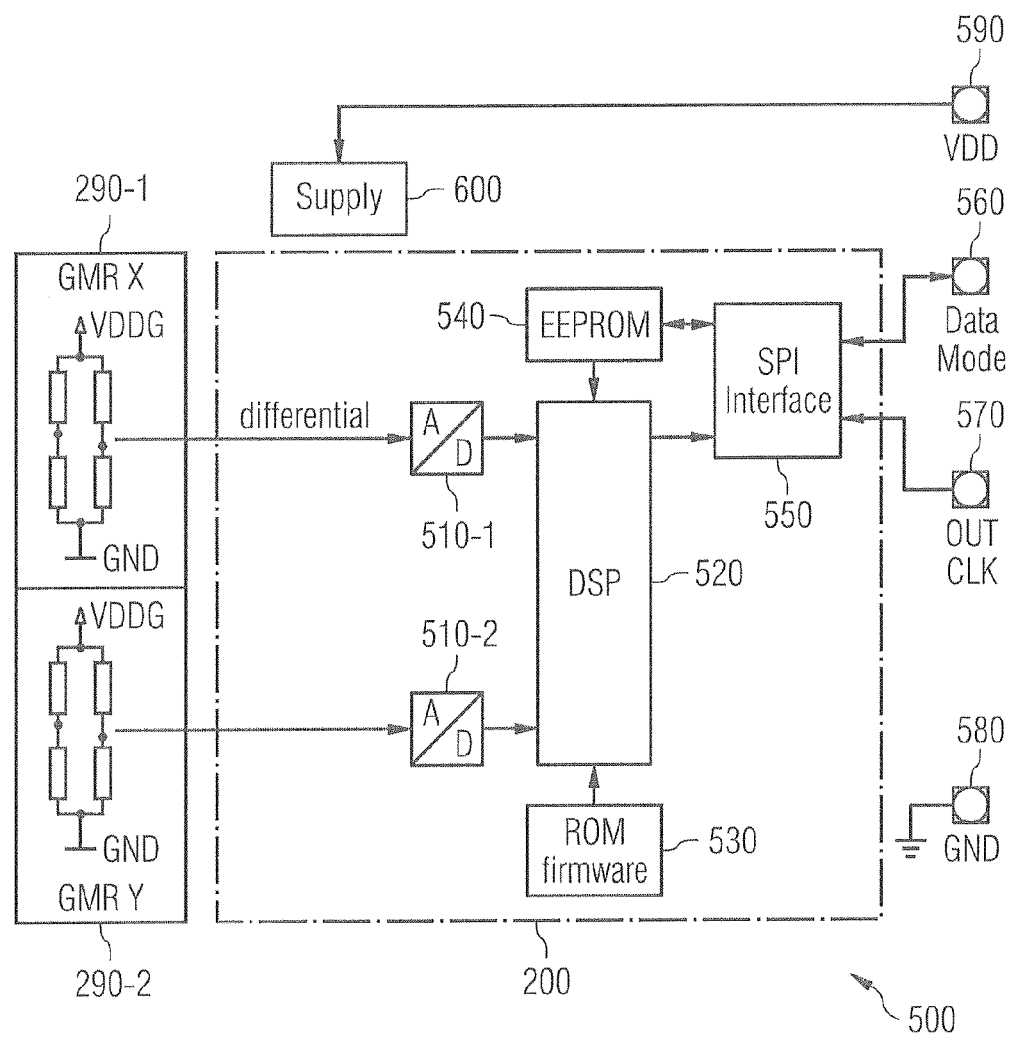
FIG. 15 shows a circuit diagram of an angle sensor for an angle range of 360°.

FIG. 15 shows a corresponding implementation of a 360° angle sensor 500. The angle sensor 500 comprises a first full bridge circuit 290-1 and a second full bridge circuit 290-2, wherein the first full bridge circuit 290-1 is sensitive with regard to a first component of an external magnetic field (x component), and wherein the second full bridge circuit 290-2 is sensitive with regard to a second component of the external magnetic field (y component). The two components are here essentially perpendicular to each other. The two full bridge circuits 290-1, 290-2 are respectively connected to an evaluation circuit 200 by the center taps. The evaluation circuit 200 here includes a first analog/digital converter 510-1 which is coupled to the center taps of the first full bridge circuit 290-1, and a second analog/digital converter 510-2 which is coupled to the second full bridge circuit 290-2 with the center taps.

The two analog/digital converters 510-1, 510-2 here differentially process the sensor signals received via the center taps of the two full bridge circuits 290-1, 290-2, which may, for example, be realized by the fact that the two analog/digital converters 510 each include an individual converter stage for the two center taps each of one of the two full bridge circuits 290, so that those signals of the two center taps of a full bridge circuit may first of all be converted independent of each other in order to be subsequently further digitally processed, for example within the scope of a differential formation, by the analog/digital converters 510. Alternatively, the analog/digital converters 510 may also comprise an additional analog input stage which subtracts the signals obtained from the center taps of the individual bridge circuits 290, for example with the help of an analog differential amplifier, from each other before the same are converted into a digital signal by a converter stage of the analog/digital converter 510.

The two analog/digital converters 510 are additionally connected to a digital signal processor (DSP) 520 which receives the signal of the analog/digital converters. At the digital signal processor 520, apart from that a read-only memory 530 (ROM) and a non-volatile memory 540 (EEPROM=electrically erasable programmable read-only memory) are connected. In this way, for example, in the read-only memory 530 a program for controlling or evaluating, respectively, for the digital signal processor 520 may be stored (firmware). In the non-volatile memory 540 device-specific parameters or other data, like, for example, serial numbers, type designations or version numbers, may be stored.

In addition to that, the evaluation circuit 200 includes a communication circuit 550 (SPI=serial peripheral interface) which is coupled to the non-volatile memory 540 via a bi-directional bus and to the digital signal processor 520 via a mono-directional bus. The digital signal processor 520 may thus, for example, output an evaluation signal via the mono-directional bus to an input/output terminal 560 (data mode) of the angle sensor 500 which is connected to the communication circuit 550 via a further bi-directional bus. The communication interface 550 is further coupled to a clock signal input 570, via which the communication circuit 550 receives a clock signal (OUT CLK). Further, the angle sensor 500 comprises a ground terminal 580 to which a reference potential (GND) may be applied. Via a supply voltage terminal 590 a (positive) supply voltage $V_{DD}$ may be provided to the angle sensor 500, wherein the supply voltage terminal 590 is connected to a supply voltage circuit 600 of the angle sensor 500. The supply circuit 600 thus, for example, provides supply voltages $V_{DDG}$ to the full bridge circuits 290-1, 290-2 via a connection which is not illustrated in FIG. 15.

Figure 16:
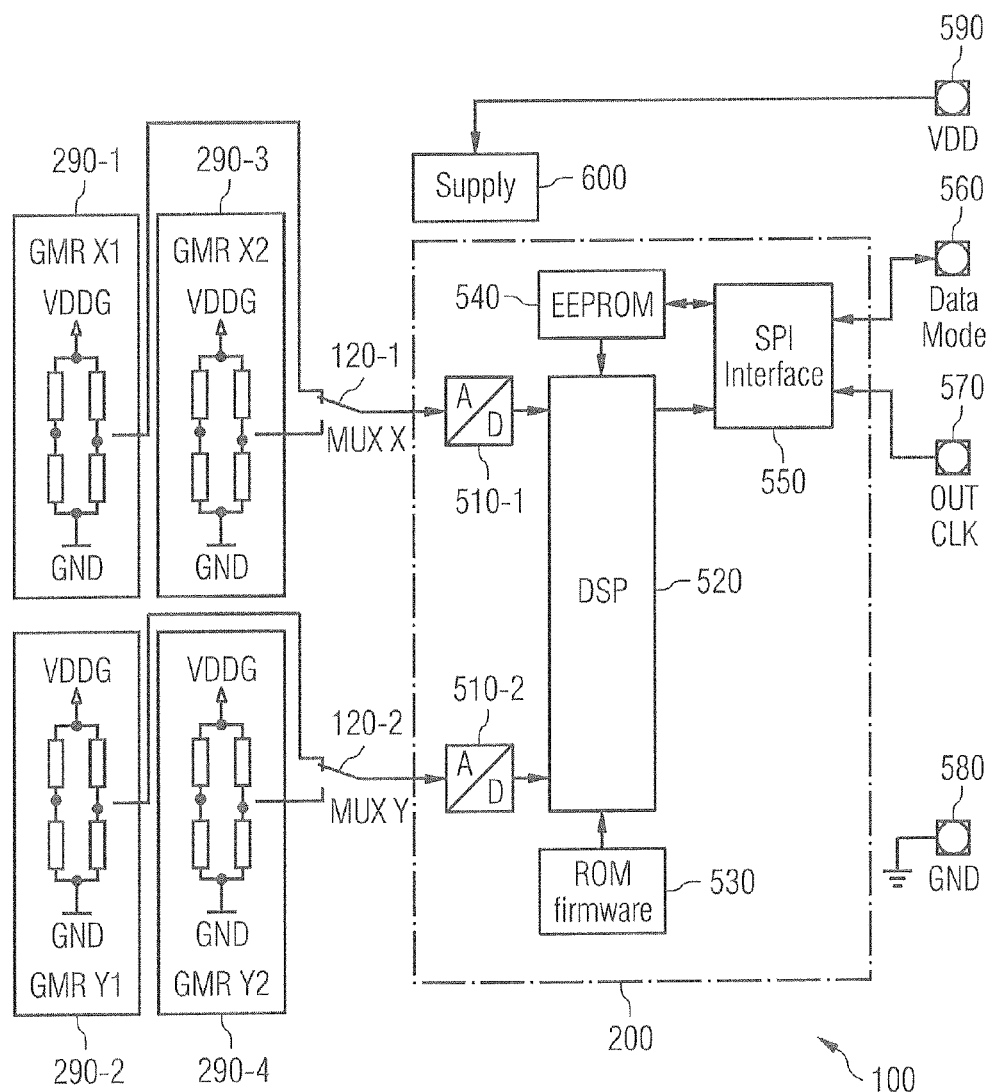
FIG. 16 shows a circuit diagram of a magnetic field sensor device according to a further embodiment in the form of an angle sensor for an angle range of 360° respectively having two full bridge circuits for an X magnetic field detection and a Y magnetic field detection.

FIG. 16 shows a further embodiment of a magnetic field sensor device 100 in the form of an angle sensor with an angle range of 360°. The embodiment illustrated in FIG. 16 in particular illustrates an integrated magneto-resistive sensor, wherein the magneto-resistive sensor elements are implemented as GMR elements. The structure of the embodiment illustrated in FIG. 16 of the magnetic field sensor device 100 is very similar to the angle sensor illustrated in FIG. 15, which is why at this point reference is made to those parts of the description which refer to the angle sensor illustrated in FIG. 15. In the embodiment of a magnetic field sensor device 100 illustrated in FIG. 16 the magneto-resistive sensor elements are also implemented as GMR elements. In this context, however, it is to be noted that also other magneto-resistive sensor elements may be used instead of the GMR elements shown in FIG. 16.

The embodiment of a magnetic field sensor device 100 illustrated in FIG. 16 is different from the angle sensor 500 shown in FIG. 15 essentially due to the fact that the magnetic field sensor device 100 includes a third full bridge circuit 290-3 and a fourth full bridge circuit 290-4, wherein the third full bridge circuit 290-3 just like the first full bridge circuit 290-1 is sensitive with regard to an x component of the external magnetic field. The fourth full bridge circuit 290-4 of the magnetic field sensor device 100 shown in FIG. 16 just like the second full bridge circuit 290-2 is sensitive with regard to a y component of the external magnetic field.

In addition to that, the embodiment of a magnetic field sensor device 100 illustrated in FIG. 16 comprises a first switch 120-1 and a second switch 120-2 which are coupled to the analog/digital converters 510-1, 510-2 on the one hand and to the full bridge circuits 290 on the other hand, via their center taps. Here, the two full bridge circuits 290-1 and 290-3 are connected to the switch 120-1 and the two full bridge circuits 290-2 and 290-4 are connected to the switch 120-2. The two switches 120-1, 120-2 are implemented as multiplexers here, which is why the switch 120-1 is designated as a multiplexer for the x component of the external magnetic field (MUX X) and the second switch 120-2 is designated as a multiplexer for the y component of the external magnetic field (MUX Y). FIG. 16 thus shows a block diagram of an embodiment of a magnetic field sensor device 100 having two bridge pairs. The embodiment illustrated in FIG. 16 is thus designated as a multi-bridge GMR sensor in the case of GMR sensor elements as magneto-resistive sensor elements.

The digital signal processor 520 may here be connected to the two multiplexers 120-1, 120-2 via a connection which is not illustrated in FIG. 16. In this case, the digital signal processor 520 illustrates a control circuit for the two switches 120-1, 120-2 of the embodiment illustrated in FIG. 16.

Figure 17A:
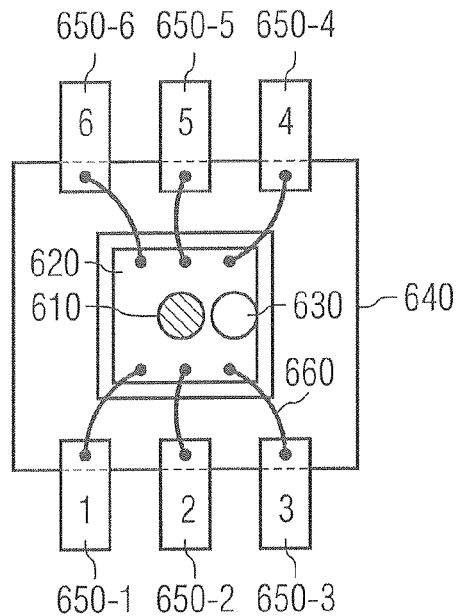
FIG. 17a schematically shows a magnetic field sensor device according to a further embodiment in the form of a single discrete chip.

FIG. 17a shows a diagram of an integrated GMR package having selectable bridges as an embodiment of a magnetic field sensor device. The GMR angle sensor illustrated in FIG. 17a is here set up such that one full GMR measurement bridge pair each is arranged in a central area 610 in the middle of the chip 620 on which the embodiment of the magnetic field sensor device is integrated, and a further GMR angle measurement bridge pair is arranged in an edge area 630 at the edge of the chip 620. In FIG. 17a, one bridge pair each or the associated area, respectively, i.e. the central area 610 and the edge area 630, is illustrated as a circle.

In particular, FIG. 17a here shows a single-chip 620 with a sensitive area in the central area 610 in the center of the chip 620. The integrated angle sensor illustrated in FIG. 17a in GMR technology is already indicated as bonded and mounted in a housing 640. The housing 640, in the embodiment illustrated in FIG. 17a, includes six terminals 650-1 to 650-6 which are connected to the chip 620 or the integrated circuits of the chip, respectively, via bond wires 660. When mounting the single chip 620 illustrated in FIG. 17a into the housing 640 it may be selected by a selector switch or a switch, respectively, not illustrated in FIG. 17a, which bridge pair or pair of full bridge circuits, respectively, is currently to be used or applied, respectively, for measuring an external magnetic field.

Figure 17B:
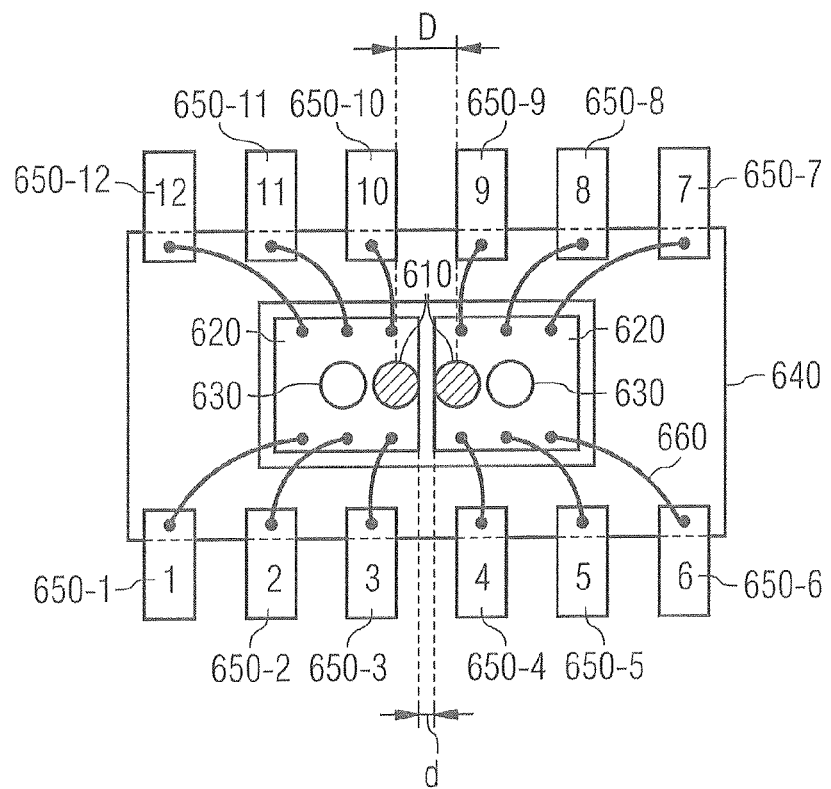
FIG. 17b schematically shows a magnetic field sensor device according to a further embodiment with two discrete chips.

FIG. 17b shows a further magnetic field sensor with a double chip or two chips 620, respectively, as it was already used in the embodiment shown in FIG. 17a. Also for the angle sensor illustrated in FIG. 17b, the two chips 620 each comprise a central area 610 and an edge area 630, respectively including a pair of two full bridge circuits for measuring an external magnetic field in an angle range of 360°. In contrast to the single chip illustrated in FIG. 17a, the double chip illustrated in FIG. 17b comprises a housing 640 having twelve terminals 650-1 to 650-12, however. The twelve terminals 650-1 to 650-12 are each electrically connected to the two chips 620 via bond wires 660. Here, the chip 620 illustrated in FIG. 17a and the chips 620 illustrated in FIG. 17b are essentially identical.

In other words, the same or essentially identical chip 620, respectively, may be fitted or inserted, respectively, in double, respectively rotated by 180°, into a housing 640. It may thus be used as a redundant angle sensor having two independent circuit parts including the respective sensors. By a selection of the respective exterior measurement bridges in the edge areas 630 of the two chips 620, i.e. the measurement bridges or full bridge circuits, respectively, at the edge of the chip, by a corresponding actuation or change, respectively, of the switches of the magnetic field sensor devices, in the double chip illustrated in FIG. 17b a distance as small as possible to a magnetic center point of a finished assembly including the double chip may be achieved regarding the magnetically effective measurement points. If this way, for example, for the double chip illustrated in FIG. 17b, wherein the respective sensitive area in the edge area 630 was activated, a distance d of the two chips 620 to each other of, for example, $d=(0.2\pm 0.1)$ mm may be achieved, in the selection of the measurement bridge pairs in the respective edge area 630 of the two chips 620 a distance D of the magnetically effective measurement points or the sensitive areas, respectively, in the respective edge area 630 of the two chips of approximately 2 mm or less results. In this embodiment the advantage results that only one magnet has to be rotated or turned over the two bridges in the two edge areas 630 of the two chips 620. This brings substantial savings and also a significant mechanical easing compared, for example, to an approach in which the two magnets were to rotate synchronously.

In other words, the embodiments illustrated in FIGS. 17a and 17b describe an integrated GMR sensor chip which may be mounted or integrated in a housing 640 both as a single chip 620 and also as a (redundant) double chip. Here, by a suitable selection of one of the bridges or the corresponding areas 610, 630, respectively, of the chip 620 or the chips 620, the magnetic center (magnetically effective measurement point) may be placed into an area in the center of a packet which may in the further course, for example, be inserted into a more complex assembly. Thus, only one single chip 620 has to be designed and produced and may be flexibly inserted or mounted into two variants. In addition to that, from the sensor setup present twice in a chip 620 the further advantage results that the respectively other measurement bridge may, for example, be used as an additional, redundant measurement bridge.

Regarding the embodiments illustrated in FIGS. 17a and 17b it is thus to be noted, that in this case only one single chip 620 has to be developed and only one single mask set has to be produced for manufacturing. This is possible, as the manufacturing with several measurement bridges in principle requires no additional overhead, as a production of several measurement bridges may take place in parallel in a thin-film process or another manufacturing process. Only in the case of a magnetic write-in may it be decided whether all bridges or only selected bridges or bridge circuits or half bridge circuits or full bridge circuits, respectively, are written to or conditioned. In addition to that there is the possibility of basically manufacturing both bridges or bridge pairs, respectively, fully on the chip 620 and only select the corresponding measurement bridge via a selector switch after mounting into the housing 640. If thus, in one multi-bridge GMR sensor illustrated in FIGS. 17a and 17b, both measurement bridges are fully set up for each chip 620, the respective other measurement bridge, which is not used for the actual measurement, may be used for comparative measurements. An accuracy of the measurement bridges lying outside an area around the magnetic center of the later assembly is not as high as with the centrally arranged measurement bridge, it may well be used for plausibility measurements, however, which significantly increases the reliability of the overall sensor or the sensor package, respectively.

By a corresponding selection of the measurement bridges or the corresponding areas 610, 630 of the chip 620, respectively, the magnetically sensitive center or the magnetically effective measurement point, respectively, of the measurement bridges may be put into the area of the center of the completed sensor package. Apart from the already mentioned advantages of the embodiment described in FIGS. 17a and 17b that only one chip has to be developed and only one mask set has to be generated for manufacturing or production, and that up to the mounting in a housing 640 a uniform chip 620 may be produced, thus the further advantage results that for increasing the security both bridges of a chip may be read out alternately. The result of the bridge not placed in the center is in this case not as accurate, is generally sufficient, however, to check the plausibility of the actual or "right" measurement of the external magnetic field. The embodiment described in FIG. 17 thus enables a mounting tolerance or tolerance, respectively, regarding the magnetically effective measurement point of less than $\pm 5000$ μm=$\pm 5$ mm. Depending on the implementation of the chip 620, in addition to that also a mounting tolerance may be achieved which is smaller or better than $\pm 500$ μm=$\pm 0.5$ mm.

Even if in the description of the multi-bridge GMR sensor illustrated in FIGS. 17a and 17b GMR elements were implicitly or explicitly used as magneto-resistive sensor elements, the chips 620 described in connection with FIGS. 17a and 17b are not limited to GMR elements. Rather, any magneto-resistive sensor elements may be used as they were explained in the introducing sections of the present application.

In FIGS. 18, 19 and 20a-20c further embodiments of a magnetic field sensor device are described in the form of GMR angle sensors. Also for those embodiments it is to be noted for this reason that, even if the embodiments are explained with reference to GMR elements, the same may be replaced by other magneto-resistive sensor elements.

As explained above, with GMR angle sensors with an angle range of 360° for measuring a magnetic field for determining the angle with regard to a preferred direction, for example with regard to a chip axis or a device axis, the x component and the y component of the respective magnetic field are measured. A substantial precondition for an exact and precise measurement of the angle in this case is the homogeneity of the magnetic field in the total area of the geometrical expansion of the sensors or the sensor, as otherwise measurement artefacts and uncertainties may result described in connection with FIG. 2. In order to guarantee this, an adjustment as exact as possible of the sensor below a rotation axis of the magnet whose angular position is to be determined is required within the total assembly. The embodiments described in FIGS. 18-20 enable to facilitate a compensation of mounting tolerances by a programmable configuration of the sensor package after the mounting below the respective magnet in the assembly has taken place.

Figure 18:
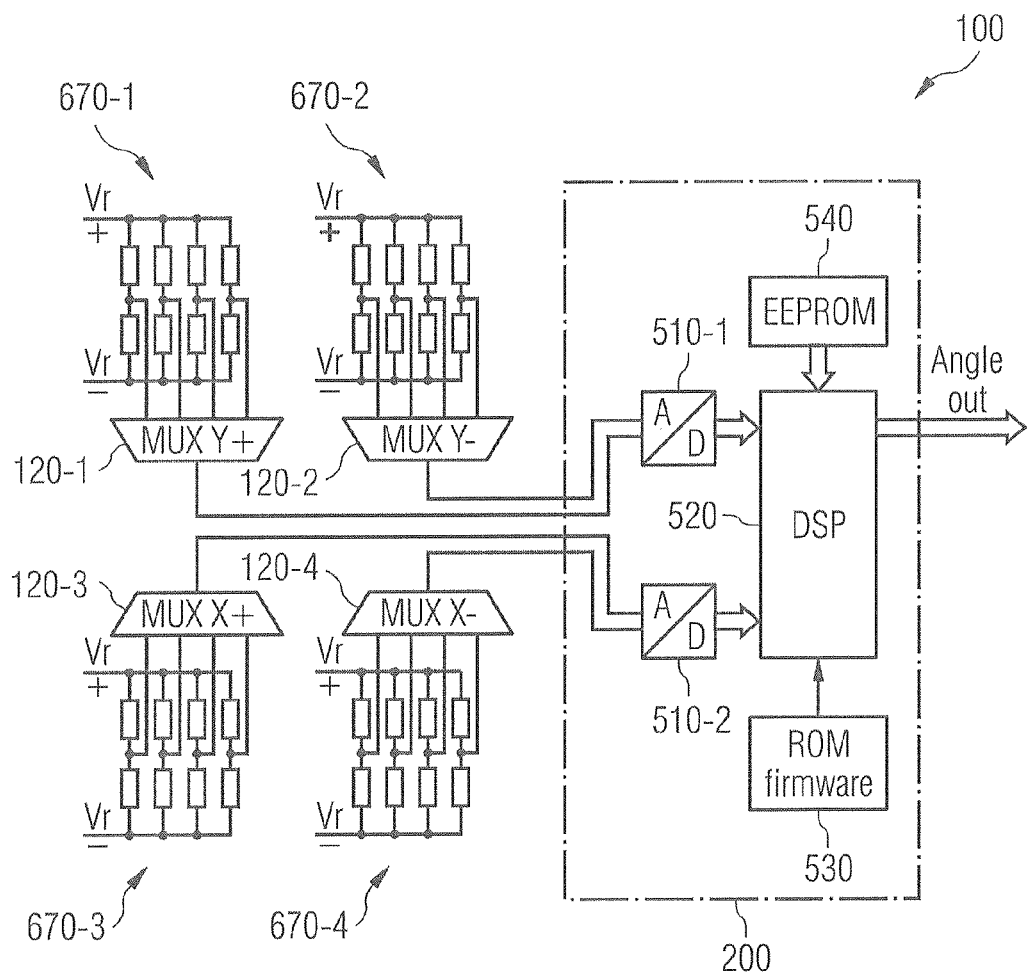
FIG. 18 shows a block diagram of a magnetic field sensor device according to a further embodiment for an angle sensor having a range of 360° and a plurality of half bridges.
Figure 19:
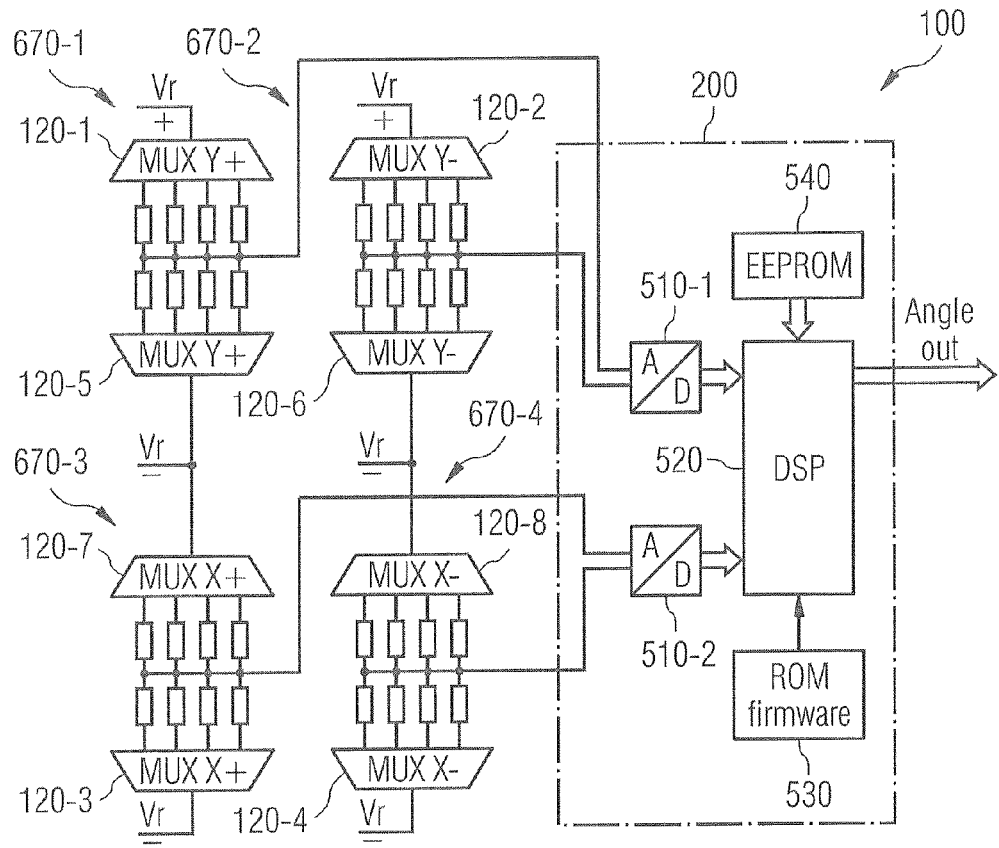
FIG. 19 shows a schematical block diagram of a magnetic field sensor device according to a further embodiment in the form of an angle sensor for a range of 360° with a plurality of half bridge circuits capable of being connected to form a full bridge circuit.

For this purpose, the embodiments described in FIGS. 18-20 and illustrated in the corresponding sections of the description of a magnetic field sensor device comprise several sensor bridges on the same chip which are arranged such that their magnetically effective measurement points are offset against each other. Here, the resulting magnetically effective measurement points are essentially given by intersections of (imaginary) connection lines or axes, respectively, of the individual magneto-resistive sensor elements among each other, as it was explained in more detail with reference to FIG. 8.

As explained above, this is possible with magneto-resistive sensor elements, in particular GMR sensor, without a substantial chip area overhead, as in the case of integrated magneto-resistive sensors the magneto-resistive sensor elements are located or arranged above the electronics or the functional semiconductor area. In other words, due to the fact that in the case of an integrated magneto-resistive sensor several sensors are provided on the same chip and that the same are arranged above the integrated circuit, only unused area is occupied on the chip as compared to the known realization. By a selection of the bridge circuit positioned best in the magnetic field, via a switch or a multiplexer, thus a configuration may be selected as an effective magnetic field detection arrangement, which enables a most precise or optimum detection of an external magnetic field. This optional magnetic field detection arrangement is thus selected via the one or several multiplexers as the configuration having the least errors.

FIG. 18 thus shows a further embodiment of a magnetic field sensor device 100 having an evaluation circuit 200. The evaluation circuit 200 here includes a first analog/digital converter 510-1 and a second analog/digital converter 510-2 which are both coupled to a digital signal processor 520. As in the embodiment of a magnetic field sensor device 100 illustrated in FIG. 16, a read-only memory 530 (ROM) and a non-volatile memory 540 (EEPROM=electrically erasable programmable read-only memory) are coupled to the digital signal processor 520. The read-only memory 530 may, for example, comprise a program (firmware) for the digital signal processor 520 for controlling the magnetic field sensor device 100 and for a data detection and utilization. The digital signal processor 520 here further includes a control circuit for the switches 120-1 to 120-4, explained in more detail below. In the non-volatile memory 540, for example for the operation of the magnetic field sensor device 100, necessary parameters and identification features may be stored. The digital signal processor 520 additionally comprises a terminal at which an evaluation signal may be output, for example an evaluation signal (angle out) indicating the angle of the external magnetic field with regard to the preferred direction of the magnetic field sensor device 100.

In addition to that, the embodiment of a magnetic field sensor device 100 illustrated in FIG. 18 comprises four fields of half bridge circuits 670-1 to 670-4, wherein each half bridge circuit of the four fields of half bridge circuits 670-1 to 670-4 includes a series connection of at least one magneto-resistive sensor element with a further resistance element, wherein the further resistance element may also include a magneto-resistive sensor element. Typically, here, each half bridge circuit of the fields of half bridge circuits 670 includes a series connection of two magneto-resistive sensor elements, wherein the magneto-resistive sensor elements of a half bridge circuit typically have an essentially opposite characteristic magnetic field direction. In the embodiment illustrated in FIG. 18, here, a positive supply voltage Vr+ and a negative supply voltage Vr− is connected to each half bridge circuit of the fields of half bridge circuits 670-1 to 670-4. In addition to that, in the embodiment illustrated in FIG. 18, all center taps of the half bridge circuits of a field of half bridge circuits 670-1 to 670-4 are connected to an above-mentioned multiplexer or switch 120-1 to 120-4. The four multiplexers 120-1 to 120-4 are connected to the two analog/digital converters 510-1 and 510-2 of the evaluation circuit 200. In particular, the multiplexer 120-1 of the field of half bridge circuits 670-1 and the multiplexer 120-2 of the field of half bridge circuits 670-2 are connected to the analog/digital converter 510-1. Analog to that, the multiplexer 120-3 of the field of half bridge circuits 170-3 and the multiplexer 120-4 of the field of half bridge circuits 170-4 are coupled to the analog/digital converter 510-2.

The fields of half bridge circuits 670-1 to 670-4 here comprise orientations of the magneto-resistive sensor elements included within the same, explained in more detail by the designations of the multiplexers 120-1 to 120-4. Thus, the magneto-resistive sensor elements of the half bridge circuits of the field of half bridge circuits 670-1 comprise characteristic magnetic field directions, so that at the center taps of the half bridge circuits a (voltage) signal is applied, which assumes a maximum positive value in the case of an orientation of the external magnetic field along a positive y axis. For this reason, in FIG. 18 the multiplexer 120-1 has the designation MUX Y+. Accordingly, the magneto-resistive sensor elements of the field of half bridge circuits 670-2 are conditioned such or comprise corresponding characteristic magnetic field directions, respectively, that at the center taps a maximum positive (voltage) signal is applied, if the external magnetic field is aligned along the negative y axis. Analog to that, the magneto-resistive sensor elements of the field 670-3 are conditioned such that at the center taps of the half bridge circuits a maximum (voltage) signal is applied, in the case of an orientation of the external magnetic field along a positive x direction. Accordingly, the magneto-resistive sensor elements of the field 670-4 are conditioned with regard to a negative x direction. Here, the indications of direction positive or negative x direction and positive or negative y direction refer to a preferred direction of the embodiment of the magnetic field sensor device 100 of FIG. 18.

The signal path of the sensor or the embodiment of a magnetic field sensor device 100 illustrated in FIG. 18, respectively, essentially corresponds to that of an angle sensor or a sensor without the additional calibration possibility, respectively, like it is for example illustrated in FIG. 15. The signals of the sensors or the magneto-resistive sensor elements of the half bridge circuits are converted into digital signals for the x direction and the y direction with the help of the two analog/digital converters 510 and further processed by the digital signal processor 520 to an output signal indicating an output angle. The signal path illustrated in FIG. 18 is here only illustrated as an example and may be implemented in a modified way in further embodiments. Thus, for example, apart from the already discussed variations of the analog/digital converters 510 in connection with the embodiments in FIGS. 15, 16, 17a and 17b, also only one single analog/digital converter 510 may be used which is accordingly switched or multiplexed to and fro by a corresponding connection of the multiplexers 120-1 to 120-4 between the half bridge circuits for the x component and the y component.

The embodiment illustrated in FIG. 18 shows the possibility of combining different sensor half bridge circuits arranged in different locations of a field of half bridge circuits 670 or several fields of half bridge circuits, to form one full bridge circuit, wherein by the variation of the combinations of bridge circuits to one magnetic field detection arrangement different effective full bridge circuits are generated taking different spatial positions with different magnetically effective measurement points on the chip. This is possible in the embodiment illustrated in FIG. 18 both for the x signal path (field of sensor half bridge circuits 670-3 and 670-4), and also for the y signal path (field of sensor half bridge circuits 670-1 and 670-2). A concrete example for a possible arrangement of the magneto-resistive sensor elements or the bridge elements on a chip is explained later in connection with FIG. 20.

A selection of the magneto-resistive sensor elements or the half bridge circuits from the fields of half bridge circuits 670 may take place after the final mounting of the sensor or the sensor device into the completed assembly with the magnet. Here, the position of the magnetically effective measurement point may be varied by a reconfiguration of the multiplexers 120 to select an optimum variant as an effective magnetic field detection arrangement based on a selection criterion. In other words, the "position of the bridges", i.e. the spatial arrangement of an effective magnetic field detection arrangement on the chip, may be varied with the help of the multiplexers 120 and the optimum variants may be selected.

Here, the selection of an optimum magnetic field detection arrangement may take place, for example, based on the selection criterion of an average signal which is as small as possible regarding its absolute value in the case of averaging across a complete 360° rotation of the external magnetic field. Alternatively or additionally, as a selection criterion further a signal which is as large as possible regarding its absolute value may be used. A further possibility for a selection criterion is thus also a signal of the different full bridge circuits which is as small as possible regarding its absolute value, if the magnet of the completed assembly is, for example, removed or the external magnetic field is switched off.

The determined optimum magnetic field detection arrangement or the best possible configuration, respectively, may then, for example, be deposited in the non-volatile memory or the EEPROM 540. Alternatively or additionally, such a determination of the optimum magnetic field detection arrangement or the best possible configuration may also take place in a turn-on process or a start-up, respectively, of the digital signal processor 520 or another microcontroller. In the latter cases, the digital signal processor 520 then for example executes, as a control program, an embodiment of a method for measuring a magnetic field, so that finally the digital signal processor 520 or another microcontroller selects the optimum magnetic field detection arrangement.

In addition to that there is the possibility of utilizing the redundancy accompanying the arrangement of the magneto-resistive sensor elements and to change individual configurations during the operation of the magnetic field sensor device 100, for example to check the plausibility of the individual measurements by comparative measurements. Depending on the concrete implementation of a magnetic field sensor device, thus, for example, tolerances regarding the location of the magnetically effective measurement points of the different magnetic field detection arrangements may be adjusted with an accuracy of ±5000 µm or better. If a larger number of magneto-resistive sensor elements is placed on a chip, also better mounting tolerances or accuracies, respectively, may be achieved. Typically, in this way also accuracies of ±1000 µm, ±500 µm or ±50 µm or better may be achieved.

FIG. 19 shows a further embodiment of a magnetic field sensor device 100 which is very similar to the embodiment indicated in FIG. 18. In contrast to the embodiment indicated in FIG. 18, the individual half bridge circuits of the fields of half bridge circuits 670-1 to 670-4 are connected to each other within one of the fields 670 via the center taps. Further, the center taps of the half bridge circuits of the fields 670 which are electrically connected to each other are directly connected to the analog/digital converters 510 of the evaluation circuit 200. In particular, in the embodiment illustrated in FIG. 19, the analog/digital converter 510-1 is connected to the center taps of the half bridge circuits of the field 670-1 and to the center taps of the half bridge circuits of the field 670-2. Accordingly, the analog/digital converter 510-2 is connected to the center taps of the half bridge circuits of the field 670-3 and to the center taps of the half bridge circuits of the field 670-4.

The embodiment illustrated in FIG. 19 additionally comprises eight multiplexers 120-1 to 120-8 which are respectively connected between the positive and negative supply voltage terminals of the individual half bridge circuits of the fields 670-1 to 670-4. In particular, the multiplexer 120-1 is connected between the terminal for the positive supply voltage Vr+ and the half bridge circuits of the field 670-1. Analog to that, the multiplexers 120-2 to 120-4 are respectively connected between the positive supply voltage terminals for the supply voltage Vr+ and the respective half bridge circuits of the fields 670-2 to 670-4. In addition to that, the multiplexer 120-5 is connected between the half bridge circuits of the field of half bridge circuits 670-1 and the terminal for the negative supply voltage Vr–. Analog to that, the multiplexers 120-6 to 120-8 are respectively connected between the half bridge circuits and the negative supply voltages Vr– of the fields of half bridge circuits 670-2 to 670-4.

The embodiment of a magnetic field sensor device 100 illustrated in FIG. 19 thus uses an alternative variant of the connection of the multiplexers 120-1 to 120-8 or an alternative variant of multiplexing, respectively. In this variant, not the bridge taps but the bridge supplies regarding their positive and negative supply voltages Vr+ and Vr– are connected via the multiplexers 120. This variant offers the advantage, compared to the variant of the embodiment illustrated in FIG. 18, that unused bridge branches or half bridge circuits, respectively, are not connected to the supply voltages or reference voltages, respectively, and thus require no current either.

In contrast to this, the circuit of the embodiment illustrated in FIG. 18 offers the advantage compared to the embodiment of FIG. 19 that voltage drops across switching elements in the multiplexers 120 may be prevented. By this, the danger of (measurement) errors due to an incorrect match between the bridge branches connected by the multiplexers 120 is prevented, which are also referred to as mismatch errors. Mismatch errors may thus, for example, lead to zero point offsets and gain errors, if the switches or the switching elements, respectively, in the multiplexers 120 are not implemented at a sufficiently low impedance or are not at a sufficiently low impedance any more, for example due to aging.

In addition to that, there is the possibility of combining the two multiplex variants shown in FIGS. 18 and 19 of the corresponding embodiments to configure the bridges not only by the selection of bridge branches but also by the selection of all four individual resistances or all four magneto-resistive sensor elements belonging to a full bridge circuit, respectively, whereby the spatial resolution or the accuracy, respectively, of the magnetic field sensor device regarding the positioning of the magnetically effective measurement point may be further increased.

A further variant results from the fact that not half bridges but full bridges may be connected via switches or multiplexers 120, respectively, in a magnetic field detection arrangement. This variant has the advantage that errors due to an insufficient compensation in the case of switching over (switch-over mismatch) may be prevented when switching currents, as both branches of a bridge, i.e. both half bridge circuits of a full bridge circuit, are always firmly connected to each other. This advantage is paid for, however, by the comparatively lowest spatial resolution or accuracy, or by the lowest freedom regarding the positioning of the magnetically effective measurement point. As already mentioned above, depending on the used multiplex variant, an accuracy of typically ±5000 µm or less, ±500 µm or ±50 µm or less may be achieved.

Figure 20A:
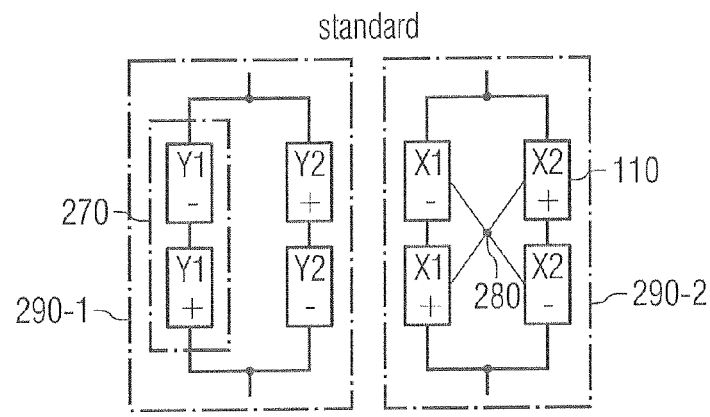
FIG. 20a shows an equivalent circuit diagram for the arrangement shown in FIGS. 20b and 20c of magneto-resistive sensor elements for a certain magnetic field detection arrangement.

FIG. 20a shows a standard combination of magneto-resistive sensor elements 110 of an angle sensor with an angle range of 360°. As in the embodiments above, here two magneto-resistive sensor elements 110 each are connected to form a half bridge circuit 270. Two half bridge circuits 270 connected in parallel form a full bridge circuit 290. The standard combination illustrated in FIG. 20a here comprises a first full bridge circuit 290-1 and a second full bridge circuit 290-2, wherein the full bridge circuit 290-1 is sensitive with regard to a y component of an external magnetic field and the full bridge circuit 290-2 with regard to an x component of an external magnetic field. Like in connection with the embodiment illustrated in FIG. 8, also in FIG. 20a accomplishing a magnetically effective measurement point 280 is schematically illustrated with reference to the second full bridge circuit 290-2. The magnetically effective measurement point 280 here essentially results as an intersection of two (imaginary) connection lines between two magneto-resistive sensor elements 110 each belonging to different half bridge circuits of the same full bridge circuit and comprising an essentially identical characteristic magnetic field direction.

Figure 20B:
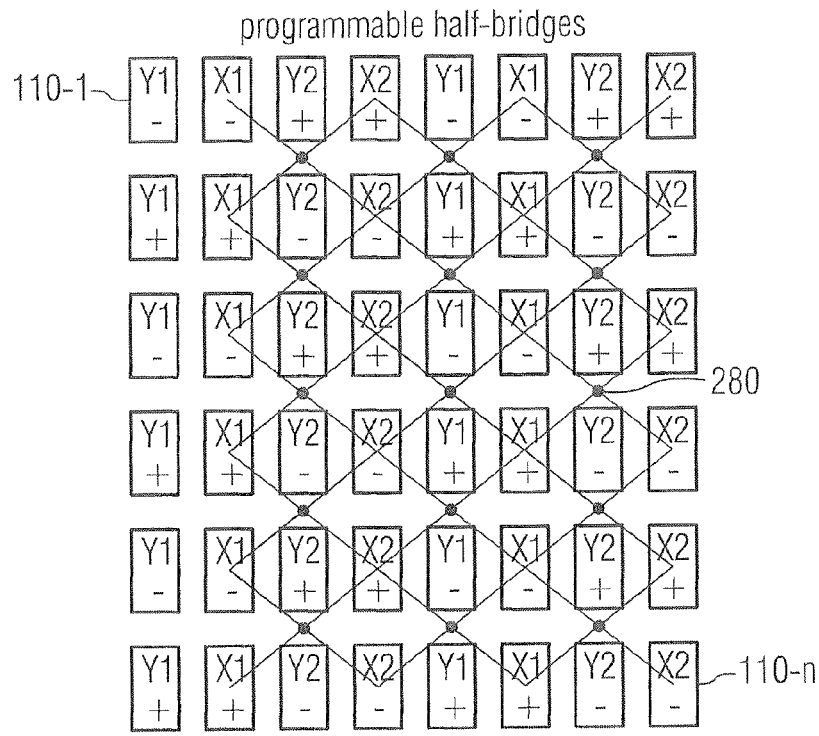
FIG. 20b schematically shows a first spatial arrangement of a plurality of magneto-resistive sensor elements for a magnetic field sensor device in the form of an angle sensor with a range of 360°.

FIG. 20b shows a first embodiment for a spatial arrangement of bridge elements or magneto-resistive sensor elements 110-1 to 110-n, respectively, which are arranged on a chip and electrically connectable into one or several magnetic field detection arrangements by one or several switches which are not indicated in FIG. 20b. In particular, FIG. 20b shows an embodiment for an arrangement of programmably selectable half bridge circuits of an embodiment of a magnetic field sensor device in the form of an angle sensor having an angle range of 360°. Analog to the explained proceeding with regard to the standard combination of bridge elements of an angle sensor for an angle range of 360° shown in FIG. 20a, in FIG. 20b for different bridge elements or magneto-resistive sensor elements 110, connections are plotted in the form of lines. Magnetically effective measurement points 280 result in the area of the intersections of those connection lines as far as the associated magneto-resistive sensor elements comprise corresponding characteristic magnetic field directions. In particular, FIG. 20b shows the possible combinations of geometrically differently arranged bridges for the x component of an external magnetic field. The magnetically effective measurement points regarding the y component of the external magnetic field result symmetrically in a corresponding manner.

In other words, the black dots 280 represent the magnetically effective measurement points and the center points of the respective full bridge circuit. Thus, they symbolize the centers of the programmable full bridge circuits or bridge locations. Basically it is possible, regarding both directions, i.e. the x direction and the y direction, to generate intermediate variants, for example by skipping rows of magneto-resistive sensor elements 110. These are not indicated in FIG. 20b for reasons of clarity, however.

Figure 20C:
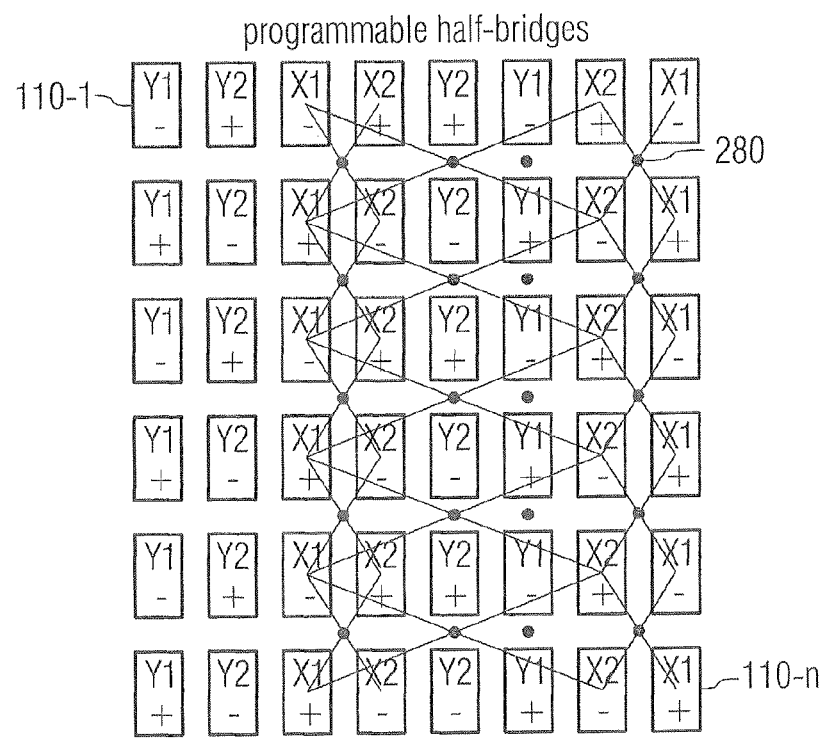
FIG. 20c shows a schematical illustration of a spatial arrangement of magneto-resistive sensor elements for a magnetic field sensor device in the form of an angle sensor with a range of 360°.

FIG. 20c shows an alternative arrangement of the magneto-resistive sensor elements 110-1 to 110-n together with some magnetically effective measurement points 280 resulting from the arrangement of the magneto-resistive sensor elements 110. Also here, further magnetically effective measurement points 280 may be obtained, for example, by skipping rows or columns accordingly.

Apart from the essentially right-angled arrangements of magneto-resistive sensor elements 110 on a chip or another carrier indicated in FIGS. 20b and 20c, basically also less regular arrangements, arrangements with varying distances of the magneto-resistive sensor elements, hexagonal arrangements, triangular arrangements, oval arrangements, circular arrangements, other geometrical patterns or a combination of several patterns of magneto-resistive sensor elements may be arranged on a chip or a carrier.

Especially the embodiments of magnetic field sensor devices described in FIGS. 16 to 20 enable performing a compensation of the mounting position by a customer of an embodiment within the scope of programming the corresponding multiplexer. All of those embodiments described in FIGS. 16 to 20 here show a chip which comprises more than the eight magneto-resistive sensor elements or sensor resistances, respectively, required for two full bridges. In addition to that, the embodiments as described up to here are suitable to use bridges or individual magneto-resistive sensor elements, for example for redundancy purposes. In addition to that, in particular the embodiments described in connection with FIGS. 18 to 20 enable to achieve a mounting tolerance compensation by the use of configurable bridges.

FIG. 21a illustrates a further possibility in the form of an embodiment of a magnetic field sensor device 100, wherein first of all in one embodiment of a manufacturing method a plurality of magneto-resistive sensor elements 110-1, 110-2 was provided on a carrier. FIG. 21a here shows an intermediate product which is generated in one embodiment of the manufacturing method of a magnetic field sensor device 100. Here, in FIG. 21a, apart from the two magneto-resistive sensor elements 110-1 and 110-2, which are present in an unconditioned state and connected in series between a first supply terminal 180 and a second supply terminal 190, also an optional evaluation circuit 200, an optional current source 220 and optional reference potentials or their terminals 210, 230, respectively, are indicated.

The structure of the intermediate product of a magnetic field sensor device 100 indicated in FIG. 21a is similar to the structure indicated in FIG. 4. The two magneto-resistive sensor elements 110-1, 110-2 are, as already mentioned, in an unconditioned state, which is symbolized by a symbol 680 in the form of two arrows perpendicular to each other with heads at both ends.

In an unconditioned state or in a state, in which the magneto-resistive sensor element 110-1, 110-2 has no characteristic magnetic field direction, in a good approximation an electrical resistance value of the corresponding magneto-resistive sensor element 110-1, 110-2 does not depend on a direction or strength of an external magnetic field. In the unconditioned state, the hard magnetic layer or the synthetic antiferromagnet, respectively, which in the conditioned state essentially defines the characteristic magnetic field direction of the corresponding magneto-resistive sensor element 110, comprises a negligible or almost negligible central magnetization, respectively, so that in a good approximation, on average, the corresponding magneto-resistive sensor element 110, in the unconditioned state, comprises no dependence of its electrical resistance on the external magnetic field.

If, in the embodiment of a magnetic field sensor device 100 illustrated in FIG. 21a a current were supplied from the current source 220 via the two unconditioned magneto-resistive sensor elements 100-1, 110-2 to the reference potential 210, the evaluation circuit would detect a (voltage) signal which changes, in a good approximation, not at all or only slightly, depending on an external magnetic field.

FIG. 21b shows the magnetic field sensor device 100 illustrated in FIG. 21a, wherein, in contrast to the state illustrated in FIG. 21a, the magneto-resistive sensor element 110-1 comprises a characteristic magnetic field direction, which was for example written into the corresponding magneto-resistive sensor element 110-1 by a corresponding conditioning process. This conditioning or the resulting characteristic magnetic field direction, respectively, is illustrated by the arrow 170-1 in FIG. 21b.

If now a current is supplied to the reference potential 210 via the current source 220, again across the series connection of the two magneto-resistive sensor elements 110-1, 110-2 a (voltage) signal drops which the evaluation circuit 200 may detect. In contrast to the state indicated in FIG. 21a, the electrical resistance of the magneto-resistive sensor element 110-1 now shows, based on the conditioning or the characteristic magnetic field direction, a dependence on the external magnetic field acting on the magneto-resistive sensor element 110-1. Due to this, the voltage signal changes, which is registered by the evaluation circuit 200, if the external magnetic field changes. In other words, due to the conditioning of the magneto-resistive sensor element 110-1, the embodiment of a magnetic field sensor device illustrated in FIG. 21b, after the conditioning, shows a relevant change of the signal detected by the evaluation circuit 200 depending on the external magnetic field.

The state indicated in FIG. 21c of the magnetic field sensor device 100 indicated in FIG. 21a is only different from the one indicated in FIG. 21b by the fact that not the magneto-resistive sensor element 110-1 but the magneto-resistive sensor element 110-2 comprises a characteristic magnetic field direction due to a conditioning process. Analog to the functioning of the embodiment illustrated in FIG. 21b, the state illustrated in FIG. 21c now also shows, due to the conditioning, a corresponding dependence of the signal detected by the evaluation circuit 200 on the external magnetic field.

It is to be noted that a magnetic field sensor device 100, as it is indicated in FIGS. 21a to 21c, is not limited to a series connection of two magneto-resistive sensor elements 110-1, 110-2. Rather, also further more complex circuits may be manufactured by a corresponding conditioning. These circuits among others also include the already discussed half bridge circuits or series connections of one or several magneto-resistive sensor elements, which may be extended by a resistance element, if applicable. Also full bridge circuits count among the same, but also other circuits.

For simplifying the further application, in the further course of the present application combining reference numerals are used for objects, as it was already explained in the introducing sections of the present application. In other words, for example for magneto-resistive sensor elements the reference numeral 110 is used consistently.

Depending on the conditions, the embodiments of the method may be implemented in hardware or in software. The implementation may be on a digital storage medium, in particular a floppy disc, CD or DVD having electronically readable control signals which may cooperate with a programmable computer system so that one of the embodiments of the methods is performed. In general, the embodiments also consist in software program products or computer program products or program products, respectively, having a program code stored on a machine-readable carrier for performing one of the embodiments of the methods, if one of the software program products runs on a computer or a processor. In other words, an embodiment of the present may thus be realized as a computer program or software program or program, respectively, having a program code for performing an embodiment of a method when the program runs on a processor. The processor may here be formed by a computer, a chipcard (smart card), a digital signal processor or another integrated circuit.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A magnetic field sensor device, comprising:
   at least two magneto-resistive sensor elements; and
   a switch which is adapted to have a first and a second switching configuration and which is connected to a first and a second magneto-resistive sensor element of the at least two magneto-resistive sensor elements for electrically connecting, in the first switching configuration, the first magneto-resistive sensor element to a magnetic field detection arrangement, and for electrically connecting, in the second switching configuration, the second magneto-resistive sensor element to the magnetic field detection arrangement, wherein the magnetic field detection arrangement is formed to provide an output signal based on a magnetic field currently applied thereto;
   a non-volatile memory formed to store information regarding a measurement characteristic of the magnetic field detection arrangement during the first or second switching configuration; and
   a control circuit coupled to the non-volatile memory and formed to control the switch for selectively coupling the first or second magneto-resistive sensor element to the magnetic field detection arrangement in accordance with the stored information.

2. The magnetic field sensor device according to claim 1, wherein the at least two magneto-resistive sensor elements respectively comprise one essentially common characteristic magnetic field direction.

3. The magnetic field sensor device according to claim 2, wherein the at least two magneto-resistive sensor elements comprise a conditioning regarding the characteristic magnetic field direction.

4. The magnetic field sensor device according to claim 1, further comprising an evaluation circuit coupled to the magnetic field detection arrangements.

5. The magnetic field sensor device according to claim 1, wherein the at least two magneto-resistive sensor elements comprise a third magneto-resistive sensor element connected to the switch, wherein the third magneto-resistive sensor element is electrically connectable into the magnetic field detection arrangement via the switch, and wherein all magneto-resistive sensor elements of the at least two magneto-resistive sensor elements comprise one essentially common characteristic magnetic field direction.

6. The magnetic field sensor device according to claim 1, wherein a magneto-resistive sensor element is connected to a resistance element.

7. The magnetic field sensor device according to claim 6, wherein the resistance element comprises a magneto-resistive sensor element.

8. The magnetic field sensor device according to claim 1, wherein the magnetic field sensor device comprises an integrated circuit, and wherein the integrated circuit comprises at least one of an evaluation circuit, the switch, a further resistance element and a Hall sensor.

9. The magnetic field sensor device according to claim 1, wherein the at least two magneto-resistive sensor elements are comprised in a housing.

10. A magnetic field sensor device, comprising:
at least two magneto-resistive sensor elements; and
a switch adapted to have a first and a second switching configuration and which is connected to a first and a second magneto-resistive sensor element of the at least two magneto-resistive sensor elements for electrically connecting one magneto-resistive sensor element of the at least two magneto-resistive sensor elements to a supply voltage;
wherein, in the first switching configuration, the switch is adapted to couple the first magneto-resistive sensor element to the supply voltage and to decouple the second magneto-resistive sensor element from the supply voltage, wherein the first magneto-resistive sensor element is formed to provide an output signal based on a magnetic field currently applied thereto during the first switching configuration;
wherein, in the second switching configuration, the switch is further adapted to couple the second magneto-resistive sensor element to the supply voltage, and to decouple the first magneto-resistive sensor element from the supply voltage, wherein the second magneto-resistive sensor element is formed to provide an output signal based on a magnetic field currently applied thereto during the second switching configuration.

11. The magnetic field sensor device according to claim 10, further comprising a further switch which is connected to the at least two magneto-resistive sensor elements and which makes at least one magneto-resistive sensor element of the at least two magneto-resistive sensor elements couplable to a further supply voltage.

12. The magnetic field sensor device according to claim 10, wherein the at least two magneto-resistive sensor elements comprise one essentially common characteristic magnetic field direction.

13. The magnetic field sensor device according to claim 10, wherein the at least two magneto-resistive sensor elements comprise a conditioning with regard to a characteristic magnetic field direction.

14. The magnetic field sensor device according to claim 10, wherein one magneto-resistive sensor element of the at least two magneto-resistive sensor elements is connected to a further resistance element.

15. The magnetic field sensor device according to claim 14, wherein the resistance element comprises a magneto-resistive sensor element.

16. The magnetic field sensor device according to claim 10, further comprising an integrated circuit comprising at least one of an evaluation circuit, the switch, a resistance element and a Hall sensor.

17. The magnetic field sensor device according to claim 10, wherein the at least two magneto-resistive sensor elements are comprised in a housing.

18. A magnetic field sensor device, comprising:
a magnetic field detection arrangement having a plurality of magneto-resistive sensor elements connected to form a sensor bridge circuit which is adapted to provide a common output signal of the connected magneto-resistive sensor elements based on a currently applied magnetic field;
an additional magneto-resistive sensor element; and
a switch which is adapted to have a first and a second switching configuration and which is coupled to the plurality of magneto-resistive sensor elements of the magnetic field detection arrangement and to the additional magneto-resistive sensor element, wherein, in the first switching configuration, the switch is adapted to decouple one of the plurality of magneto-resistive sensor elements from the magnetic field detection arrangement and to couple the additional magneto-resistive sensor element to the magnetic field detection arrangement, and wherein, in the second switching configuration, the switch is further adapted to couple the plurality of magneto-resistive sensor element to the magnetic field detection arrangement and to decouple the additional magneto-resistive sensor element from the magnetic field detection arrangement.

19. The magnetic field sensor device according to claim 18, which comprises a plurality of additional magneto-resistive sensor elements, wherein the plurality of additional magneto-resistive sensor elements comprises the additional magneto-resistive sensor element, and wherein the switch is further coupled to each additional magneto-resistive sensor element of the plurality of additional magneto-resistive sensor elements in order to decouple a plurality of the plurality of magneto-resistive sensor elements from the magnetic field detection arrangement and to electrically couple the plurality of additional magneto-resistive sensor elements into the magnetic field detection arrangement.

20. A magnetic field sensor device, comprising:
a magnetic field detection arrangement having a plurality of magneto-resistive sensor elements, wherein the magnetic field detection arrangement comprises a full bridge circuit, wherein the full bridge circuit comprises a parallel connection of two half bridge circuits, wherein one half bridge circuit comprises a series connection of a first and a second magneto-resistive sensor element to a center tap, wherein the two half bridge circuits are connected in parallel so that the first magneto-resistive sensor element of a first half bridge circuit of the two half bridge circuits is connected to the first magneto-resistive sensor element of a second half bridge circuit and the second magneto-resistive sensor element of the first half bridge circuit is connected to the second magneto-resistive sensor element of the second half bridge circuit of the full bridge circuit, and wherein the center taps of the first half bridge circuit and the second half bridge circuit are couplable to an evaluation circuit;
an additional magneto-resistive sensor element; and
a switch which is adapted to have a first and a second switching configuration and which is coupled to the plurality of magneto-resistive sensor elements of the magnetic field detection arrangement and to the additional magneto-resistive sensor element, wherein, in the first switching configuration, the switch is adapted to decouple one of the plurality of magneto-resistive sensor elements from the magnetic field detection arrangement and to couple the additional magneto-resistive sensor element to the magnetic field detection arrangement, and wherein, in the second switching configuration, the switch is further adapted to couple the plurality of magneto-resistive sensor element to the magnetic field detection arrangement and to decouple the additional magneto-resistive sensor element from the magnetic field detection arrangement.

21. The magnetic field sensor device according to claim 20, wherein the magneto-resistive sensor elements of the magnetic field detection arrangement are conditioned such that the first magneto-resistive sensor element of the first half bridge circuit and the second magneto-resistive sensor element of the second half bridge circuit comprise a predetermined characteristic magnetic field direction, and that the second magneto-resistive sensor element of the first half bridge circuit and the first magneto-resistive sensor element of the second half bridge circuit comprise a characteristic magnetic field direction, which is essentially opposite to the predetermined characteristic magnetic field direction of the first magneto-resistive sensor element of the first half bridge circuit.

22. The magnetic field sensor device according to claim 20, wherein the plurality of magneto-resistive sensor elements is connected to form half bridge circuits or full bridge circuits, and wherein the switch is connected to the half bridge circuits or the full bridge circuits of the plurality of magneto-resistive sensor elements and the plurality of additional magneto-resistive sensor elements, to decouple a half bridge circuit or a full bridge circuit of the magnetic field detection arrangement and to electrically couple a half bridge circuit or a full bridge circuit of the plurality of the additional magneto-resistive sensor elements into the magnetic field detection arrangement.

23. The magnetic field sensor device according to claim 20, wherein the switch is connected to the center taps of the half bridge circuits of the plurality of magneto-resistive sensor elements and the plurality of additional magneto-resistive sensor elements to make the center taps of the half bridge circuits couplable to the evaluation circuit.

24. The magnetic field sensor device according to claim 20, wherein the center taps of the half bridge circuits of the magnetic field detection arrangement are coupled to an analog/digital converter of the evaluation circuit, wherein the analog/digital converter is coupled to a digital signal processor, and wherein the digital signal processor comprises an output for an evaluation signal.

25. The magnetic field sensor device according to claim 20, wherein the magneto-resistive sensor elements of the plurality of magneto-resistive sensor elements and the magneto-resistive sensor elements of the plurality of additional magneto-resistive sensor elements are spatially distributed on a carrier such that by decoupling one magneto-resistive sensor element of the plurality of magneto-resistive sensor elements and electrically coupling one magneto-resistive sensor element of the plurality of additional magneto-resistive sensor elements a magnetically effective measurement point is spatially adjustable on the carrier, wherein the magnetically effective measurement point is essentially an intersection of a first connection line between the first magneto-resistive sensor element of the first half bridge circuit and the second magneto-resistive sensor element of the second half bridge circuit with a second connection line between the second magneto-resistive sensor element of the first half bridge circuit and the first magneto-resistive sensor element of the second half bridge circuit.

26. The magnetic field sensor device according to claim 25, wherein the magneto-resistive sensor elements of the plurality of magneto-resistive sensor elements and the magneto-resistive sensor elements of the plurality of additional magneto-resistive sensor elements are spatially distributed on the carrier such that the magnetically effective measurement point is adjustable with an accuracy of less than 5000 μm, less than 1000 μm or less that 500 μm.

27. The magnetic field sensor device according to claim 1, wherein the switch comprises at least one of a multiplexer, a transistor, a connection to be opened once, a connection to be closed once, a fuse and a contact area for an electrically conductive connection.

28. The magnetic field sensor device according to claim 18, wherein the switch is connected to a control circuit to cause, in response to a switch-in signal, the decoupling of one or several magneto-resistive sensor elements of the magnetic field detection arrangement and the electrical coupling of the additional magneto-resistive sensor element or the plurality of additional magneto-resistive sensor elements, respectively.

29. The magnetic field sensor device according to claim 1, wherein a magneto-resistive sensor element comprises an AMR element (AMR=anisotropic magneto resistance), a GMR element (GMR=giant magneto resistance), a CMR element (CMR=colossal magneto resistance), a TMR element (TMR=tunnel magneto resistance), an EMR element (EMR=extraordinary magneto resistance) or a spin valve structure.

30. An apparatus for determining a magnetic field, comprising:
a magnetic field detection arrangement with a plurality of magneto-resistive sensor elements;
an additional magneto-resistive sensor element; and
a switch which is adapted to have a first and a second switching configuration and which is coupled to the magnetic field detection arrangement and the additional magneto-resistive sensor element, wherein, in the first switching configuration, the switch is adapted to decouple one of the plurality of magneto-resistive sensor elements from the magnetic field detection arrangement and to couple the additional magneto-resistive sensor element into the magnetic field detection arrangement for adjusting a first magnetic field measurement point of the magnetic field detection arrangement, and wherein, in the second switching configuration, the switch is adapted to couple the plurality of magneto-resistive sensor elements into the magnetic field detection arrangement and to decouple the additional magneto-resistive sensor element from the magnetic field detection arrangement for adjusting a second magnetic field measurement point of the magnetic field detection arrangement, wherein the magnetic field detection arrangement is formed to provide an output signal based on a magnetic field currently applied thereto;
and
a controller coupled to the switch to cause, in response to a switching signal, the decoupling of one or several magneto-resistive sensor elements from the magnetic field detection arrangement and the coupling of one or several magneto-resistive sensor elements into the magnetic field detection arrangement in order to selectively adjust the first or second magnetic field measurement point of the magnetic field detection arrangement.

31. The apparatus according to claim 30, wherein the switch is coupled to several or each magneto-resistive sensor element of the plurality of magneto-resistive sensor elements and the additional magneto-resistive sensor element.

32. The apparatus according to claim 30, wherein a magneto-resistive sensor element comprises an AMR element (AMR=anisotropic magneto resistance), a GMR element (GMR=giant magneto resistance), a CMR element (CMR=colossal magneto resistance), a TMR element (TMR=tunnel magneto resistance), an EMR element (EMR=extraordinary magneto resistance) or a spin valve structure.

33. The apparatus according to claim 30, wherein the switch is coupled to the magnetic field detection arrangement to provide a measurement signal of the magnetic field detection arrangement to an evaluator.

34. The apparatus according to claim 30, wherein the magneto-resistive sensor means are distributed on a carrier such that by the decoupling and the coupling of magneto-resistive sensor means a magnetically effective measurement point is adjustable on the carrier.

35. The apparatus according to claim 34, wherein the magneto-resistive sensor means are distributed on the carrier such that the magnetically effective measurement point is adjustable on the carrier with an accuracy of less than 5000 µm, less than 1000 µm or less than 500 µm.

36. An integrated magneto-resistive sensor, comprising: a first plurality of half bridge circuits, wherein each half bridge circuit of the first plurality of half bridge circuits comprises a series connection of a first and a second magneto-resistive sensor element to a center tap, wherein the first magneto-resistive sensor element of a half bridge circuit of the first plurality of half bridge circuits is conditioned with regard to a predetermined preferred direction; and wherein the second magneto-resistive sensor element of a half bridge circuit of the first plurality of half bridge circuits is conditioned with regard to a preferred direction essentially opposite to the predetermined preferred direction; a second plurality of half bridge circuits, wherein each half bridge circuit of the second plurality of half bridge circuits comprises a series connection of a first and a second magneto-resistive sensor element to a center tap, wherein the first magneto-resistive sensor element of a half bridge circuit of the second plurality of half bridge circuits is conditioned with regard to the preferred direction essentially opposite to the predetermined preferred direction; and wherein a second magneto-resistive sensor element of a half bridge circuit of the second plurality of half bridge circuits is conditioned with regard to the predetermined preferred direction; a first multiplexer connected to the half bridge circuits of the first plurality of half bridge circuits; a second multiplexer connected to the half bridge circuits of the second plurality of half bridge circuits; an evaluation circuit connected to the first multiplexer and the second multiplexer, to the center taps of the half bridge circuits of the first plurality of half bridge circuits and the center taps of the half bridge circuits of the second plurality of half bridge circuits, to the first multiplexer and the center taps of the half bridge circuits of the second plurality of half bridge circuits or the center taps of the half bridge circuits of the first plurality of half bridge circuits and to the second multiplexer; and an output for an evaluation signal connected to the evaluation circuit.

37. The integrated magneto-resistive sensor according to claim 36, wherein the evaluation circuit comprises a control circuit which is connected to the first multiplexer and the second multiplexer to control the first multiplexer and the second multiplexer.

38. The integrated magneto-resistive sensor according to claim 36, wherein the evaluation circuit comprises an analog/digital converter which is connected to the first multiplexer, the second multiplexer, the center taps of the first plurality of half bridge circuits or the center taps of the half bridge circuits of the second plurality of half bridge circuits.

39. The magnetic field sensor device according to claim 1, wherein the first magneto-resistive sensor element and the second magneto-resistive sensor element are located at different positions with respect to each other so that, based on the different switching conditions of the switch, the magnetic field detection arrangement is operable for detecting a magnetic field at different measurement points.

40. The magnetic field sensor device according to claim 10, wherein the first magneto-resistive sensor element and the second magneto-resistive sensor element are located at different positions with respect to each other so that, based on the different switching conditions of the switch, the magnetic field detection arrangement is operable for detecting a magnetic field at different measurement points.

41. The magnetic field sensor device according to claim 18, wherein the first magneto-resistive sensor element and the second magneto-resistive sensor element are located at different positions with respect to each other so that, based on the different switching conditions of the switch, the magnetic field detection arrangement is operable for detecting a magnetic field at different measurement points.

42. A magnetic field sensor device, comprising:
at least two magneto-resistive sensor elements; and
a switch which is adapted to have a first or a second switching configuration and which is connected to a first and a second magneto-resistive sensor element of the at least two magneto-resistive sensor elements for electrically connecting one magneto-resistive sensor element of the at least two magneto-resistive sensor elements to a supply voltage;
wherein, in the first switching configuration, the switch is adapted to couple the first magneto-resistive sensor element to the supply voltage and to decouple the second magneto-resistive sensor element from the supply voltage, wherein the first magneto-resistive sensor element is formed to provide an output signal based on a magnetic field currently applied thereto;
further comprising a further switch which is connected to the at least two magneto-resistive sensor elements and which makes at least one magneto-resistive sensor element of the at least two magneto-resistive sensor elements couplable to a further supply voltage.

43. A magnetic field sensor device, comprising:
a plurality of magneto-resistive sensor elements which are connectable into a magnetic field detection arrangement;
an additional magneto-resistive sensor element; and
a switch which is coupled to the plurality of magneto-resistive sensor elements of the magnetic field detection arrangement and to the additional magneto-resistive sensor element to decouple one of the magneto-resistive sensor elements of the magnetic field detection arrangement and to couple the additional magneto-resistive sensor element into the magnetic field detection arrangement;
wherein the magnetic field detection arrangement comprises a full bridge circuit, wherein the full bridge circuit comprises a parallel connection of two half bridge circuits, wherein one half bridge circuit comprises a series connection of a first and a second magneto-resistive sensor element to a center tap, wherein the two half bridge circuits are connected in parallel so that the first magneto-resistive sensor element of a first half bridge circuit of the two half bridge circuits is connected to the first magneto-resistive sensor element of a second half bridge circuit and the second magneto-resistive sensor element of the first half bridge circuit is connected to the second magneto-resistive sensor element of the second half-bridge circuit of the full bridge circuit, and wherein the center taps of the first half bridge circuit and the second half bridge circuit are couplable to an evaluation circuit.

44. The magnetic field sensor device according to claim 43, wherein the magneto-resistive sensor elements of the magnetic field detection arrangement are conditioned such that the first magneto-resistive sensor element of the first half bridge circuit and the second magneto-resistive sensor element of the second half bridge circuit comprise a predetermined characteristic magnetic field direction, and that the second magneto-resistive sensor element of the first half bridge circuit and the first magneto-resistive sensor element of the second half bridge circuit comprise a characteristic magnetic field direction, which is essentially opposite to the predetermined characteristic magnetic field direction of the first magneto-resistive sensor element of the first half bridge circuit.

45. The magnetic field sensor device according to claim 43, wherein the plurality of magneto-resistive sensor elements is connected to form half bridge circuits or full bridge circuits, and wherein the switch is connected to the half bridge circuits or the full bridge circuits of the plurality of magneto-resistive sensor elements and the plurality of additional magneto-resistive sensor elements, to decouple a half bridge circuit or a full bridge circuit of the magnetic field detection arrangement and to electrically couple a half bridge circuit or a full bridge circuit of the plurality of the additional magneto-resistive sensor elements into the magnetic field detection arrangement.

* * * * *